(12) United States Patent
Iwata

(10) Patent No.: US 7,054,186 B2
(45) Date of Patent: May 30, 2006

(54) MAGNETIC RANDOM ACCESS MEMORY

(75) Inventor: Yoshihisa Iwata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 10/873,929

(22) Filed: Jun. 23, 2004

(65) Prior Publication Data

US 2005/0232006 A1 Oct. 20, 2005

(30) Foreign Application Priority Data

Apr. 16, 2004 (JP) ............................. 2004-122167

(51) Int. Cl.
*G11C 7/00* (2006.01)
(52) U.S. Cl. ...................... 365/158; 365/171
(58) Field of Classification Search ................ 365/158, 365/171, 173
See application file for complete search history.

(56) References Cited

U.S. PATENT DOCUMENTS

| | | | |
|---|---|---|---|
| 5,930,164 | A | 7/1999 | Zhu |
| 6,169,689 | B1 | 1/2001 | Naji |
| 6,445,613 | B1 | 9/2002 | Nagai |
| 6,545,906 | B1 * | 4/2003 | Savtchenko et al. ......... 365/158 |
| 6,724,653 | B1 | 4/2004 | Iwata et al. |
| 2005/0087785 | A1 * | 4/2005 | Lu ............................. 257/295 |
| 2005/0199927 | A1 * | 9/2005 | Lu ............................. 257/295 |

FOREIGN PATENT DOCUMENTS

| | | |
|---|---|---|
| JP | 2000-247903 | 9/2000 |
| JP | 2001-357666 | 12/2001 |
| JP | 2002-8366 | 1/2002 |
| JP | 2003-229547 | 8/2003 |
| JP | 2003-249072 | 9/2003 |

OTHER PUBLICATIONS

Roy Scheuerlein, et al., "A 10ns Read and Write Non-Volatile Memory Array Using a Magnetic Tunnel Junction and FET Switch in Each Cell", ISSCC2000 Technical Digest, 2000, pp. 128-129, 94-95 and 409-410.
M. Durlam, et al., "Nonvolatile RAM Based on Magnetic Tunnel Junction Elements", ISSCC2000 Technical Digest; 2000, pp. 130-131, 96-97 and 410-411.
Hironori Banba, et al., "A CMOS Bandgap Reference Circuit With Sub-1-V Operation", IEEE Journal of Solid-State Circuits, vol. 34, No. 5, May 1999, pp. 670-674.
Chang He Shang, et al., "Temperature Dependence of Magnetoresistance and Surface Magnetization in Ferromagnetic Tunnel Junctions", Physical Review B, vol. 58, No. 6, Aug. 1, 1998, pp. R2917-R2920.

* cited by examiner

*Primary Examiner*—Vu A. Le
(74) *Attorney, Agent, or Firm*—Oblon, Spivak, McClelland, Maier & Neustadt, P.C.

(57) ABSTRACT

There is disclosed a magnetic random access memory according to an example of the present invention, comprising first and second write lines which intersect with each other, and a plurality of magneto resistive elements stacked on an intersecting portion of the first and second write lines, wherein easy axis directions of magnetizations of storage layers of the plurality of magneto resistive elements are different from each other.

25 Claims, 40 Drawing Sheets

Write initial state with respect to MTJ1 (T1)

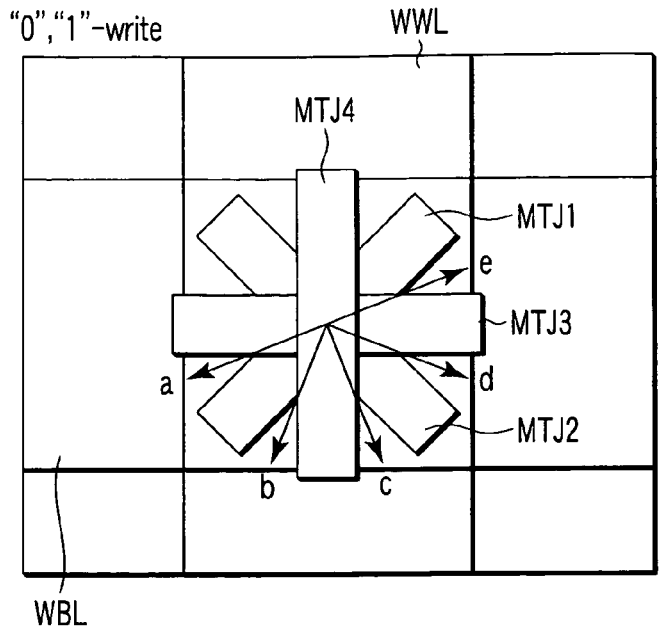

- Write with respect to MTJ1
  → magnetic fields a, a+b, b
- Write with respect to MTJ2
  → magnetic fields c, c+d, d
- Write with respect to MTJ3
  → magnetic fields d, d+e, e
- Write with respect to MTJ4
  → magnetic fields b, b+c, c a~e : directions of magnetic field produced by write current

FIG. 24

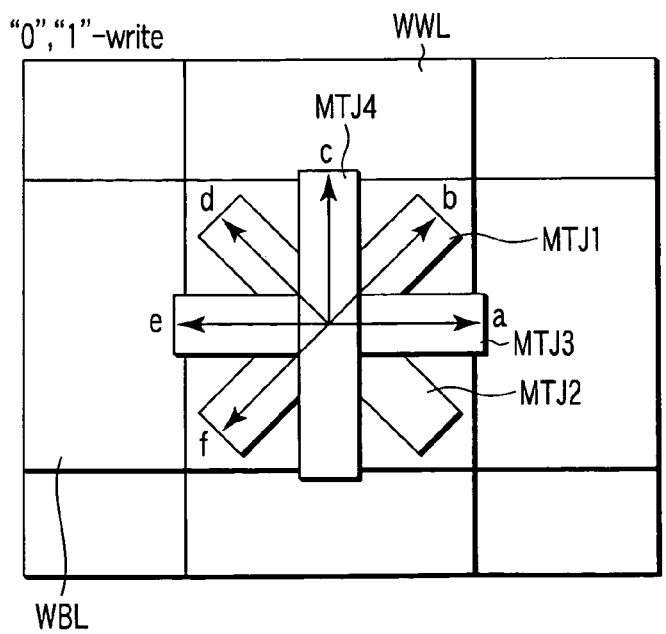

- Write with respect to MTJ1
  → magnetic fields a, a+c, c
- Write with respect to MTJ2
  → magnetic fields c, c+e, e
- Write with respect to MTJ3
  → magnetic fields d, d+f, f
- Write with respect to MTJ4
  → magnetic fields b, b+d, d a~f : directions of magnetic field produced by write current

FIG. 25

- Write with respect to MTJ1
  → magnetic fields a, a+c, c

- Write with respect to MTJ2
  → magnetic fields c, c+e, e

- Write with respect to MTJ3
  → magnetic fields d, d+f, f

- Write with respect to MTJ4
  → magnetic fields b, b+d, d a~f : directions of magnetic field produced by write current

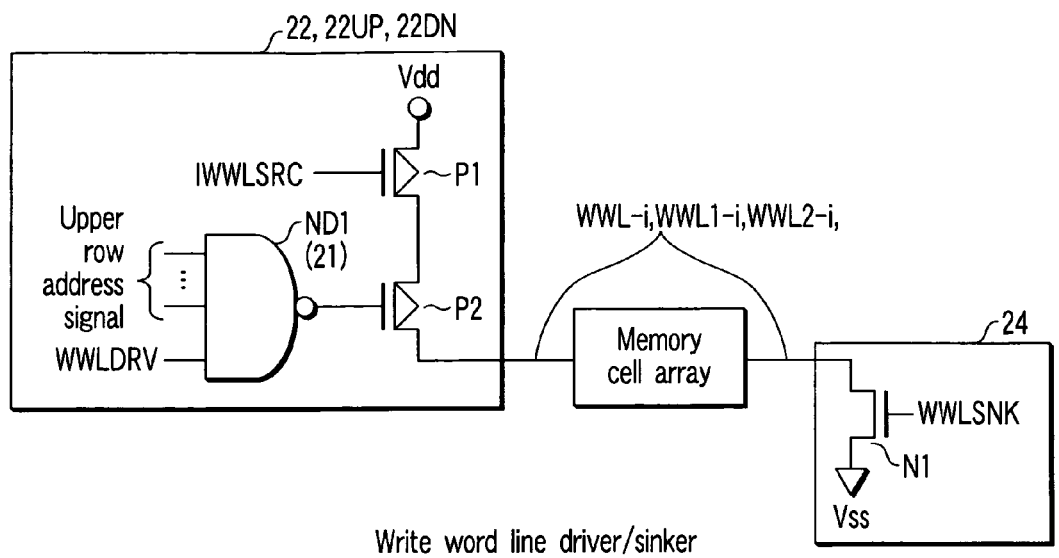
F I G. 30
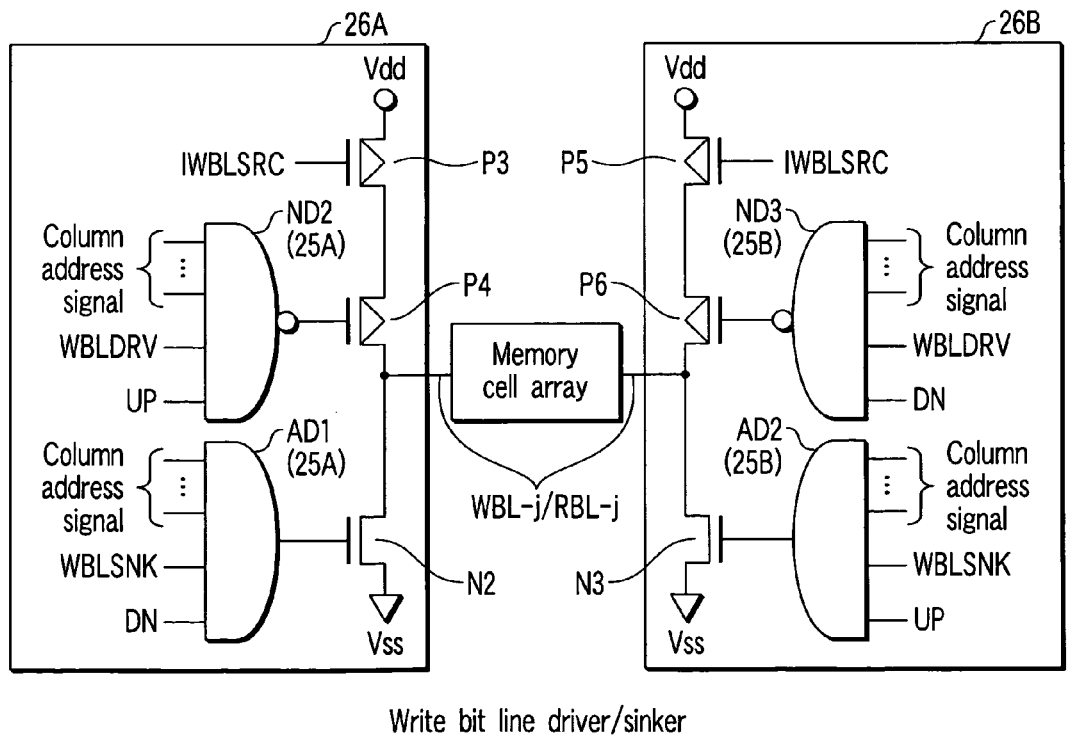
F I G. 31

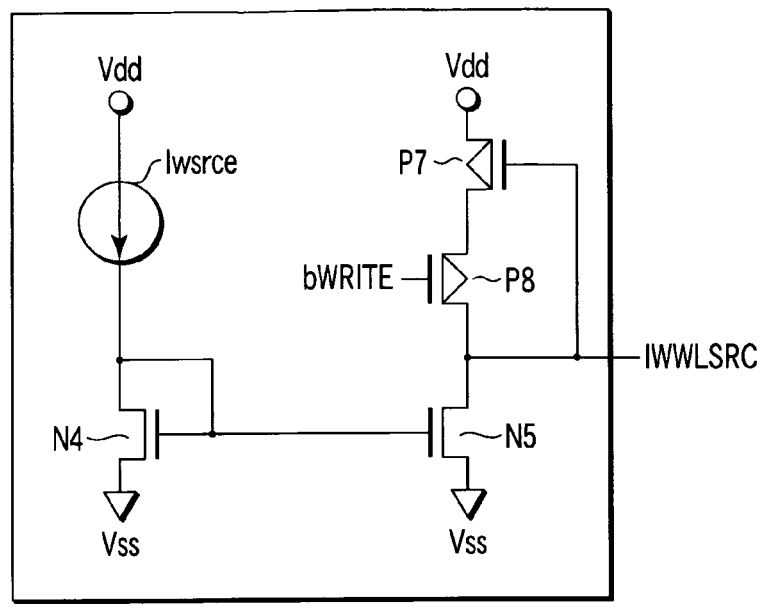
F I G. 32
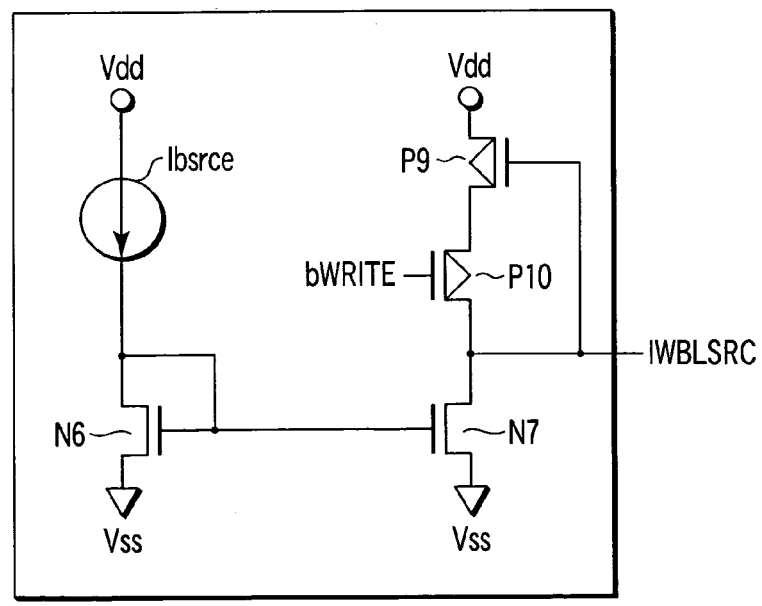
F I G. 33

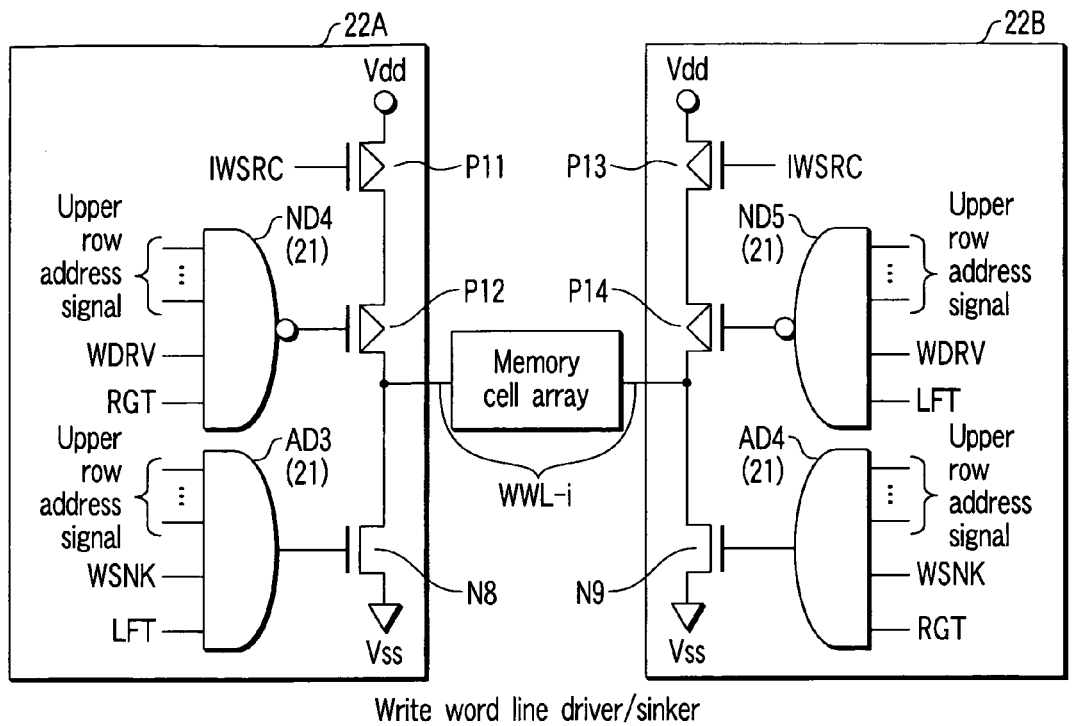
F I G. 35
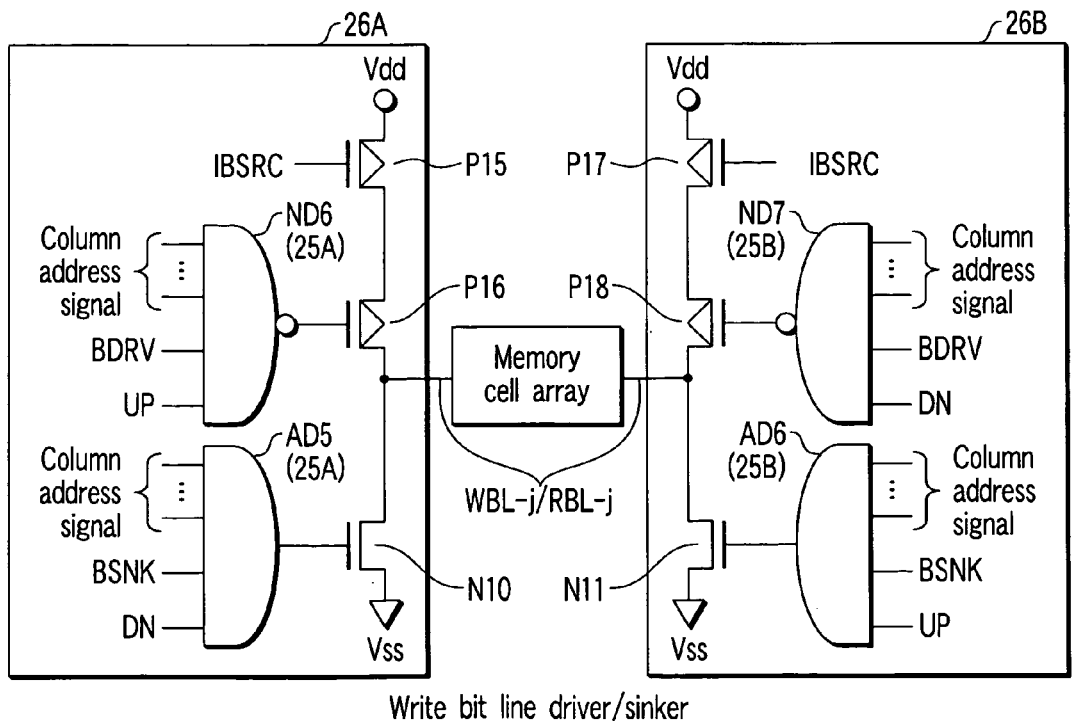
F I G. 36

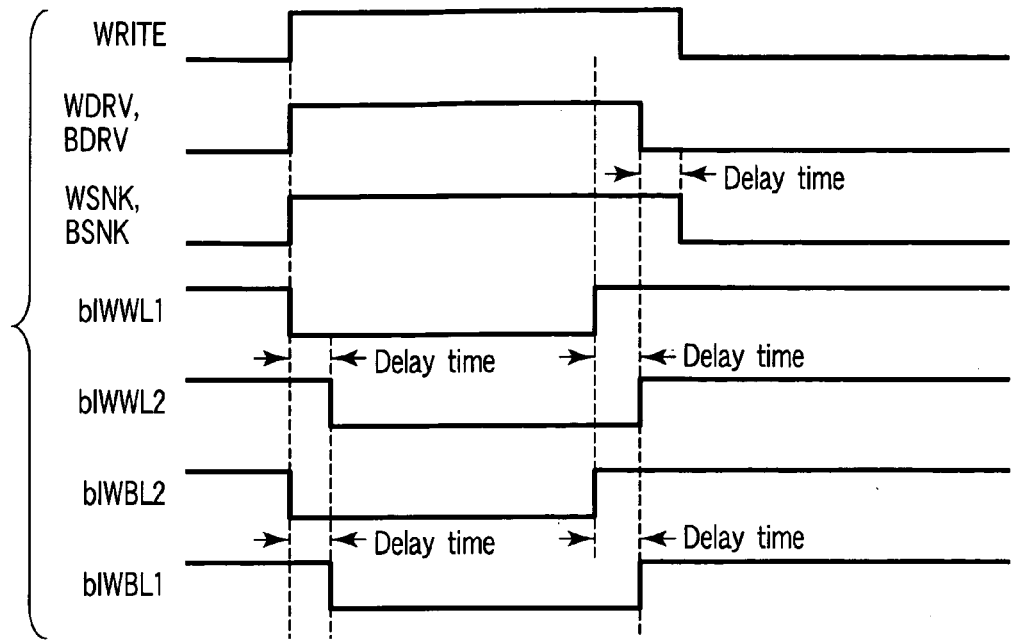
F I G. 40
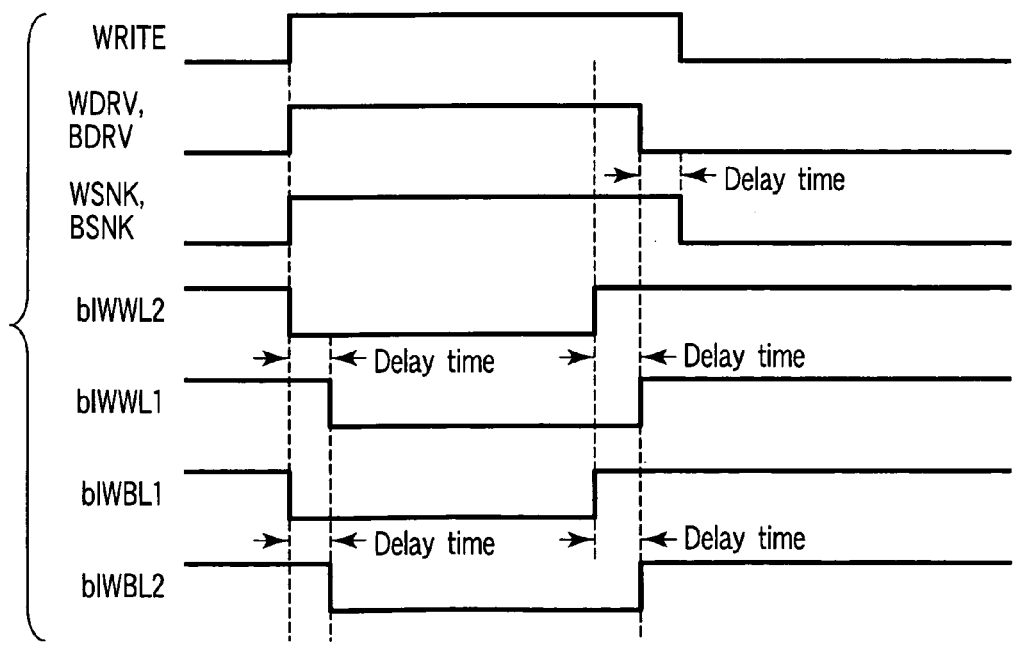
F I G. 41

Read word line driver

Column selection line driver

- Write with respect to MTJ1
  → magnetic fields a, a+b, b

- Write with respect to MTJ2
  → magnetic fields b, b+c, c a~c : directions of magnetic field produced by write current

- Write with respect to MTJ1
  → magnetic fields a, a+b, b
- Write with respect to MTJ2
  → magnetic fields b, b+c, c a~c : directions of magnetic field produced by write current

- Write with respect to MTJ1
  → magnetic fields a, a+b, b
- Write with respect to MTJ2
  → magnetic fields b, b+c, c a~c : directions of magnetic field produced by write current

MAGNETIC RANDOM ACCESS MEMORY

CROSS-REFERENCE TO RELATED APPLICATIONS

This application is based upon and claims the benefit of priority from prior Japanese Patent Application No. 2004-122167, filed Apr. 16, 2004, the entire contents of which are incorporated herein by reference.

BACKGROUND OF THE INVENTION

1. Field of the Invention

The present invention relates to a magnetic random access memory (MRAM) in which a magneto resistive effect is used.

2. Description of the Related Art

A magnetic random access memory in which a tunneling magneto resistive (TMR) effect is used is described, for example, in Non-Patent Document 1. This magnetic random access memory is characterized in that data is stored by a magnetized state of a magnetic tunnel junction (MTJ) element.

The MTJ element indicating the TMR effect has a structure in which a tunnel insulating layer is held between two ferromagnetic layers. The MTJ element is capable of taking two states, one state is a parallel state in which directions of remnant magnetization of two ferromagnetic layers holding the tunnel insulating layer therebetween are the same, and the other state is an anti-parallel state in which directions of remnant magnetization of two ferromagnetic layers holding the tunnel insulating layer therebetween are opposite to each other.

When the MTJ element is brought into the parallel state, a resistance value of the MTJ element is minimized. This state is defined as a "1" state. On the other hand, when the MTJ element is brought into the anti-parallel state, the resistance value of the MTJ element is maximized. This state is defined as a "0" state.

Additionally, as means for highly integrating memory cells, a structure is known in which an array of memory cells two-dimensionally arranged in a plane parallel to the surface of a semiconductor substrate (cell array plane) is stacked in a multiplicity of layers (see Patent Documents 1 to 8).

When this structure is used, MOS transistors have to be stacked in a dynamic random access memory (DRAM), a flash memory or the like, and therefore this structure is not suitable in a manufacturing process. This is because a high-temperature process is required for forming the MOS transistor, and this high-temperature process adversely affects characteristics of an already formed MOS transistor, wiring or the like.

On the other hand, ferromagnetic materials which do not require any high-temperature process may be stacked in a magnetic random access memory. Therefore, a structure in which memory cell arrays are stacked in a multiplicity of layers is very effective as means for highly integrating the memory cells for the magnetic random access memory in which the ferromagnetic material is used in the memory cell.

However, in structures described, for example, in Patent Documents 1 to 6, only one MTJ element is disposed in an intersecting portion of two write lines. In this structure, to electrically connect the MOS transistor as a selection switch to a plurality of MTJ elements arranged above the transistor, a region where a contact pillar is disposed is required when viewed in the cell array plane. This region cannot be overlapped with two write lines, and an area per cell increases that much more.

On the other hand, in structures described, for example, in Patent Documents 7, 8, a plurality of MTJ elements are stacked in the intersecting portion of two write lines. Therefore, the contact pillar for electrically connecting the MOS transistor to the plurality of. MTJ elements can be overlapped with one of two write lines, and the area of the cell is equal to that of the cell array of one-transistor 1MTJ type.

However, since a plurality of MTJ elements having the same shape are stacked in the same direction (easy axis directions of magnetization of storage layers are the same) in this structure, data cannot be independently written in a plurality of MTJ elements arranged in the intersecting portion of two write lines.

Patent Documents 1 to 9 and Non-Patent Document 1 are as follows:

Patent Document 1: U.S. Pat. No. 6,445,613;
Patent Document 2: Jpn. Pat. Appln. KOKAI Publication No. 2001-357666;
Patent Document 3: Jpn. Pat. Appln. KOKAI Publication No. 2002-8366;
Patent Document 4: Jpn. Pat. Appln. KOKAI Publication No. 2003-229547;
Patent Document 5: Jpn. Pat. Appln. KOKAI Publication No. 2003-249072;
Patent Document 6: Jpn. Pat. Appln. KOKAI Publication No. 2000-247093;
Patent Document 7: U.S. Pat. No. 6,169,689;
Patent Document 8: U.S. Pat. No. 5,930,164;
Patent Document 9: U.S. Pat. No. 6,545,906; and
Non-Patent Document 1: Roy Scheuerlein et al. "A 10 ns Read and Write Non-Volatile Memory Array using a Magnetic Tunnel Junction and FET Switch in each Cell", ISSCC2000 Technical Digest, pp. 128–129.

BRIEF SUMMARY OF THE INVENTION

According to an aspect of the present invention, there is provided a magnetic random access memory comprising: first and second write lines which intersect with each other; and a plurality of magneto resistive elements stacked on an intersecting portion of the first and second write lines, wherein easy axis directions of magnetizations of storage layers of the plurality of magneto resistive elements are different from each other.

BRIEF DESCRIPTION OF THE SEVERAL VIEWS OF THE DRAWING

FIG. 24 is a diagram showing an example of the magnetic field generated at the write time;

FIG. 25 is a diagram showing an example of the magnetic field generated at the write time;

FIG. 30 is a circuit diagram showing an example of a write word line driver/sinker;

FIG. 31 is a circuit diagram showing an example of a write bit line driver/sinker;

FIG. 32 is a circuit diagram showing an example of an IWWLSRC generation circuit;

FIG. 33 is a circuit diagram showing an example of an IWBLSRC generation circuit;

FIG. 35 is a circuit diagram showing an example of the write word line driver/sinker;

FIG. 36 is a circuit diagram showing an example of the write bit line driver/sinker;

FIG. 40 is a waveform diagram showing a signal waveform at the write time;

FIG. 41 is a waveform diagram showing the signal waveform at the write time;

DETAILED DESCRIPTION OF THE INVENTION

A magnetic random access memory of an aspect of the present invention will be described below in detail with reference to the accompanying drawing.

1. Reference Example

To increase a memory capacity of a magnetic random access memory, a structure in which a plurality of MTJ elements are stacked on a semiconductor substrate is studied.

Figure 1:
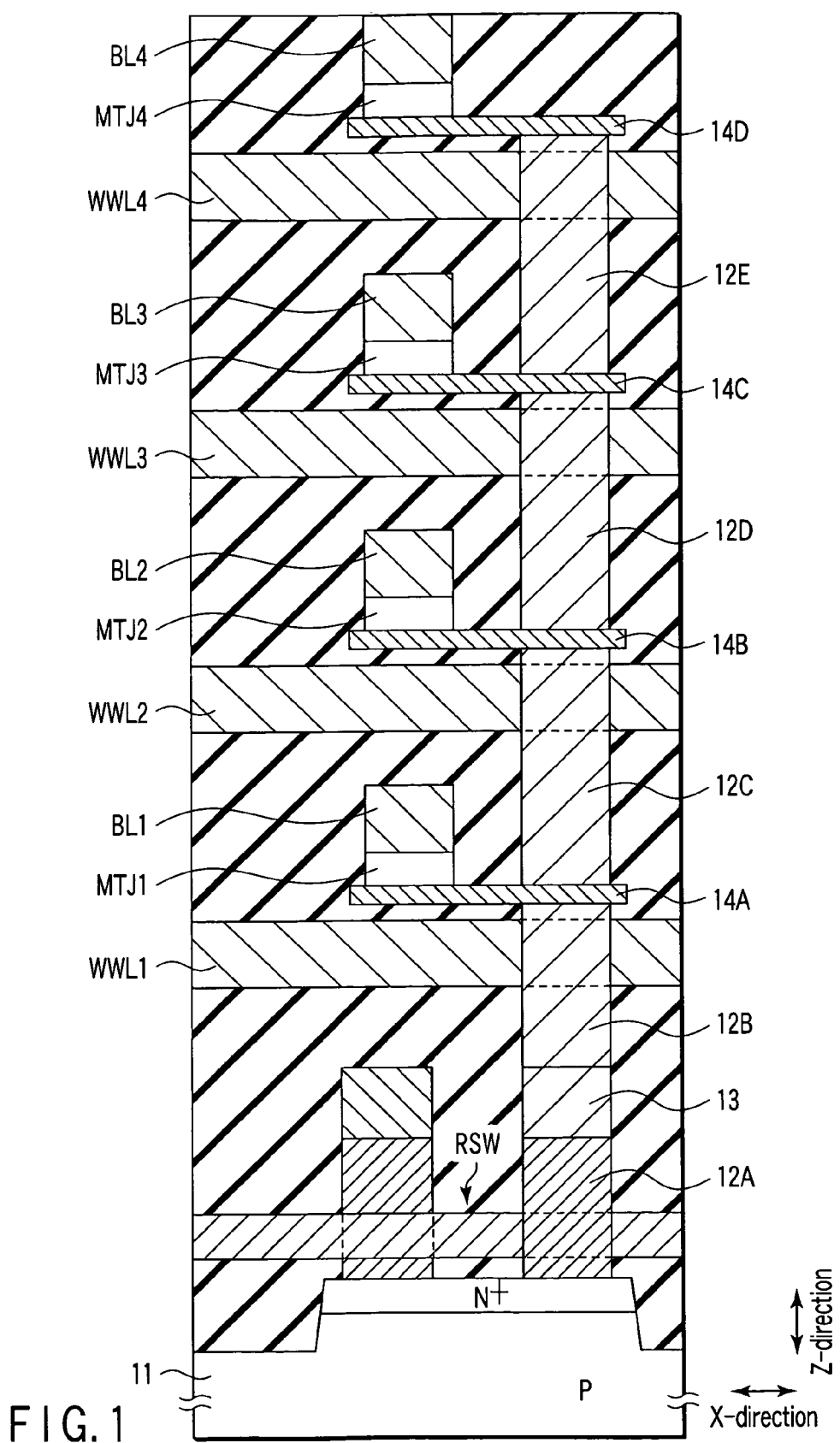
FIG. 1 is a sectional view showing a device structure according to a reference example.

FIG. 1 shows an example of a cell array structure of a stacked type.

In this structure, a plurality of MTJ elements MTJ1, MTJ2, MTJ3, MTJ4 are stacked on a semiconductor substrate 11. Only one MTJ element is disposed in the intersecting portion of two write lines. For example, only the MTJ element MTJ1 is disposed in the intersecting portion of a write word line WWL1 and a bit line (read/write bit line) BL1.

In this structure, to electrically connect a MOS transistor RSW which is a selection switch to the plurality of MTJ elements MTJ1, MTJ2, MTJ3, MTJ4 arranged above the transistor, contact pillars 12A, 12B, 12C, 12D, 12E are used.

Figure 2:
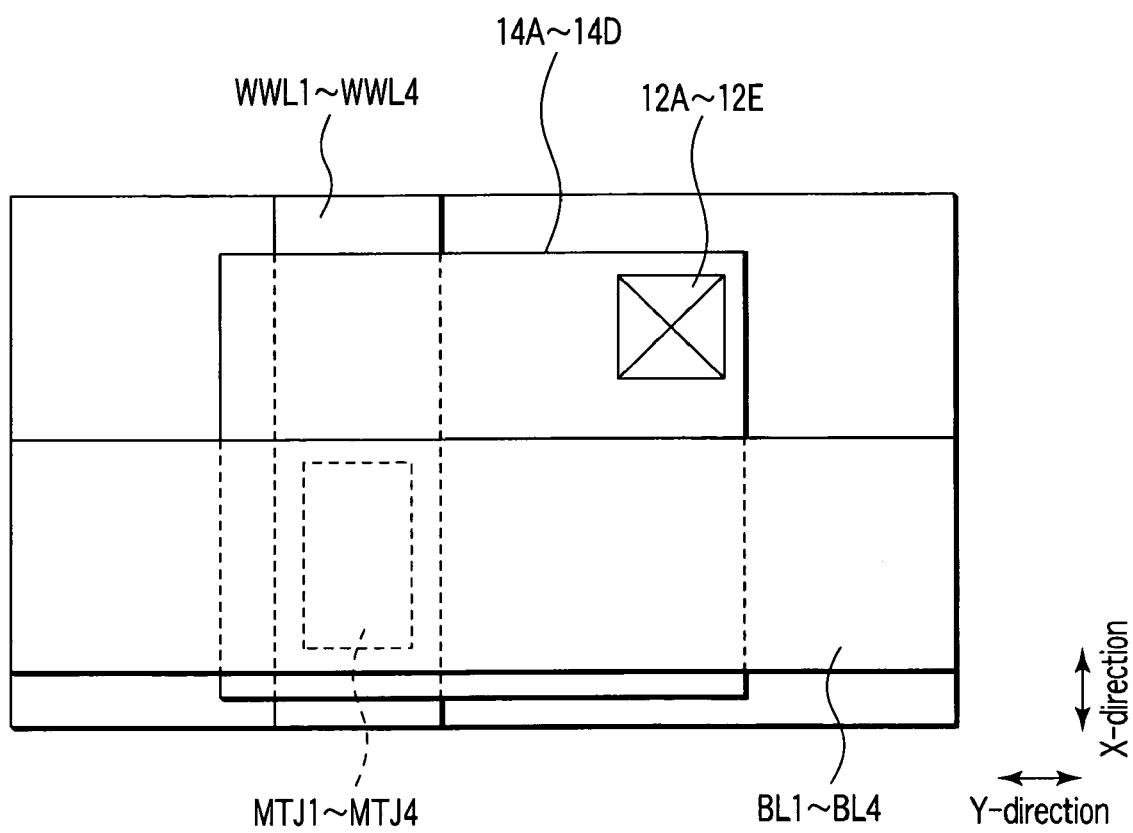
FIG. 2 is a plan view showing the device structure according to the reference example.

Since these contact pillars 12A, 12B, 12C, 12D, 12E cannot be overlapped with two write lines, a region for arranging the contact pillars 12A to 12E is required when viewed in a cell array plane as shown in FIG. 2. Since this region cannot be overlapped with write lines WWL1 to WWL4, BL1 to BL4, an area per cell increases that much more.

Figure 3:
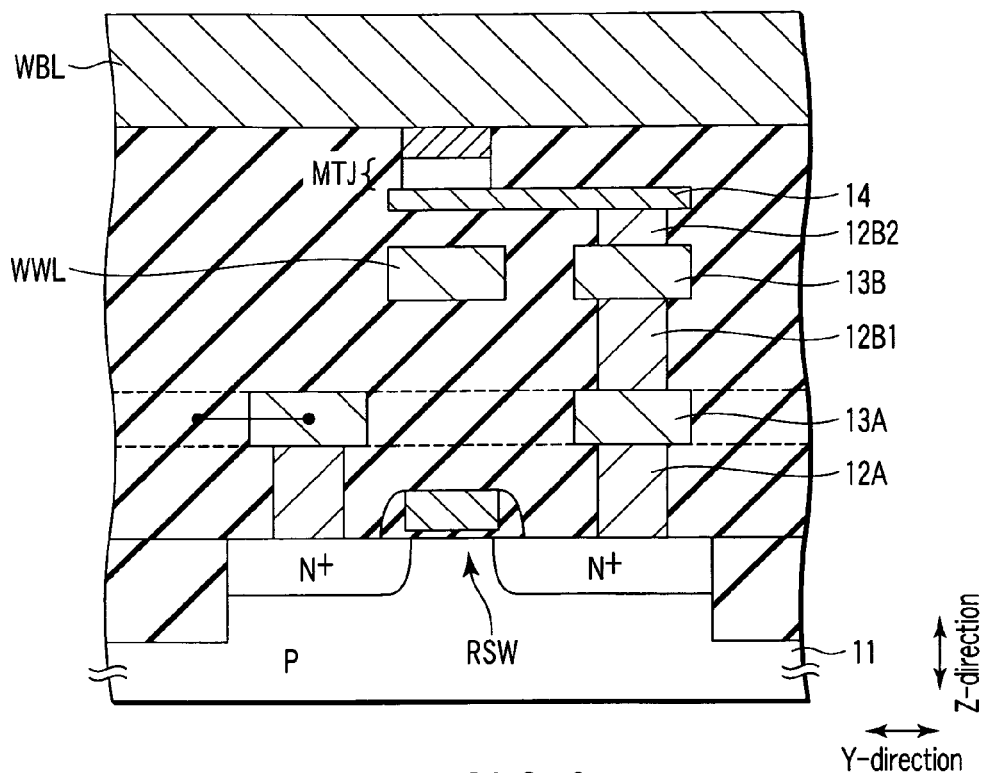
FIG. 3 is a sectional view showing the device structure according to the reference example.

FIG. 3 shows an example of a cell array structure of a one-transistor-n-MTJ type.

In this structure, n (n is 1 or more) MTJ elements MTJ exist above the MOS transistor RSW on the semiconductor substrate 11. The MTJ element is disposed in the intersecting portion of a write word line WWL and a write bit line WBL. The MTJ element MTJ is disposed in the intersecting portion of the write word line WWL and write bit line WBL.

In this structure, to electrically connect the MOS transistor RSW which is the selection switch to the MTJ element MTJ disposed above the transistor, contact pillars 12A, 12B1, 12B2 are used.

Figure 4:
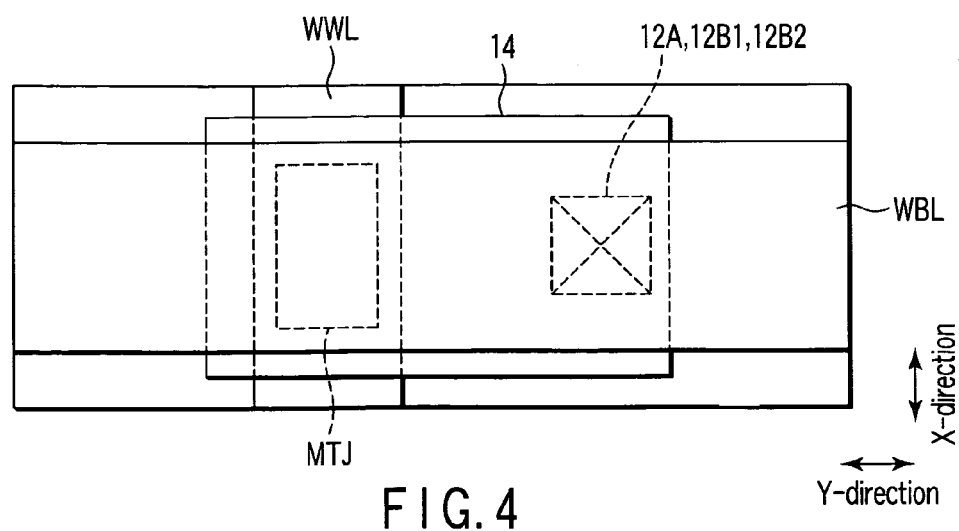
FIG. 4 is a plan view showing the device structure according to the reference example.

Since the contact pillars 12A, 12B1, 12B2 can be overlapped with the write bit line WBL, for example, as shown in FIG. 4, the area per cell does not increase by the region for arranging the contact pillars 12A, 12B1, 12B2.

Since the contact pillars 12A, 12B1, 12B2 can be overlapped with the write bit line WBL, for example, as shown in FIG. 4, the area per cell does not increase by the region for arranging the contact pillars 12A, 12B1, 12B2.

However, since n MTJ elements having the same shape are stacked in the same direction (an easy axis direction of magnetization of a storage layer is the same) in this structure as described above, data cannot be independently written into the n MTJ elements arranged in the intersecting portion of two write lines.

2. Outline

In the example of the present invention, to increase a memory capacity, a cell array structure in which a plurality of MTJ elements are stacked on a semiconductor substrate is used.

Additionally, since the area per cell in the cell array plane becomes large in the cell array structure shown in FIGS. 1 and 2, the cell array structure shown in FIGS. 3 and 4 is used in the example of the present invention.

However, data cannot be independently written to a plurality of MTJ elements disposed in the intersecting portion of two write lines in the cell array structure of 1-transistor-nMTJ type shown in FIGS. 3 and 4.

To solve the problem, in the example of the present invention, the easy axis directions of magnetizations of the storage layers (free layers) of the plurality of MTJ elements disposed in the intersecting portion of two write lines are mutually varied, and a write method is devised, so that the data can be written independently into these MTJ elements.

It is to be noted that details will be described later, and the easy axis directions of magnetizations of two MTJ elements are allowed to cross each other at right angles. In this case, when a so-called toggle system is applied as a write method, the data can be independently written into two MTJ elements.

The write by the toggle system is described, for example, in Patent Document 9.

3. Embodiments

A plurality of embodiments considered as best will be described hereinafter with respect to a magnetic random access memory according to the example of the present invention.

(1) First Embodiment

[1] Structure

Figure 5:
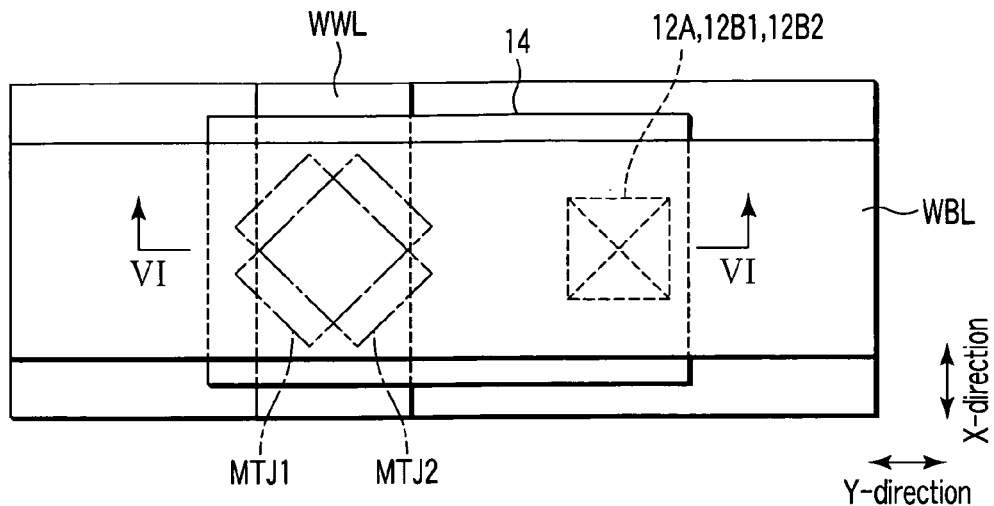
FIG. 5 is a plan view showing the device structure according to a first embodiment.
Figure 6:
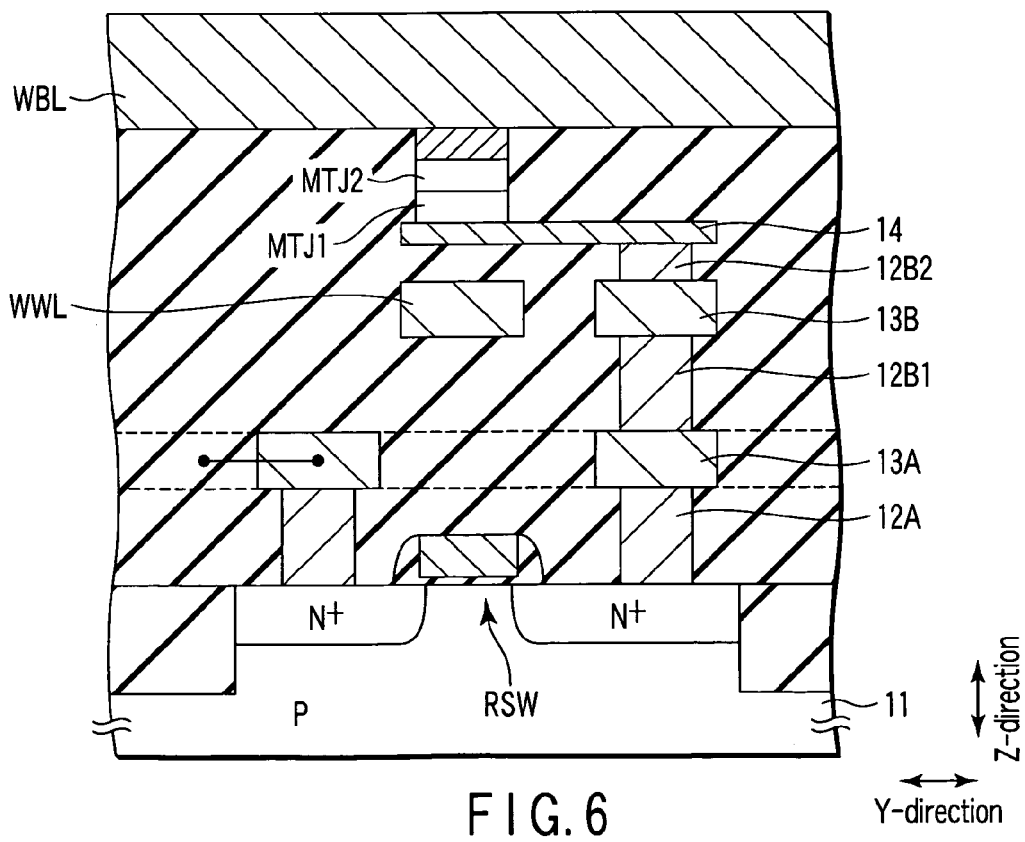
FIG. 6 is a sectional view along a VI—VI line of FIG. 5.

FIG. 5 shows a magnetic random access memory according to a first embodiment. FIG. 6 is a sectional view along a VI—VI line of FIG. 5.

A MOS transistor RSW which is a selection switch is disposed on a semiconductor substrate 11. Two stacked MTJ elements MTJ1, MTJ2 exist above the MOS transistor RSW. These MTJ elements MTJ1, MTJ2 are disposed in the intersecting portion of a write word line WWL and a write bit line WBL.

In this structure, to electrically connect the MOS transistor RSW which is the selection switch to the MTJ elements MTJ1, MTJ2 arranged above the transistor, contact pillars 12A, 12B1, 12B2 are used.

Since these contact pillars 12A, 12B1, 12B2 can be overlapped with the write bit line WBL as apparent from FIG. 5, the area per cell is equal to that of the cell array structure of 1-transistor-1MTJ type shown in FIGS. 3 and 4.

Figure 7:
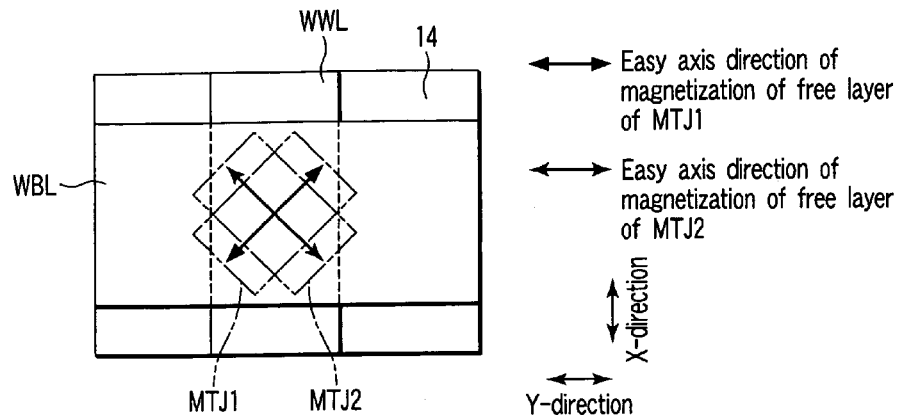
FIG. 7 is a plan view showing an easy axis direction of magnetization of the MTJ element.

Moreover, the easy axis direction of magnetization of the storage layer of the MTJ element MTJ1 is different from that of the storage layer of the MTJ element MTJ2. In the present example, for example, as shown in FIG. 7, the easy axis directions of magnetizations of the storage layers of the MTJ elements MTJ1, MTJ2 cross each other at right angles.

Furthermore, the easy axis direction of magnetization of the storage layer of the MTJ element MTJ1 forms an angle of 45° with respect to a direction in which the write word line WWL and write bit line WBL extend. Similarly, the easy axis direction of magnetization of the storage layer of the MTJ element MTJ2 also forms an angle of 45° with respect to the direction in which the write word line WWL and write bit line WBL extend.

The magnetization direction of the fixed layer (pinned layer) of the MTJ element MTJ1 is the same as that of the storage layer of the MTJ element MTJ1. The magnetization direction of the fixed layer of the MTJ element MTJ2 is the same as that of the storage layer of the MTJ element MTJ2.

Figure 8:
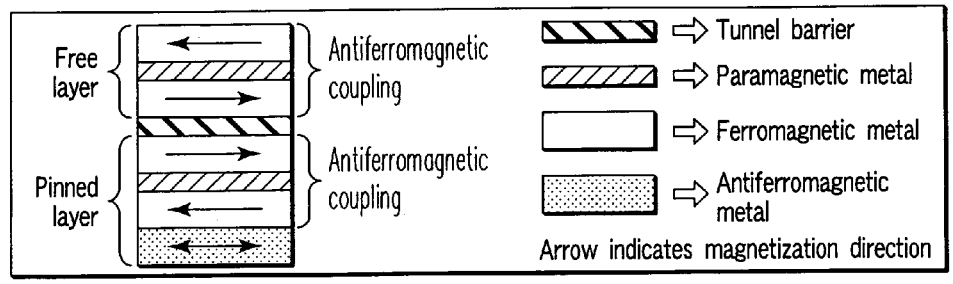
FIG. 8 is a diagram showing a magnetized state of the MTJ element in a parallel state.
Figure 9:
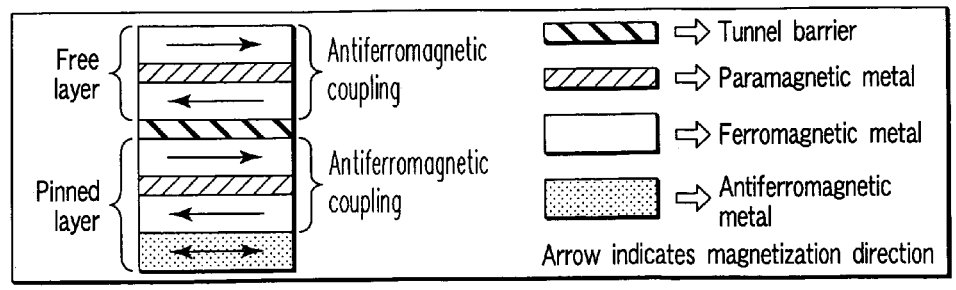
FIG. 9 is a diagram showing the magnetized state of the MTJ element in an anti-parallel state.

FIGS. 8 and 9 show structural examples of the MTJ element.

The storage layer (free layer) of the MTJ element comprises two ferromagnetic metals and a paramagnetic metal held between these metals, and a synthetic anti-ferromagnetic coupling layer structure is formed by ferromagnetic metal/paramagnetic metal/ferromagnetic metal. In the present example, only one synthetic anti-ferromagnetic coupling layer structure exists with respect to the storage layer of the MTJ element, but a plurality of synthetic anti-ferromagnetic coupling layer structures may also exist.

The fixed layer of the MTJ element comprises two ferromagnetic metals, the paramagnetic metal held between these metals, and further an anti-ferromagnetic metal which contacts one of the ferromagnetic metals. The synthetic anti-ferromagnetic coupling layer structure is formed by the ferromagnetic metal/paramagnetic metal/ferromagnetic metal. In the present example, only one synthetic antiferromagnetic coupling layer structure exists with respect to the fixed layer of the MTJ element, but a plurality of synthetic anti-ferromagnetic coupling layer structures may also exist.

According to this structure, data can be written independently with respect to two MTJ elements MTJ1, MTJ2 disposed in the intersecting portion of two write lines WWL, WBL.

For example, when a toggle write mode is used, magnetic fields directed in two directions via the easy axis direction of magnetization of the storage layer of the MTJ element are used, and these magnetic fields are synthesized to write data. Therefore, for example, when the easy axis directions of magnetizations of the storage layers of the MTJ elements MTJ1, MTJ2 are allowed to cross each other at right angles as in the present example, the data can be written into only one of the MTJ elements MTJ1, MTJ2.

It is to be noted that with the use of the toggle write mode, remnant magnetization of a ferromagnetic metal layer may be canceled to set the synthesized remnant magnetization of the storage layers of the MTJ elements MTJ1, MTJ2 substantially to zero.

[2] Write Procedure

Next, an example of a procedure for independently writing the data into one of two MTJ elements MTJ1, MTJ2 in the magnetic random access memory of FIGS. 5 to 9 will be described.

For example, when the toggle write mode is used, first the data of the MTJ element which is a write object is read. When the data matches write data, the data is not written. Only when both the data do not match is the data written.

When the data is written in the toggle write mode, the state of the MTJ element changes regardless of the state of the MTJ element before the write. For example, by the write, the anti-parallel state of the MTJ element changes to the parallel state, and the parallel state of the MTJ element changes to the anti-parallel state.

Here, an example will be described in which the MTJ element MTJ1 is used as a write object among two MTJ elements MTJ1, MTJ2 and only the state of the MTJ element MTJ1 is changed to the parallel state from the anti-parallel state without changing the state of the MTJ element MTJ2.

Figure 10:
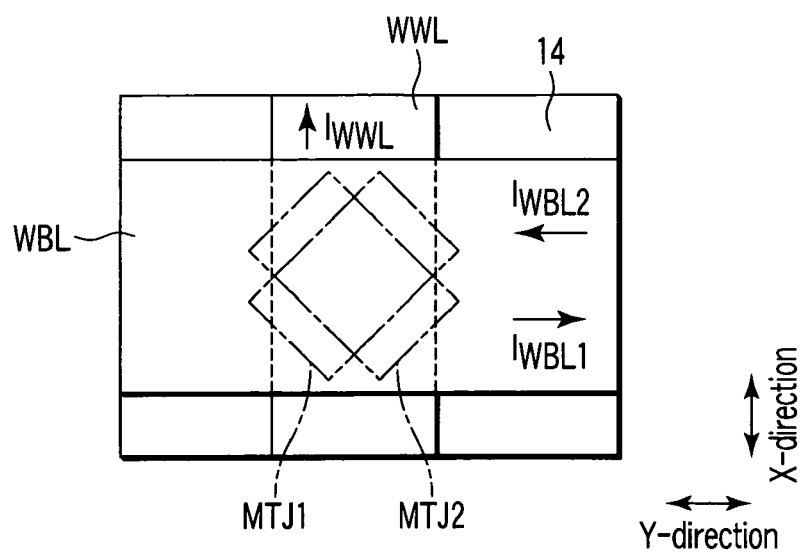
FIG. 10 is a diagram showing a direction of a current flowing through a write line.

To change the state of the MTJ element MTJ1 to the parallel state from the anti-parallel state or to the anti-parallel state from the parallel state, as shown in FIG. 10, IWWL may be passed through the write word line WWL, and IWBL1 may be passed through the write bit line WBL. A timing to supply write currents IWWL, IWBL1 is set, for example, to a timing shown in FIG. 11.

Here, the point lies in that a shift of a certain period A exists between the timing to supply the write current IWWL and the timing to supply the write current IWBL1.

The states of the MTJ elements MTJ1, MTJ2 in each of periods T1 to T5 shown in a waveform diagram of FIG. 11 will be described hereinafter.

Period T1 (Initial State)

Figure 12:
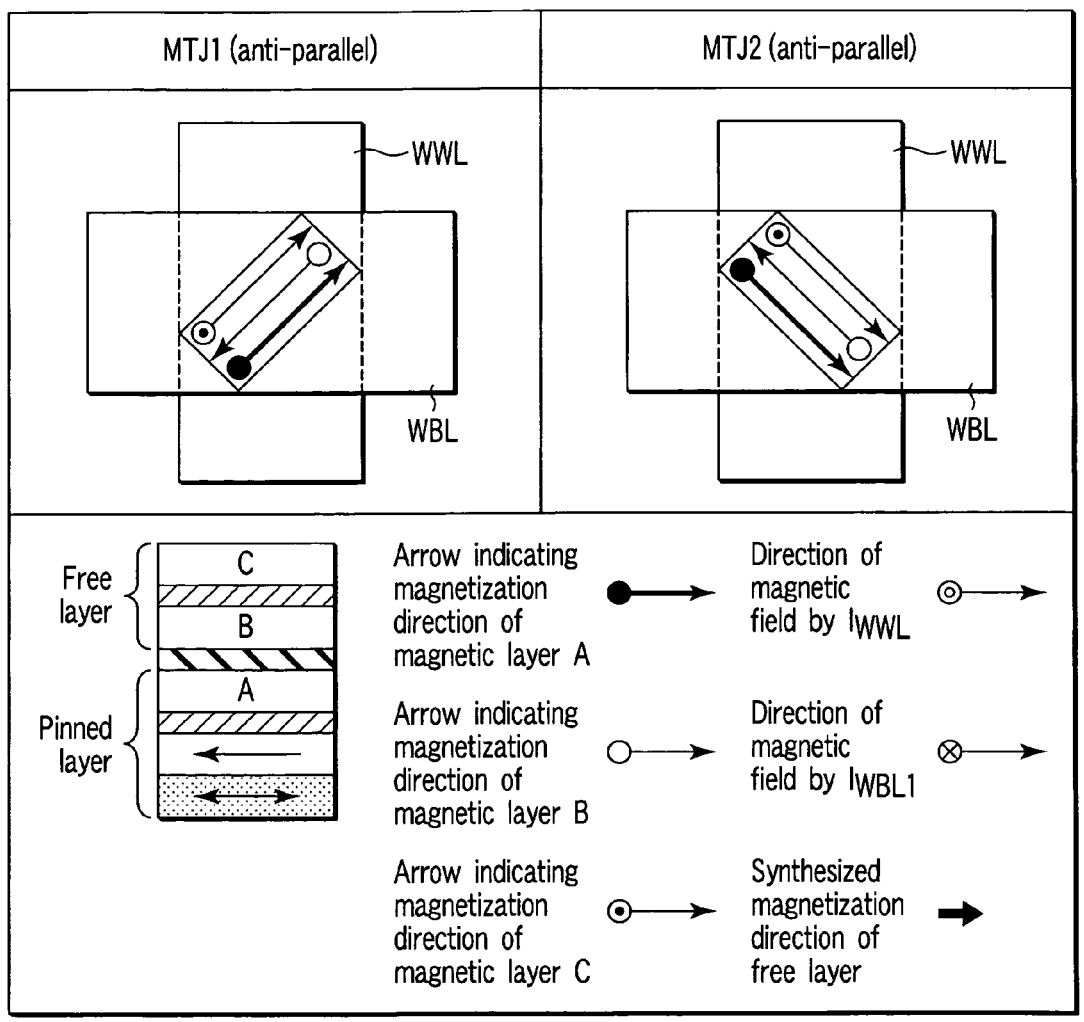
FIG. 12 is a diagram showing the state of the MTJ element at a write time.

As shown in FIG. 12, the MTJ elements MTJ1, MTJ2 are both in the anti-parallel state.

Period T2 (Supply of IWWL)

Figure 13:
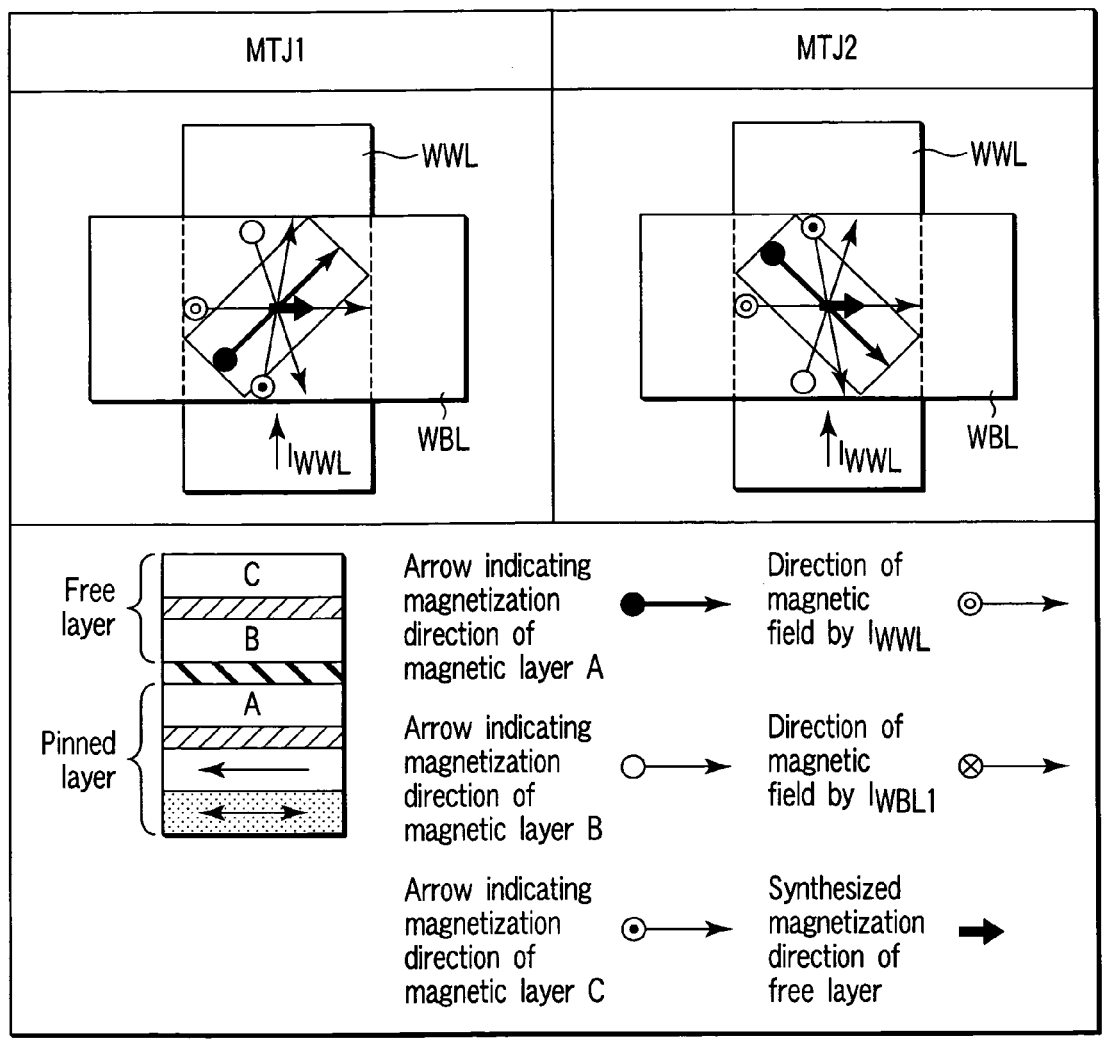
FIG. 13 is a diagram showing the state of the MTJ element at the write time.

When the write current IWWL is passed through the write word line WWL as shown in FIG. 13, a magnetic field is produced by this write current IWWL, and magnetization vectors of magnetic layers B, C constituting the storage layer (free layer) of the MTJ elements MTJ1, MTJ2 try to turn to the direction of the magnetic field produced by the write current IWWL. Therefore, a synthesized magnetization vector appears in the storage layer, and tries to turn to the direction of the magnetic field produced by the write current IWWL. That is, the synthesized magnetization direction of the storage layer turns to a direction parallel to the write bit line WBL.

Additionally, when a synthetic anti-ferromagnetic coupling layer structure of the magnetic layers B, C constituting the storage layer of the MTJ elements MTJ1, MTJ2 is adjusted and designed, the magnetization vectors are prevented from turning to the direction of the magnetic field produced by the write current IWWL.

As a result, the magnetization vectors of the magnetic layers B, C constituting the storage layer of the MTJ element MTJ1 start rotating counterclockwise, and the magnetization vectors of the magnetic layers B, C constituting the storage layer of the MTJ element MTJ2 start rotating clockwise.

Period T3 (Supply of IWWL, IWBL1)

Figure 14:
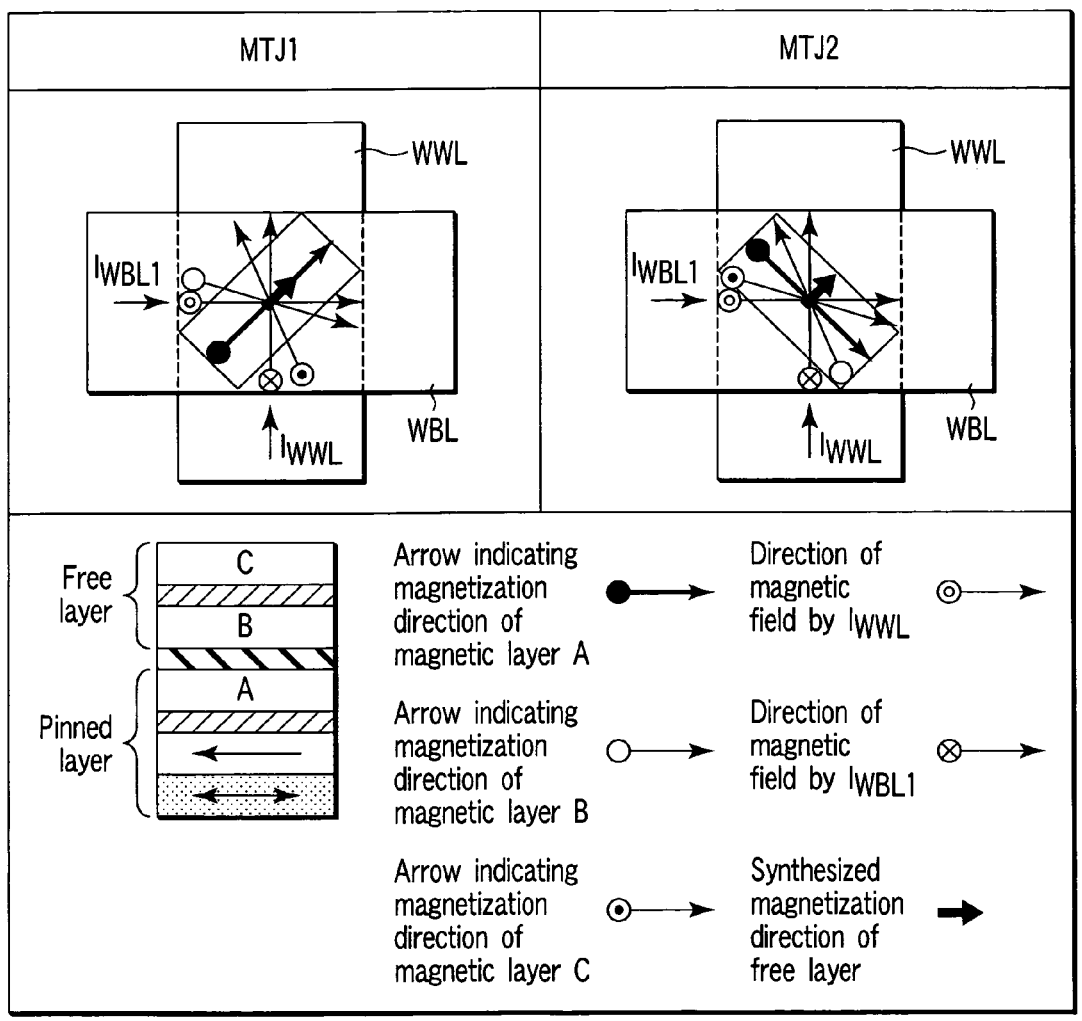
FIG. 14 is a diagram showing the state of the MTJ element at the write time.

Thereafter, as shown in FIG. 14, the write current IWBL1 is passed through the write bit line WBL in a state in which the write current IWWL is passed through the write word line WWL, then the magnetic field is produced by these write currents IWWL, IWBL1, and the synthesized magnetization direction of the storage layer rotates toward the synthesized magnetization direction produced by the write currents IWWL, IWBL1. That is, the synthesized magnetization direction of the storage layer turns to the easy axis direction of magnetization of the MTJ element MTJ1.

As a result, the magnetization vectors of the magnetic layers B, C constituting the storage layer of the MTJ element MTJ1 further rotate counterclockwise, but the magnetization vectors of the magnetic layers B, C constituting the storage layer of the MTJ element MTJ2 start rotating counterclockwise this time.

Period T4 (Supply of IWBL1)

Figure 15:
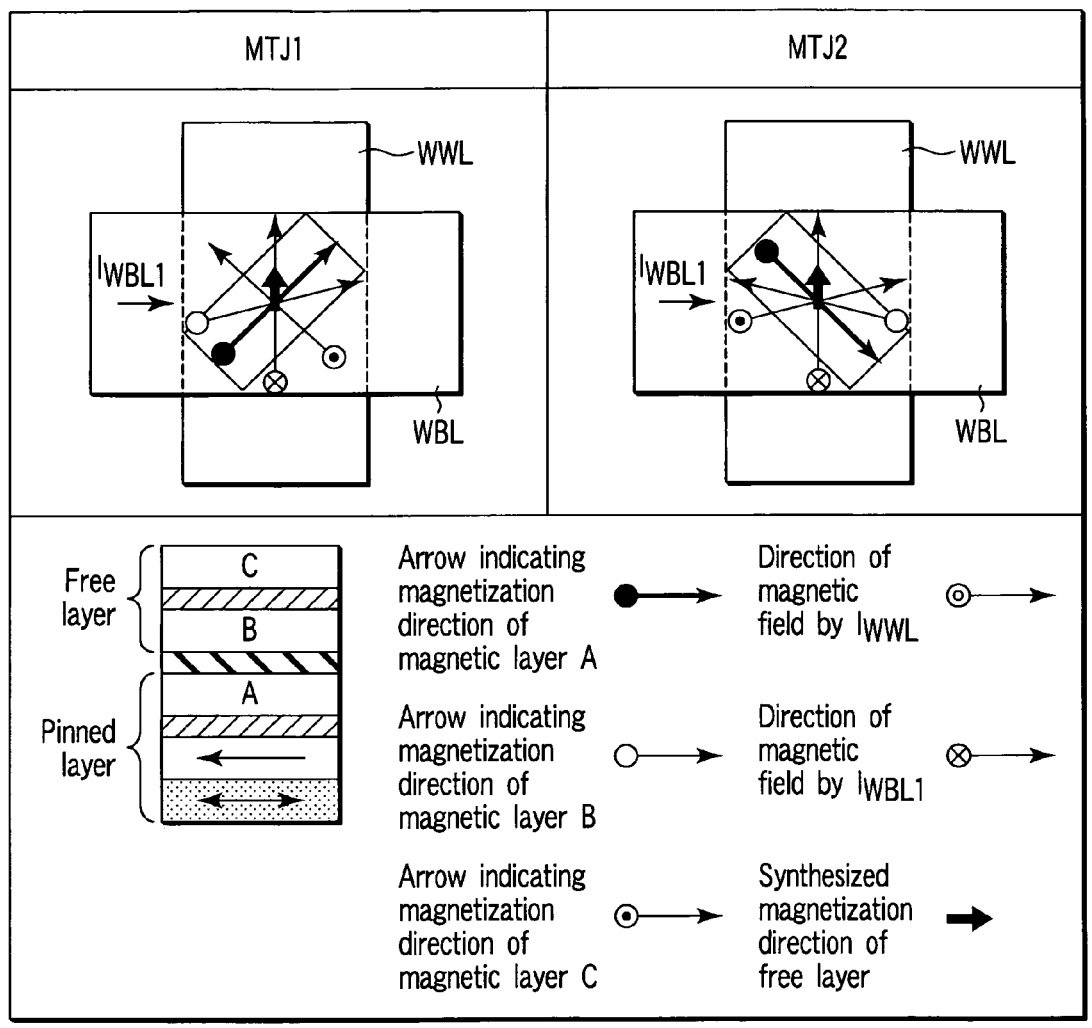
FIG. 15 is a diagram showing the state of the MTJ element at the write time.

Thereafter, as shown in FIG. 15, when the write current IWWL passed through the write word line WWL is interrupted, the magnetic field is produced only by the write current IWBL1 flowing through the write bit line WBL, and the synthesized magnetization direction of the storage layer rotates toward the magnetization direction produced by the write current IWBL1. That is, the synthesized magnetization direction of the storage layer turns to a direction parallel to the write word line WWL.

As a result, the magnetization vectors of the magnetic layers B, C constituting the storage layer of the MTJ element MTJ1 further rotate counterclockwise, and the magnetization vectors of the magnetic layers B, C constituting the storage layer of the MTJ element MTJ2 further rotate counterclockwise.

Period T5 (Write Completion)

Figure 16:
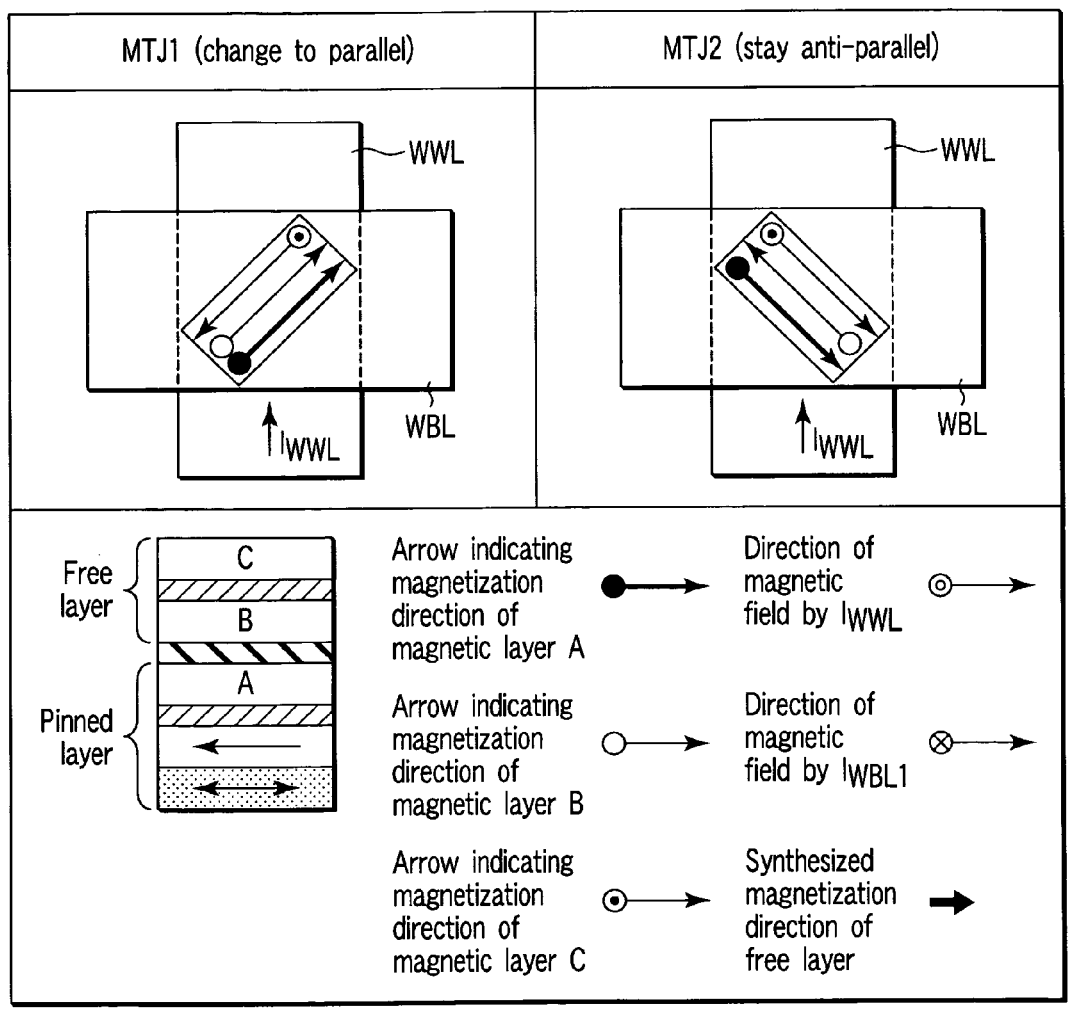
FIG. 16 is a diagram showing the state of the MTJ element at the write time.

Moreover, as shown in FIG. 16, when the write current IWBL1 passed through the write bit line WBL is interrupted, arrows indicating the magnetization directions of the magnetic layers B, C constituting the storage layers of the MTJ elements MTJ1, MTJ2 turn to mutually opposite directions, and turn to the same direction as the easy axis direction of magnetization of the storage layer of the MTJ elements MTJ1, MTJ2.

Here, the magnetization directions of the magnetic layers B, C finally change to the opposite directions from an initial state after elapse of the period T4 with respect to the MTJ element MTJ1. Therefore, when the direction is reversed from the initial state after interrupting the write current, energy becomes more stable. As a result, the state of the MTJ element MTJ1 changes to the parallel state from the anti-parallel state.

On the other hand, with respect to the MTJ element MTJ2, in view of the magnetization direction after the elapse of the period T4, when the magnetization directions of the magnetic layers B, C return to the initial state, the energy becomes more stable as compared with the magnetization direction reversed from the initial state. As a result, finally the magnetization direction of the magnetic layer B does not change from the initial state, and the anti-parallel state of the MTJ element MTJ2 is maintained.

Figure 11:
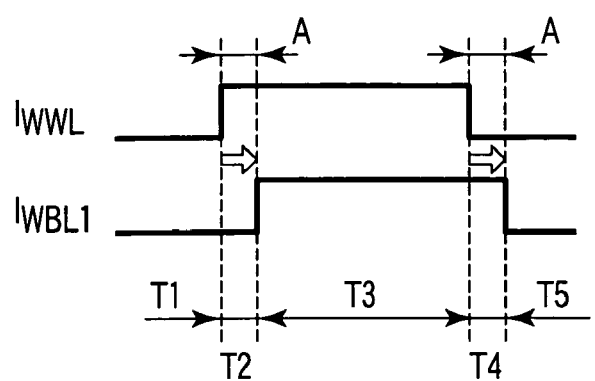
FIG. 11 is a diagram showing a supply timing of a write current.

It is to be noted that in the present example, as shown in FIG. 11, a timing to pass the current through the write word line WWL is set to be earlier than a timing to pass the current through the write bit line WBL by a certain delay time A. Conversely, the timing to pass the current through the write bit line WBL may be set to be earlier than the timing to pass the current through the write word line WWL by the certain delay time A.

Additionally, in this case, a rotation direction of the magnetization vector differs from that in the above-described example.

Others

The above-described example of the write procedure is an example in which the state of the MTJ element MTJ1 is independently changed to the parallel state from the anti-parallel state, and another case will be described briefly.

When the state of the MTJ element MTJ1 is independently changed to the anti-parallel state from the parallel state, the magnetic field may be supplied to the MTJ element MTJ1 by the same method as the write method shown in FIGS. 12 to 16. That is, by the timing shown in FIG. 11, IWWL is supplied to the write word line, and IWBL1 is supplied to the write bit line WBL.

Moreover, when the state of the MTJ element MTJ2 is changed to the parallel state from the anti-parallel state and to the anti-parallel state from the parallel state, the current IWBL1 passed through the write bit line WBL is changed to a reverse directed current IWBL2. Moreover, by the timing shown in FIG. 11, IWWL is supplied to the write word line, and IWBL2 is supplied to the write bit line WBL.

[3] Conclusion

When the easy axis directions of magnetizations of two MTJ elements are varied and the toggle write mode is used in the magnetic random access memory having the structure of these two MTJ elements stacked in the intersecting portion of two write lines in this manner in the first embodiment, the data can be independently written into these two MTJ elements.

(2) Second Embodiment

[1] Structure

Figure 17:
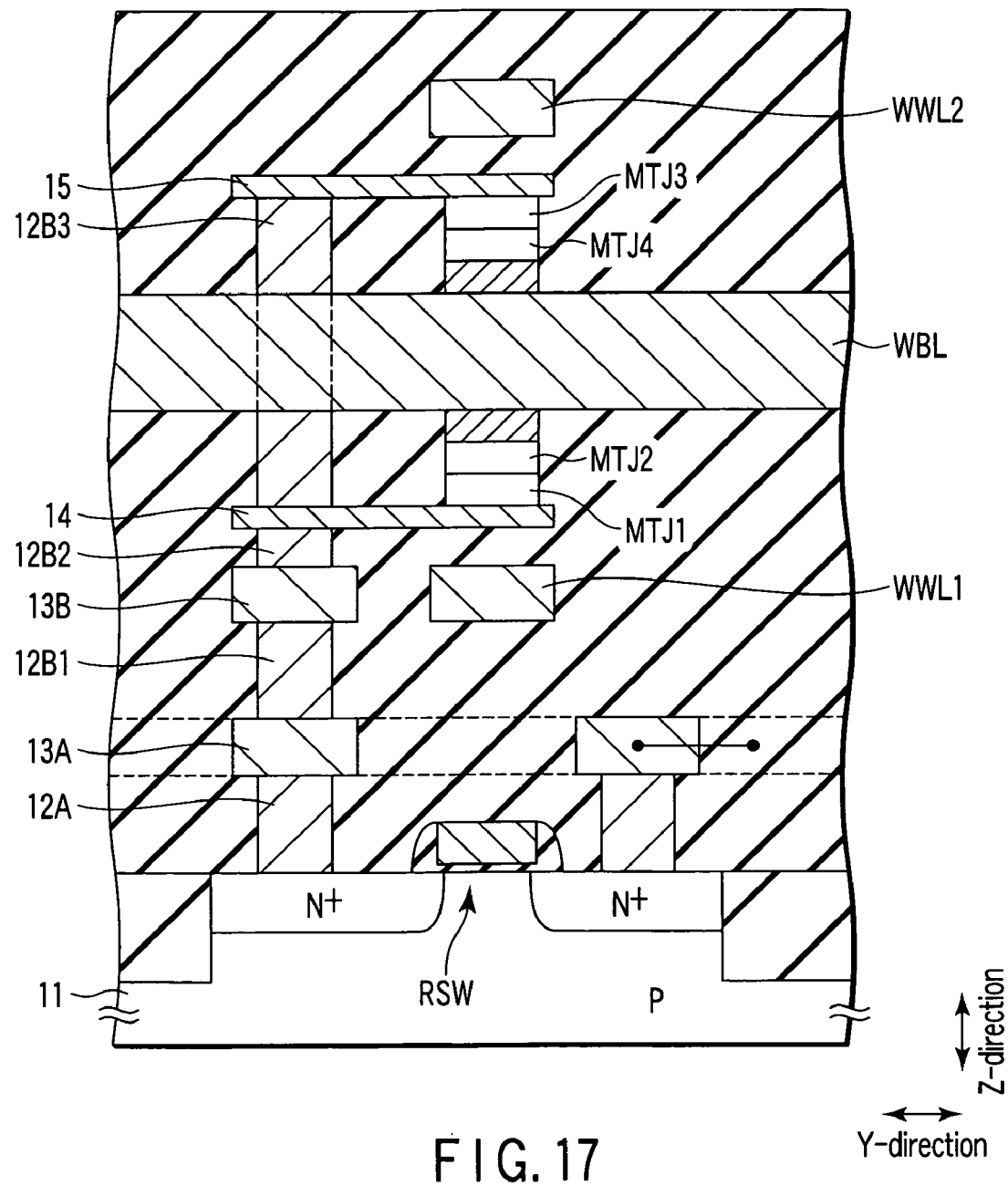
FIG. 17 is a sectional view showing the device structure according to a second embodiment.
Figure 18:
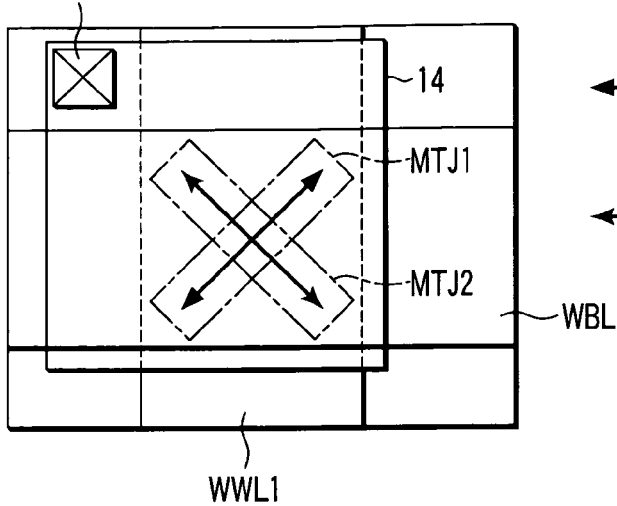
FIG. 18 is a plan view showing an easy axis direction of magnetization of the MTJ element.
Figure 19:
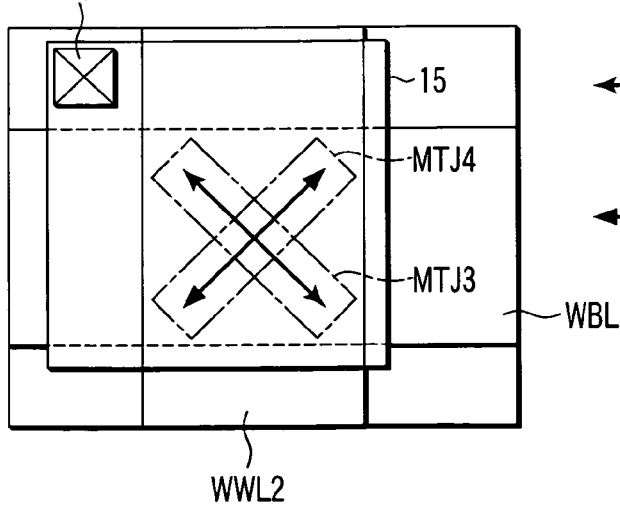
FIG. 19 is a plan view showing the easy axis direction of magnetization of the MTJ element.

FIG. 17 shows a magnetic random access memory according to a second embodiment. FIGS. 18 and 19 show setting examples of an easy axis direction of magnetization of an MTJ element in the magnetic random access memory of FIG. 17.

A MOS transistor RSW which is a selection switch is disposed on a semiconductor substrate 11. Four stacked MTJ elements MTJ1, MTJ2, MTJ3, MTJ4 exist above the MOS transistor RSW.

The MTJ elements MTJ1, MTJ2 are positioned under a write bit line WBL, and are disposed in an intersecting portion of a write word line WWL1 and the write bit line WBL. The MTJ elements MTJ3, MTJ4 are positioned above the write bit line WBL, and are disposed in the intersecting portion of a write word line WWL2 and the write bit line WBL.

The MTJ elements MTJ1, MTJ2 are disposed symmetrically with the MTJ elements MTJ3, MTJ4, for example, centering on the write bit line WBL.

In this structure, to electrically connect the MOS transistor RSW, which is the selection switch, to the MTJ elements MTJ1, MTJ2, MTJ3, MTJ4 arranged above the transistor, contact pillars 12A, 12B1, 12B2, 12B3 are used.

Since these contact pillars 12A, 12B1, 12B2, 12B3 cannot be overlapped with the write word lines WWL1, WWL2 and the write bit line WBL as apparent from FIGS. 18 and 19, the area per cell becomes larger than that of the cell array structure of 1-transistor-1MTJ type.

Additionally, since the MTJ elements are arranged on/under the write bit line WBL, the structure is advantageous for enlargement of a memory capacity using the stacked MTJ elements. Since the MTJ elements arranged on/under the write bit line WBL share the write bit line WBL, the structure can also contribute to reduction of the number of arranged elements.

The easy axis direction of magnetization of the storage layer of the MTJ element MTJ1 is different from that of the storage layer of the MTJ element MTJ2. In the present example, for example, as shown in FIG. 18, the easy axis directions of magnetizations of the storage layers of the MTJ elements MTJ1, MTJ2 cross each other at right angles.

Furthermore, the easy axis direction of magnetization of the storage layer of the MTJ element MTJ1 forms an angle of 45° with respect to a direction in which the write word line WWL1 and write bit line WBL extend. The easy axis direction of magnetization of the storage layer of the MTJ element MTJ2 also forms an angle of 45° with respect to the direction in which the write word line WWL1 and write bit line WBL extend.

The magnetization direction of the fixed layer (pinned layer) of the MTJ element MTJ1 is the same as that of the storage layer of the MTJ element MTJ1. The magnetization direction of the fixed layer of the MTJ element MTJ2 is the same as that of the storage layer of the MTJ element MTJ2.

Similarly, the easy axis direction of magnetization of the storage layer of the MTJ element MTJ3 is also different from that of the storage layer of the MTJ element MTJ4. In the present example, for example, as shown in FIG. 19, the easy axis direction of magnetization of the storage layer of the MTJ element MTJ3 crosses that of the storage layer of the MTJ element MTJ4 at right angles.

Furthermore, the easy axis direction of magnetization of the storage layer of the MTJ element MTJ3 forms an angle of 45° with respect to the direction in which the write word line WWL2 and write bit line WBL extend. The easy axis direction of magnetization of the storage layer of the MTJ element MTJ4 also forms an angle of 45° with respect to the direction in which the write word line WWL2 and write bit line WBL extend.

The magnetization direction of the fixed layer of the MTJ element MTJ3 is the same as that of the storage layer of the MTJ element MTJ3. The magnetization direction of the fixed layer of the MTJ element MTJ4 is the same as that of the storage layer of the MTJ element MTJ4.

It is to be noted that the MTJ elements MTJ1, MTJ2, MTJ3, MTJ4 are structured, for example, as shown in FIGS. 8 and 9.

To dispose the MTJ elements MTJ1, MTJ2 symmetrically with the MTJ elements MTJ3, MTJ4 centering on the write bit line WBL, for example, the fixed layers of the MTJ elements MTJ1, MTJ2 are directed downwards (semiconductor substrate side), and the fixed layers of the MTJ elements MTJ3, MTJ4 are directed upwards (side opposite to the semiconductor substrate).

According to this structure, data can be written independently into two MTJ elements MTJ1, MTJ2 disposed in the intersecting portion of two write lines WWL1, WBL. The data can also be written independently into two MTJ elements MTJ3, MTJ4 disposed in the intersecting portion of two write lines WWL2, WBL.

For example, when the toggle write mode is used, magnetic fields turning to two directions via the easy axis direction of magnetization of the storage layer of the MTJ element are used, and the magnetic fields are synthesized to write the data. Therefore, for example, when the easy axis directions of magnetizations of the storage layers of a plurality of MTJ elements are allowed to cross each other at right angles as in the present example, the data can be written into only one of these MTJ elements.

It is to be noted that with the use of the toggle write mode, remnant magnetization of a ferromagnetic metal layer may be canceled to set the synthesized remnant magnetization of the storage layers of the MTJ elements substantially to zero.

It is to be noted that since a write procedure is the same as that of the first embodiment, the description is omitted.

[2] Conclusion

Also in the second embodiment, the easy axis directions of magnetizations of two MTJ elements are varied, and the toggle write mode is used in the magnetic random access memory having a structure in which the two MTJ elements are stacked on the intersecting portion of two write lines, so that the data can be written independently into these two MTJ elements.

In the second embodiment, a region where the contact pillar for connecting the MOS transistor, which is the selection switch, to the MTJ element is disposed cannot be overlapped with the write word/bit line, and therefore the area per cell becomes larger than that of the cell array structure of 1-transistor-1MTJ type. Additionally, the MTJ elements disposed on/under the write bit line share the write bit line, and this can contribute to a reduction in the amount of wiring.

(3) Third Embodiment

[1] Structure

Figure 20:
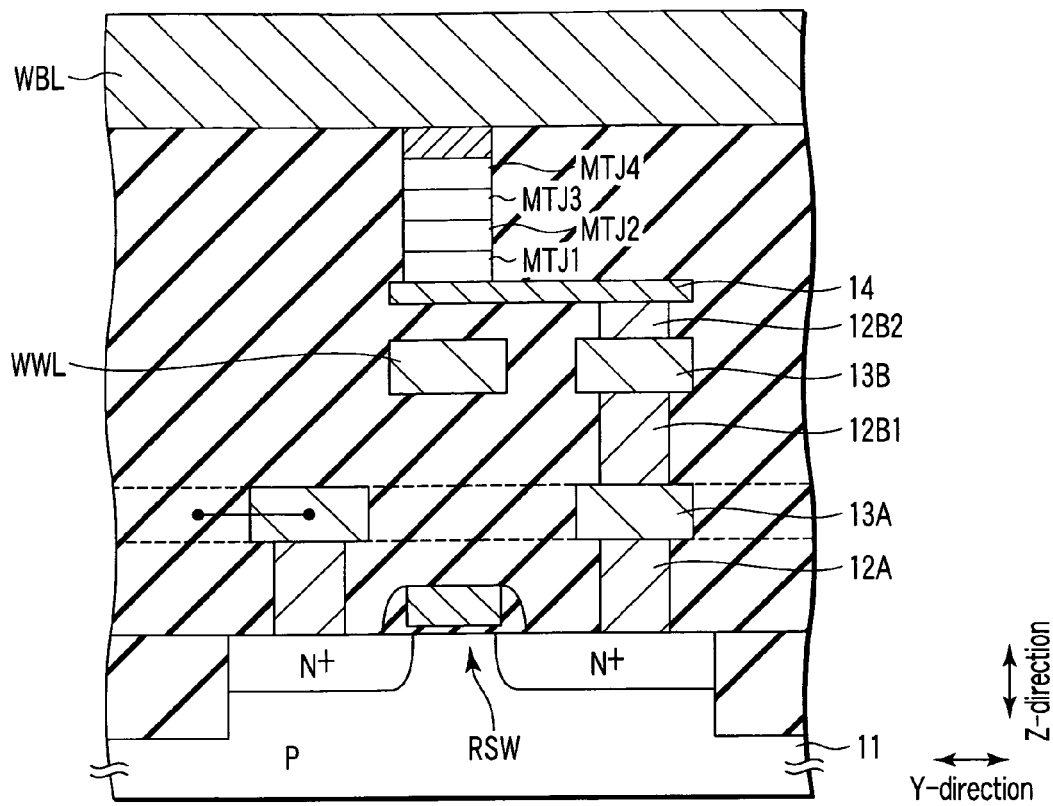
FIG. 20 is a sectional view showing the device structure according to a third embodiment.
Figure 21:
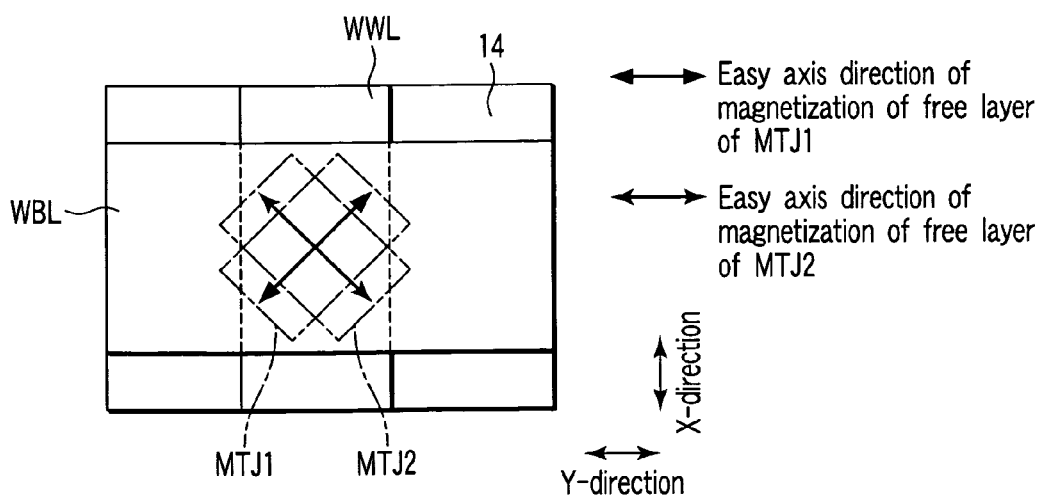
FIG. 21 is a plan view showing the easy axis direction of magnetization of the MTJ element.
Figure 22:
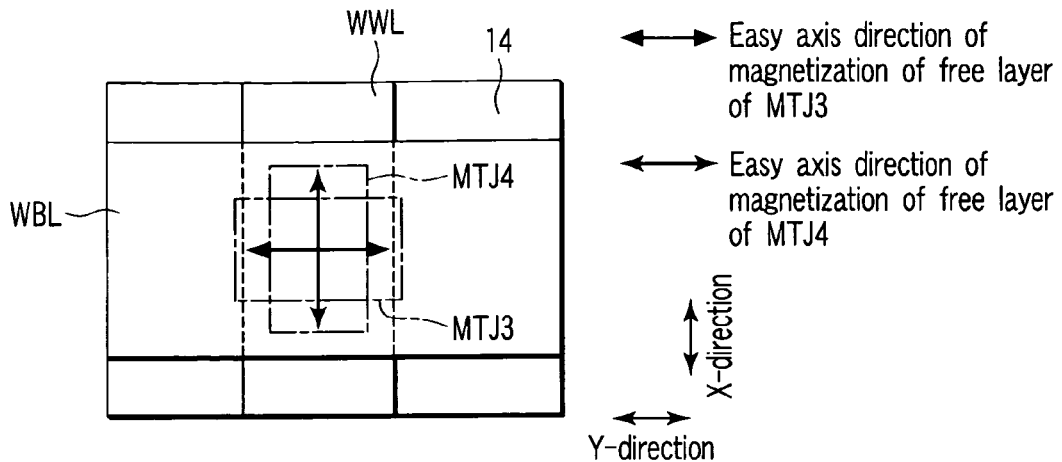
FIG. 22 is a plan view showing the easy axis direction of magnetization of the MTJ element.

FIG. 20 shows a magnetic random access memory according to a third embodiment. FIGS. 21 and 22 show examples of the easy axis direction of magnetization of the MTJ element in the magnetic random access memory.

A MOS transistor RSW, which is a selection switch, is disposed on a semiconductor substrate 11. Four stacked MTJ elements MTJ1, MTJ2, MTJ3, MTJ4 exist above the MOS transistor RSW. These MTJ elements MTJ1, MTJ2, MTJ3, MTJ4 are disposed in an intersecting portion of a write word line WWL and a write bit line WBL.

In this structure, to electrically connect the MOS transistor RSW, which is the selection switch, to the MTJ elements MTJ1, MTJ2, MTJ3, MTJ4 arranged above the transistor, contact pillars 12A, 12B1, 12B2 are used.

Since these contact pillars 12A, 12B1, 12B2 can be overlapped with the write bit line WBL in the same manner as in the first embodiment, an area per cell becomes equal to that of the cell array structure of 1-transistor-1MTJ type.

Moreover, the easy axis directions of magnetizations of the storage layers of four MTJ elements MTJ1, MTJ2, MTJ3, MTJ4 are different from one another.

In the present example, for example, as shown in FIGS. 21 and 22, the easy axis directions of magnetizations of the storage layers of these four MTJ elements MTJ1, MTJ2, MTJ3, MTJ4 are arranged at an interval of 45° (=180°/4).

Moreover, the easy axis directions of magnetizations of the storage layers of the MTJ elements MTJ1, MTJ2 form an angle of 45°, for example, with respect to a direction in which the write word line WWL and write bit line WBL extend. The easy axis directions of magnetizations of the storage layers of the MTJ elements MTJ3, MTJ4 match the direction in which the write word line WWL1 and write bit line WBL extend.

The magnetization directions of the fixed layers of the MTJ elements MTJ1, MTJ2, MTJ3, MTJ4 are the same as those of the storage layers of the MTJ elements MTJ1, MTJ2, MTJ3, MTJ4.

According to this structure, data can be written independently into four MTJ elements MTJ1, MTJ2, MTJ3, MTJ4 disposed in the intersecting portion of two write lines WWL, WBL.

Figure 23:
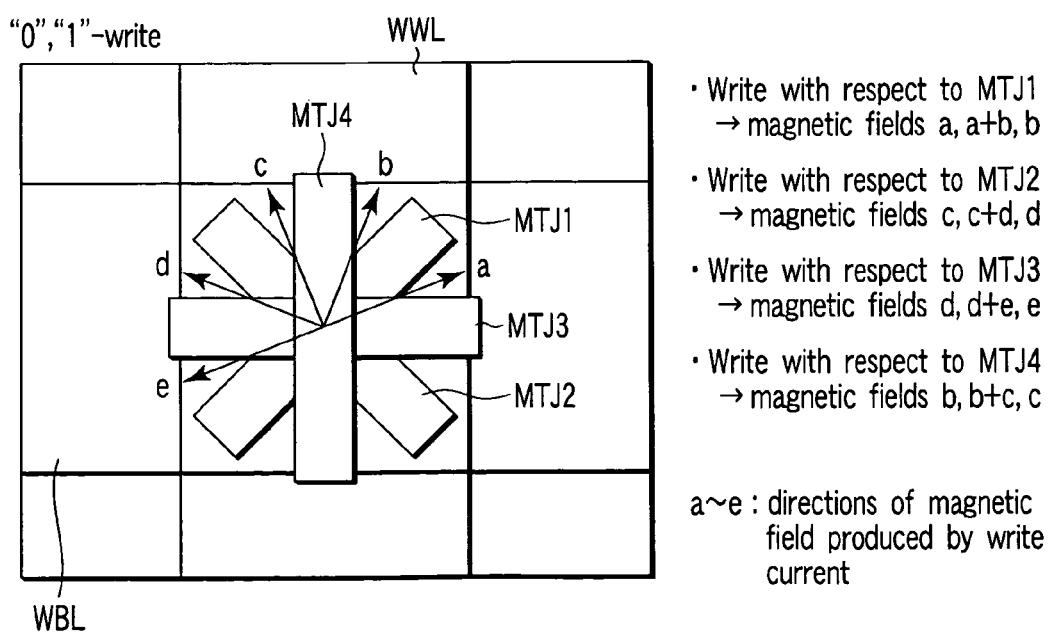
FIG. 23 is a diagram showing an example of a magnetic field generated at the write time.

Here, when the toggle system is used at a write time, as shown in FIG. 23 or 24, magnetic fields turning to two directions via the easy axis direction of magnetization of the storage layer of the MTJ element are used, and the magnetic fields are synthesized to write the data.

For example, to write the data into the MTJ element MTJ1, magnetic fields a, b turning to two directions via the easy axis direction of magnetization of the storage layer of the MTJ element MTJ1 are used, and these magnetic fields are synthesized to change a magnetized state of the MTJ element MTJ1.

Therefore, for example, when the easy axis directions of magnetizations of the storage layers of four MTJ elements MTJ1, MTJ2, MTJ3, MTJ4 are arranged at an interval of 45° as in the present example, the data can be written into only one of these MTJ elements.

It is to be noted that with the use of the toggle write mode, remnant magnetization of a ferromagnetic metal layer may be canceled to set the synthesized remnant magnetization of the storage layers of the MTJ elements substantially to zero.

Figure 26:
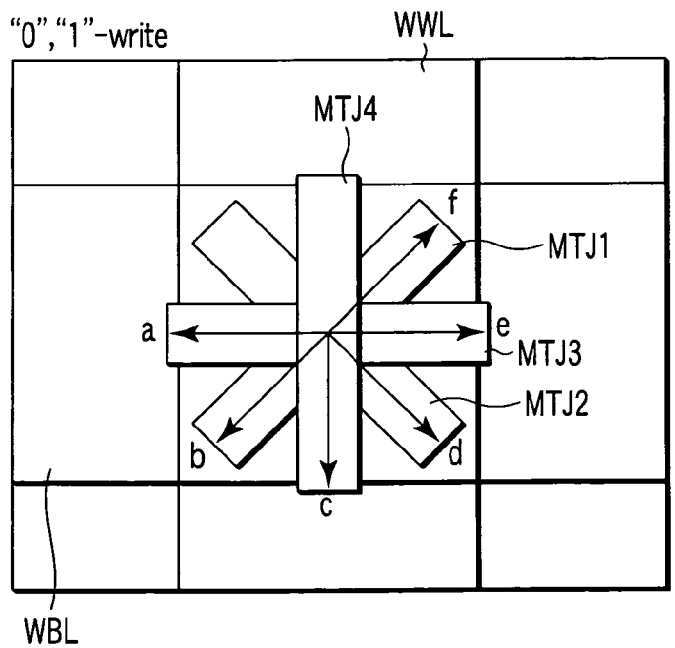
FIG. 26 is a diagram showing an example of the magnetic field generated at the write time.

It is to be noted that magnetic field directions shown in FIG. 25 or 26 may also be set instead of the magnetic field directions shown in FIG. 23 or 24 with respect to the synthesis of the magnetic fields in the toggle system. Also in this case, the magnetic fields turning to two directions via the easy axis direction of magnetization of the storage layer of the MTJ element are synthesized to write the data.

When the synthesized remnant magnetization of the storage layer is substantially zero, the magnetic field only in the easy axis direction of magnetization can be set to prevent the magnetization from being reversed, because the ferromagnetic layer constituting the storage layer has an antiferromagnetic structure. Accordingly, the data can be selectively written into a plurality of MTJ elements arranged in an array without causing wrong write.

Since a write procedure is the same as that of the first embodiment, the description is omitted.

Additionally, a write word line/bit line driver needs to be constituted in such a manner that a magnitude of a write current to be passed through the write word/bit line can be changed in order to produce magnetic fields a, b, c, d, e, f shown in FIGS. 23 to 26.

[2] Conclusion

When the easy axis directions of magnetizations of four MTJ elements are varied and the toggle write mode is used in the magnetic random access memory having the structure of these four MTJ elements stacked in the intersecting portion of two write lines in the third embodiment, the data can be independently written into these four MTJ elements.

4. Circuit Example

(1) Equivalent Circuit of Memory Cell Array

First, an equivalent circuit of a cell array structure described in the first to third embodiments will be described.

[1] Cell Array Structure of First Embodiment

Figure 27:
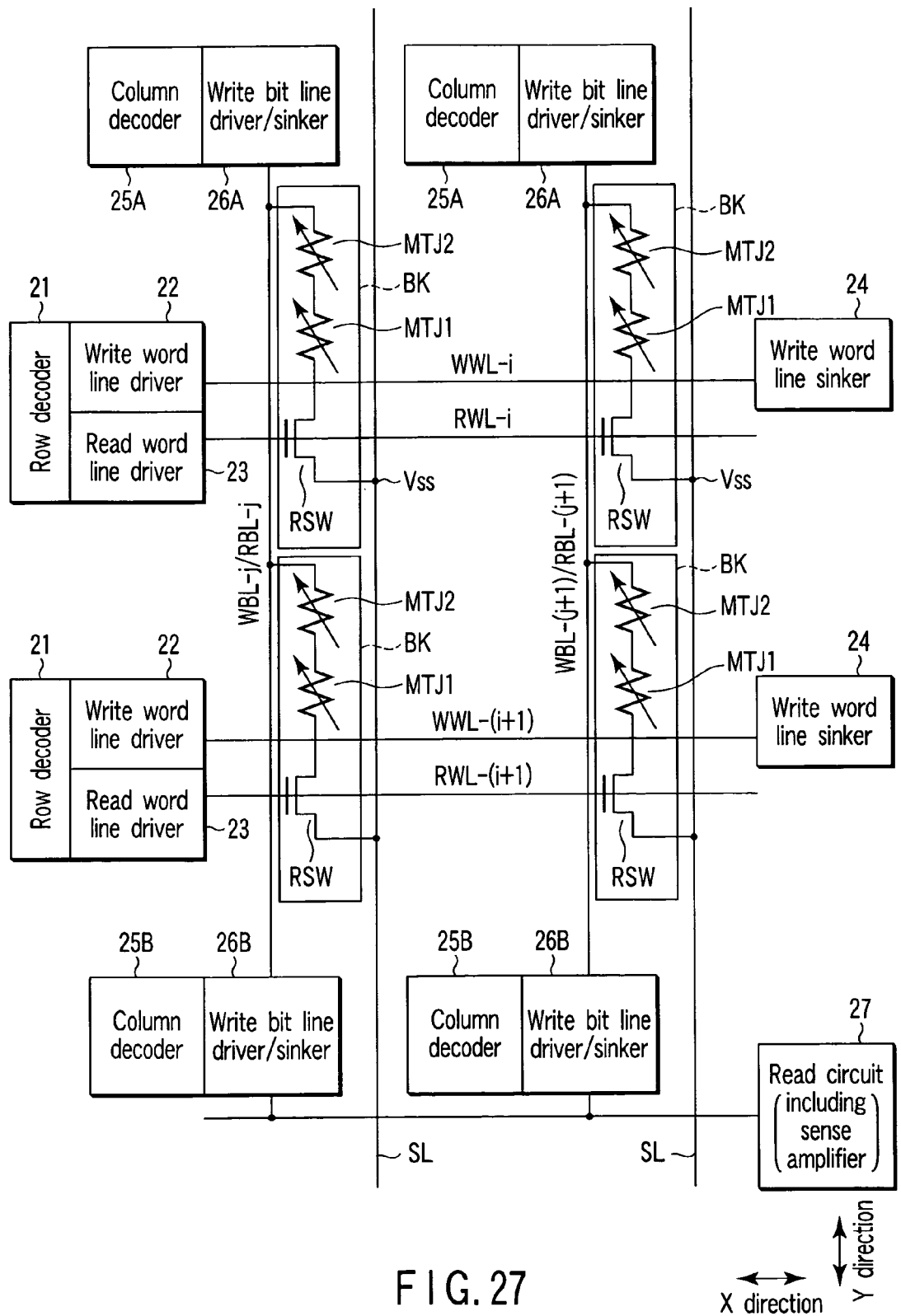
FIG. 27 is an equivalent circuit diagram of a cell array structure in the first embodiment.

FIG. 27 shows an equivalent circuit of a cell array structure of the first embodiment.

The memory cell array comprises a plurality of blocks BK each including two MTJ elements MTJ1, MTJ2 arranged in an array in X and Y-directions.

One block BK comprises a MOS transistor RSW which is a selection switch and two MTJ elements MTJ1, MTJ2. As shown in FIGS. 5 and 6, the MTJ elements MTJ1, MTJ2 are stacked upon each other, one end (lower surface side) is connected to a source line (ground potential) SL via the MOS transistor RSW, and the other end (upper surface side) is connected to a write/read bit line WBL-j/RBL-j.

In the present example, a write word line WWL-i and read word line RWL-i extend in an X-direction, and the write/read bit line WBL-j/RBL-j and source line SL extend in a Y-direction. Additionally, the source line SL may also extend, for example, in the X-direction.

One end of the write word line WWL-i is connected to a write word line driver 22, and the other end is connected to a write word line sinker 24.

For example, when the write word line WWL-i is selected by a row decoder 21 at a write time, a write current directed to the write word line sinker 24 from the write word line driver 22 flows through the write word line WWL-i.

One end of the read word line RWL-i is connected to a read word line driver 23.

For example, when the read word line RWL-i is selected by the row decoder 21 at a read time, the MOS transistor RSW connected to the read word line RWL-i is brought into an on state, and therefore currents flow through the MTJ elements MTJ1, MTJ2 in the block BK connected to the read word line RWL-i.

One end of the write/read bit line WBL-j/RBL-j is connected to a write bit line driver/sinker 26A, and the other end is connected to a write bit line driver/sinker 26B and read circuit (including sense amplifier) 27.

For example, when the write/read bit line WBL-j/RBL-j is selected by column decoders 25A, 25B at the write time, the direction of the current to be passed through the write/read bit line WBL-j/RBL-j is determined based on a position of a cell (MTJ element MTJ1 or MTJ2) constituting a write object.

For example, when the write/read bit line WBL-j/RBL-j is selected by the column decoders 25A, 25B at the read time, the write/read bit line WBL-j/RBL-j is electrically connected to the read circuit 27 via a column selection switch.

[2] Cell Array Structure of Second Embodiment

Figure 28:
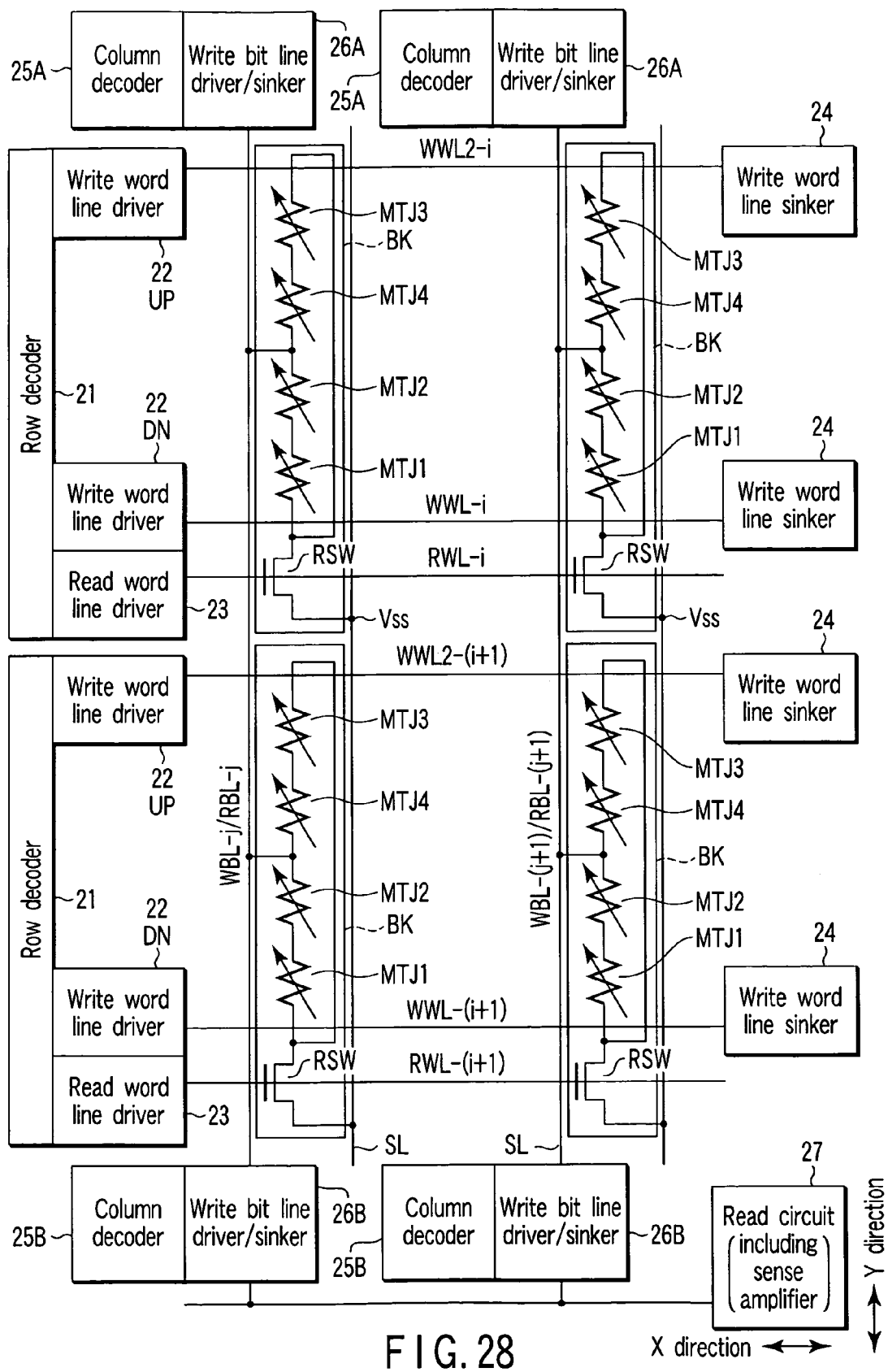
FIG. 28 is an equivalent circuit diagram of the cell array structure in the second embodiment.

FIG. 28 shows an equivalent circuit of the cell array structure in the second embodiment.

The memory cell array comprises a plurality of blocks BK each including four MTJ elements MTJ1, MTJ2, MTJ3, MTJ4 arranged in an array in X and Y-directions.

The block BK comprises a MOS transistor RSW which is a selection switch and four MTJ elements MTJ1, MTJ2, MTJ3, MTJ4.

As shown in FIGS. 17 and 18, the MTJ elements MTJ1, MTJ2 are stacked upon each other, one end (lower surface side) is connected to a source line (ground potential) SL via the MOS transistor RSW, and the other end (upper surface side) is connected to a write/read bit line WBL-j/RBL-j.

As shown in FIGS. 17 and 19, the MTJ elements MTJ3, MTJ4 are stacked upon each other, one end (upper surface side) is connected to the source line (ground potential) SL via the MOS transistor RSW, and the other end (lower surface side) is connected to the write/read bit line WBL-j/RBL-j.

In the present example, write word lines WWL1-i, WWL2-i and read word line RWL-i extend in the X-direction, and the write/read bit line WBL-j/RBL-j and source line SL extend in the Y-direction. Additionally, the source line SL may also extend, for example, in the X-direction.

One end of the write word line WWL1-i is connected to a write word line driver 22DN, and the other end is connected to a write word line sinker 24.

One end of the write word line WWL2-i is connected to a write word line driver 22UP, and the other end is connected to the write word line sinker 24.

For example, when the write word line WWL1-i is selected by a row decoder 21 at a write time, a write current directed to the write word line sinker 24 from the write word line driver 22DN flows.

Moreover, for example, when the write word line WWL2-i is selected by the row decoder 21 at the write time, a write current directed to the write word line sinker 24 from the write word line driver 22UP flows.

One end of the read word line RWL-i is connected to a read word line driver 23.

For example, when the read word line RWL-i is selected by the row decoder 21 at a read time, the MOS transistor RSW connected to the read word line RWL-i is brought into an on state, and therefore currents flow through the MTJ elements MTJ1, MTJ2, MTJ3, MTJ4 in the block BK connected to the read word line RWL-i.

One end of the write/read bit line WBL-j/RBL-j is connected to a write bit line driver/sinker 26A, and the other end is connected to a write bit line driver/sinker 26B and read circuit (including sense amplifier) 27.

For example, when the write/read bit line WBL-j/RBL-j is selected by column decoders 25A, 25B at the write time, the direction of the write current to be passed through the write/read bit line WBL-j/RBL-j is determined based on a position of a cell (MTJ element MTJ1, MTJ2, MTJ3, or MTJ4) constituting a write object.

For example, when the write/read bit line WBL-j/RBL-j is selected by the column decoders 25A, 25B at the read time, the write/read bit line WBL-j/RBL-j is electrically connected to the read circuit 27 via a column selection switch.

[3] Cell Array Structure of Third Embodiment

Figure 29:
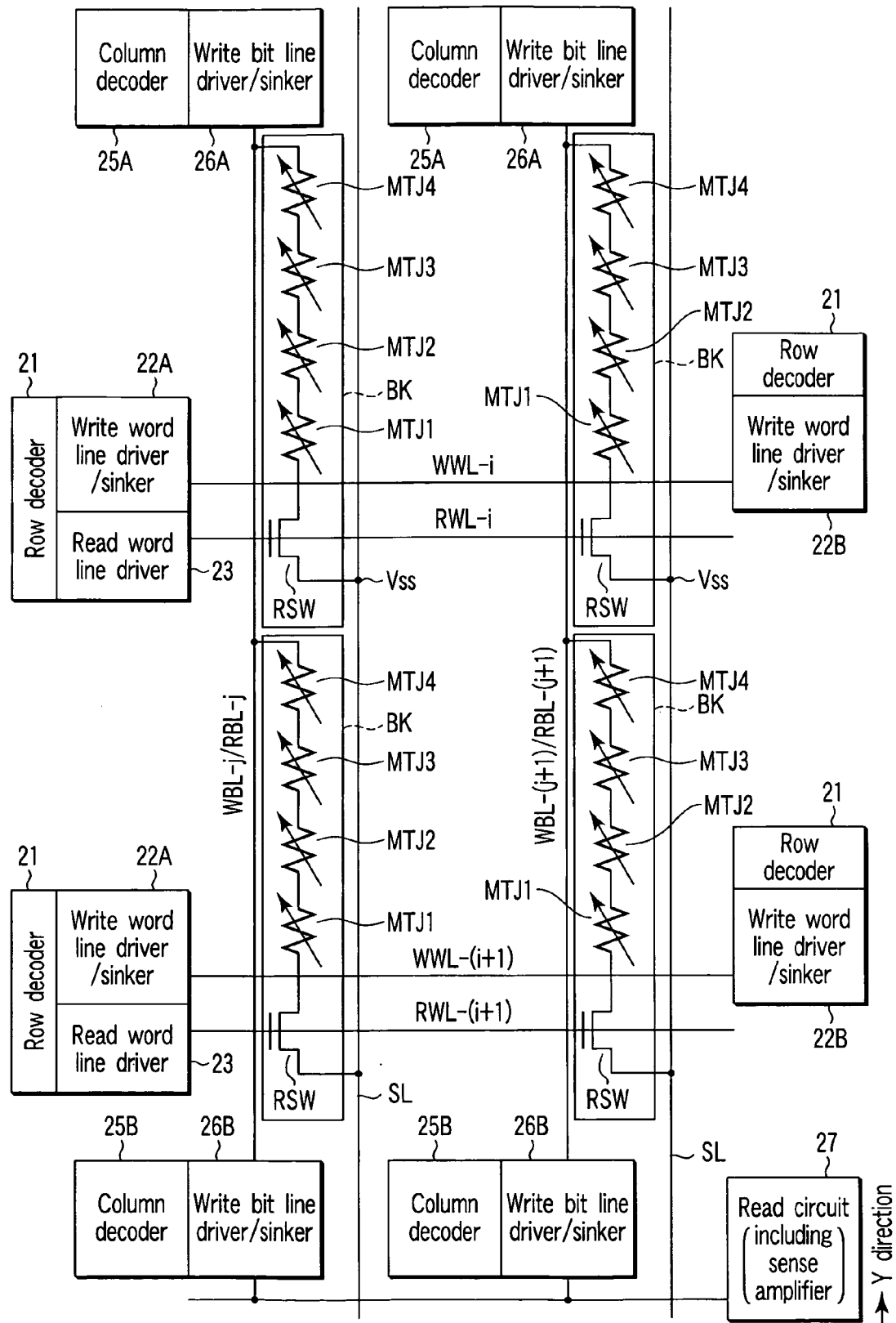
FIG. 29 is an equivalent circuit diagram of the cell array structure in the third embodiment.

FIG. 29 shows an equivalent circuit of the cell array structure of the third embodiment.

The memory cell array comprises a plurality of blocks BK each including four MTJ elements MTJ1, MTJ2, MTJ3, MTJ4 arranged in an array in X and Y-directions.

The block BK comprises a MOS transistor RSW which is a selection switch and four MTJ elements MTJ1, MTJ2, MTJ3, MTJ4.

As shown in FIGS. 20 to 22, the MTJ elements MTJ1, MTJ2, MTJ3, MTJ4 are stacked upon one another, one end (lower surface side) is connected to a source line (ground potential) SL via the MOS transistor RSW, and the other end (upper surface side) is connected to a write/read bit line WBL-j/RBL-j.

In the present example, a write word line WWL-i and a read word line RWL-i extend in the X-direction, and the write/read bit line WBL-j/RBL-j and source line SL extend in the Y-direction. Additionally, the source line SL may also extend, for example, in the X-direction.

One end of the write word line WWL-i is connected to a write word line driver/sinker 22A, and the other end is connected to a write word line driver/sinker 22B.

For example, when the write word line WWL-i is selected by a row decoder 21 at a write time, a magnitude and a direction of a write current to be passed through the write word line WWL-i are determined based on a position of a cell (MTJ element MTJ1, MTJ2, MTJ3, or MTJ4) constituting a write object.

In the present example, the magnitude and direction of the write current to be passed through the write word line WWL-i can be controlled using the write word line drivers/sinkers 22A, 22B.

One end of the read word line RWL-i is connected to a read word line driver 23.

For example, when the read word line RWL-i is selected by the row decoder 21 at a read time, the MOS transistor RSW connected to the read word line RWL-i is brought into an on state, and therefore currents flow through the MTJ elements MTJ1, MTJ2, MTJ3, MTJ4 in the block BK connected to the read word line RWL-i.

One end of the write/read bit line WBL-j/RBL-j is connected to a write bit line driver/sinker 26A, and the other end is connected to a write bit line driver/sinker 26B and read circuit (including sense amplifier) 27.

For example, when the write/read bit line WBL-j/RBL-j is selected by column decoders 25A, 25B at the write time, the magnitude and direction of the write current to be passed through the write/read bit line WBL-j/RBL-j are determined based on the position of the cell (MTJ element MTJ1, MTJ2, MTJ3, or MTJ4) constituting the write object.

In the present example, the magnitude and direction of the write current to be passed through the write/read bit line WBL-j/RBL-j can be controlled using the write bit line drivers/sinkers 26A, 26B.

For example, when the write/read bit line WBL-j/RBL-j is selected by the column decoders 25A, 25B at the read time, the write/read bit line WBL-j/RBL-j is electrically connected to the read circuit 27 via a column selection switch.

(2) Write Circuit for Use in Memories of First and Second Embodiments

Next, an example of a write circuit for use in the memories of the first and second embodiments.

[1] Write Word Line Driver/Sinker

FIG. 30 shows an example of a write word line driver/sinker.

The write word line driver/sinker is disposed for the purpose of passing a write current directed in only one direction through write word lines WWL-i, WWL1-i, WWL2-i.

P-channel MOS transistors P1, P2 are connected in series between a power terminal (power potential Vdd) and one end of the write word lines WWL-i, WWL1-i, WWL2-i. An N-channel MOS transistor N1 is connected in series between the other end of the write word lines WWL-i, WWL1-i, WWL2-i and a ground terminal (ground potential Vss).

IWWLSRC is input into a gate of the MOS transistor P1. A NAND gate circuit ND1 (21) receives an upper row address signal and write word line driving signal WWLDRV, and an output signal is input into the gate of the MOS transistor P2. A write word line sink signal WWLSNK is input into the gate of the MOS transistor N1.

At the write time, the write word line driving signal WWLDRV and write word line sink signal WWLSNK turn to "H", and all bits of the upper row address signal turn to "H" in a selected row.

Therefore, when a bias IWWLSRC is applied to the gate of the MOS transistor P1, the write current directed only in one direction can be passed through the write word lines WWL-i, WWL1-i, WWL2-i.

[2] Write Bit Line Driver/Sinker

FIG. 31 shows an example of a write bit line driver/sinker.

The write bit line driver/sinker is disposed for the purpose of controlling the direction of a write current to be passed through the write/read bit line WBL-j/RBL-j in accordance with a position of a cell constituting a write object at a write time.

P-channel MOS transistors P3, P4 and N-channel MOS transistor N2 are connected in series between a power terminal (power potential Vdd) and a ground terminal (ground potential Vss). Moreover, one end of the write/read bit line WBL-j/RBL-j is connected to a connection point of MOS transistors P4, N2.

IWBLSRC is input into a gate of the MOS transistor P3. A NAND gate circuit ND2 (25A) receives a column address signal, a write bit line driving signal WBLDRV, and a control signal UP indicating the position of the cell constituting the write object, and an output signal is input into the gate of the MOS transistor P4.

For example, with the use of the cell array structure of FIG. 27, the control signal UP turns to "H", when the MTJ element MTJ2 of an upper part (on a write/read bit line WBL-j/RBL-j side) is selected, and turns to "L", when the MTJ element MTJ1 of a lower part (on a semiconductor substrate side) is selected.

Moreover, for example, with the use of the cell array structure of FIG. 28, the control signal UP turns to "H", when the MTJ elements MTJ2, MTJ3 (cells on the write/read bit line WBL-j/RBL-j side) are selected, and turns to "L", when the MTJ elements MTJ1, MTJ4 are selected.

An AND gate circuit AD1 (25A) receives a column address signal, a write bit line sink signal WBLSNK, and a control signal DN indicating the position of the cell constituting the write object, and an output signal is input into the gate of the MOS transistor N2.

For example, with the use of the cell array structure of FIG. 27, the control signal DN turns to "H", when the MTJ element MTJ1 of the lower part (on the semiconductor substrate side) is selected, and turns to "L", when the MTJ element MTJ2 of the upper part (on the write/read bit line WBL-j/RBL-j side) is selected.

Moreover, for example, with the use of the cell array structure of FIG. 28, the control signal DN turns to "H", when the MTJ elements MTJ1, MTJ4 are selected, and turns to "L", when the MTJ elements MTJ2, MTJ3 (cells on the write/read bit line WBL-j/RBL-j side) are selected.

P-channel MOS transistors P5, P6 and N-channel MOS transistor N3 are connected in series between the power terminal (power potential Vdd) and the ground terminal (ground potential Vss). Moreover, the other end of the write/read bit line WBL-j/RBL-j is connected to a connection point of MOS transistors P6, N3.

IWBLSRC is input into the gate of the MOS transistor P5. A NAND gate circuit ND3 (25B) receives the column address signal, write bit line driving signal WBLDRV, and control signal DN indicating the position of the cell constituting the write object, and an output signal is input into the gate of the MOS transistor P6.

An AND gate circuit AD2 (25B) receives the column address signal, write bit line sink signal WBLSNK, and control signal UP indicating the position of the cell constituting the write object, and an output signal is input into the gate of the MOS transistor N3.

At the write time, the write bit line driving signal WBLDRV and write bit line sink signal WBLSNK turn to "H", and all bits of the column address signal turn to "H" in a selected column.

Therefore, when biases IWBLSRC are supplied to the gates of the MOS transistors P3, P5, the write currents having directions in accordance with values of control signals UP, DN indicating the positions of the cells constituting the write objects can be passed through the write/read bit line WBL-j/RBL-j.

[3] IWWLSRC, IWBLSRC Generation Circuits

FIG. 32 shows an example of an IWWLSRC generation circuit which produces IWWLSRC to be input into the gates of the P-channel MOS transistors P11, P13 of FIG. 30.

IWWLSRC determines the magnitude of the write current to be passed through the write word lines WWL-i, WWL1-i, WWL2-i.

The IWWLSRC generation circuit comprises a constant-current source Iwsrce, P-channel MOS transistors P7, P8, and N-channel MOS transistors N4, N5.

The MOS transistors N4, N5 constitute a current mirror circuit. Since a write signal WRITE turns to "H", and a reversed signal bWRITE of the write signal WRITE turns to "L" at the write time, the current flows through a current path comprising the MOS transistors P7, P8, N5 to produce IWWLSRC.

FIG. 33 shows an example of an IWBLSRC generation circuit which produces IWBLSRC to be input into the gates of the P-channel MOS transistors P3, P5 of FIG. 31.

IWBLSRC determines the magnitude of the write current to be passed through the write/read bit line WBL-j/RBL-j.

The IWWLSRC generation circuit comprises a constant-current source Ibsrce, P-channel MOS transistors P9, P10, and N-channel MOS transistors N6, N7.

The MOS transistors N6, N7 constitute a current mirror circuit. Since a write signal WRITE turns to "H", and a reversed signal bWRITE of the write signal WRITE turns to "L" at the write time, the current flows through a current path comprising the MOS transistors P9, P10, N7 to produce IWBLSRC.

[4] Iwsrce, Ibsrce Generation Circuit

Figure 39:
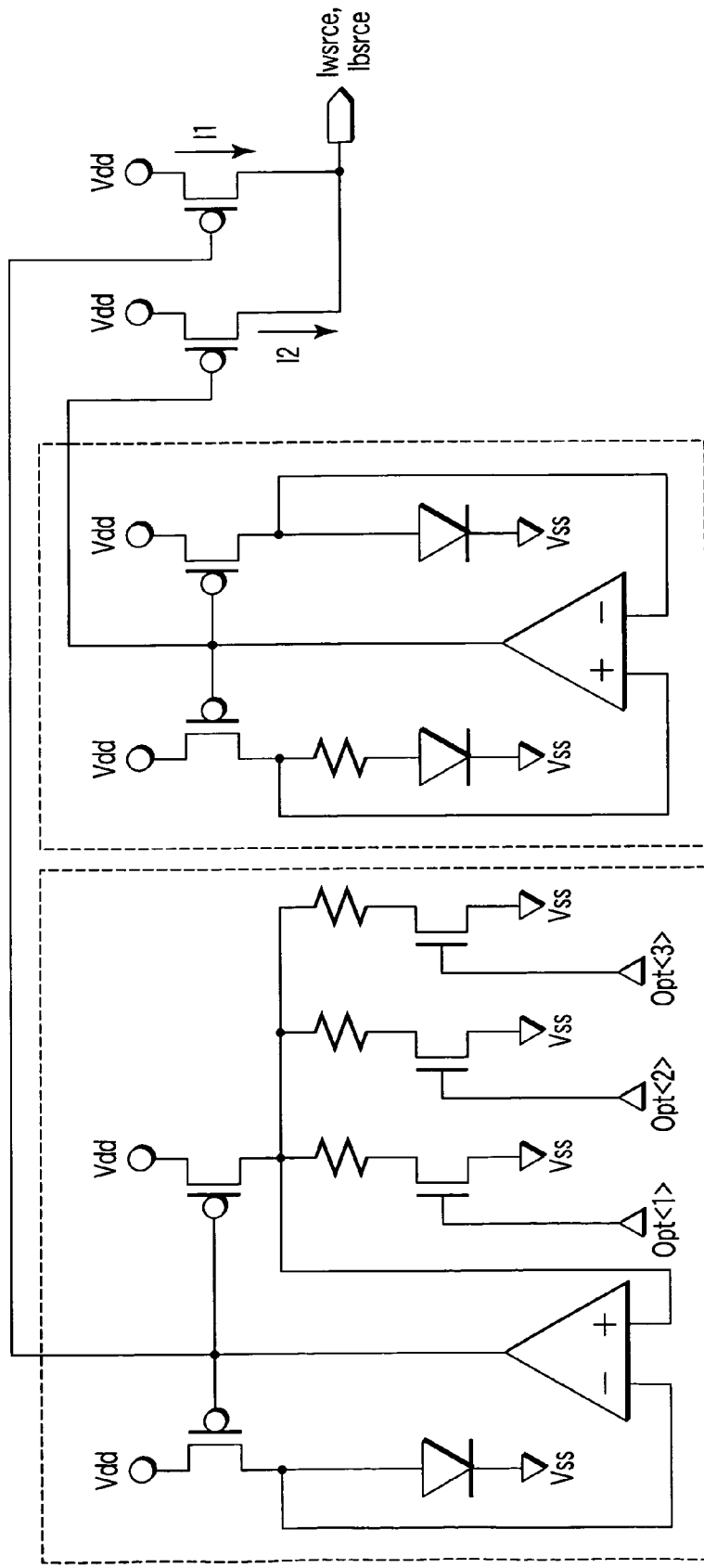
FIG. 39 is a circuit diagram showing an example of Iwsrc, Ibsrce generation circuit.

FIG. 39 shows a circuit example of the constant-current sources Iwsrc, Ibsrce for use in the circuits of FIGS. 32 and 33.

The IWWLSRC, IWBLSRC generation circuits of FIGS. 32 and 33 are preferably constituted to have a dependence on temperature such that the write current decreases with a temperature rise without depending on any power potential.

In this case, the constant-current sources Iwsrce, Ibsrce are constituted, for example, using a BGR circuit shown in FIG. 39.

In this BGR circuit, a current component I1 decreases with the temperature rise, and a current component I2 increases with the temperature rise. Both the current components I1, I2 are added up to produce Iwsrce, Ibsrce. The current component I1 can be adjusted by Opt<1>, Opt<2>, Opt<3>.

It is to be noted that the BGR circuit is described, for example, in "H. Banba, et. al. "A CMOS Bandgap Reference Circuit with Sub-1-V Operation", IEEE Solid State Circuits, Vol. 34, No. 5, pp. 670 to 674".

Output signals Iwsrce, Ibsrce of the BGR circuit are amplified by the current mirror circuit shown in FIGS. 32 and 33 to produce IWWLSRC, IWBLSRC which have the dependence on temperature.

Here, the BGR circuits of FIG. 39 may be disposed individually for the circuits of FIGS. 32 and 33, or only one circuit may also be disposed in common in these circuits.

[5] Description of Operation

Figure 34:
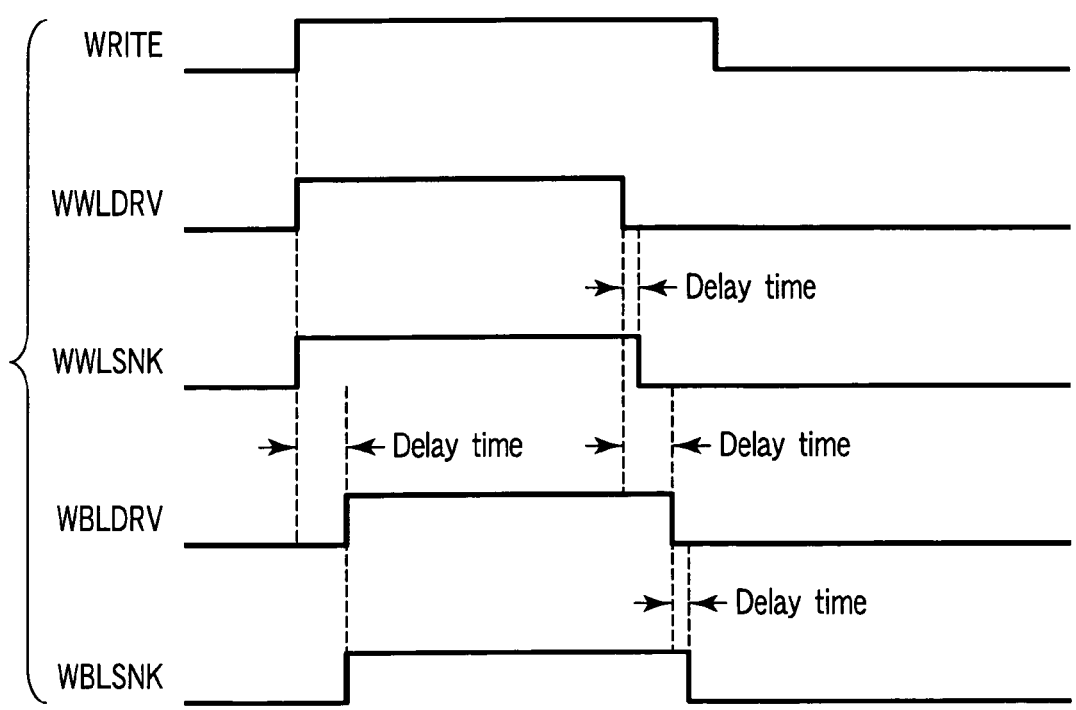
FIG. 34 is a waveform diagram showing a signal waveform at the write time.

FIG. 34 shows timing waveforms of control signals for use in the driver/sinker of FIGS. 30 and 31.

For example, to realize the write procedure shown in FIGS. 11 to 16, the control signals for use in the drivers/sinkers of FIGS. 31 and 32 are changed at the following timings.

When the write signal WRITE turns to "H" in a write mode, first the write word line driving signal WWLDRV and write word line sink signal WWLSNK are set to "H", and the write currents are passed through the write word lines WWL-i, WWL1-i, WWL2-i.

Thereafter, when a constant delay time elapses, the write bit line driving signal WBLDRV and write bit line sink signal WBLSNK are set to "H", and the write current is passed through the write/read bit line WBL-j/RBL-j.

The write word line driving signal WWLDRV and write word line sink signal WWLSNK are set to "L", and the write currents flowing through the write word lines WWL-i, WWL1-i, WWL2-i are interrupted.

Moreover, after the write word line driving signal WWLDRV turns to "L", and a constant delay time elapses, the write bit line driving signal WBLDRV is set to "L". The write bit line driving signal WBLDRV and write bit line sink signal WBLSNK are set to "L", the write current flowing through the write/read bit line WBL-j/RBL-j is interrupted.

Here, to interrupt the write current, when the constant delay time elapses after setting the write word line driving signal WWLDRV to "L", the write word line sink signal WWLSNK is set to "L". Similarly, when the constant delay time elapses after setting the write bit line driving signal WBLDRV to "L", the write bit line sink signal WBLSNK is set to "L".

When a period of WWLDRV="L", WWLSNK="H" is disposed with respect to the write word lines WWL-i, WWL1-i, WWL2-i, the write word lines WWL-i, WWL1-i, WWL2-i can be reset to the ground potential.

Moreover, when a period of WBLDRV="L", WBLSNK="H" is disposed with respect to the write/read bit line WBL-j/RBL-j, the write/read bit line WBL-j/RBL-j can be reset to the ground potential.

Next, the directions of the write currents flowing through the write word lines WWL-i, WWL1-i, WWL2-i and write/read bit line WBL-j/RBL-j will be studied with reference to FIGS. 30 and 31.

Here, an example is considered in which the data is independently written in the MTJ elements MTJ1, MTJ2 in the structure of FIGS. 5 and 6, or FIGS. 17 and 18.

Write with Respect to MTJ Element MTJ1

In the toggle write mode, first the data of the MTJ element MTJ1 which is the write object is read, and it is judged whether or not the data matches the write data. When both the data match each other, the data is not written. The data is written only when both the data do not match.

When both the data do not match, the write current is passed, and the state of the MTJ element MTJ1 is changed to the parallel state from the anti-parallel state or to the anti-parallel state from the parallel state.

In the write with respect to the MTJ element MTJ1, the control signal UP turns to "L", and the control signal DN turns to "H".

When the write word line driving signal WWLDRV and write word line sink signal WWLSNK turn to "H", the write currents directed to the write word line sinker 24 from the write word line drivers 22, 22UP, 22DN flow through the write word lines WWL-i, WWL1-i, WWL2-i.

Moreover, when the write bit line driving signal WBLDRV and write bit line sink signal WBLSNK turn to "H", the output signal of a NAND gate circuit ND3 turns to "L", and the output signal of an AND gate circuit AD1 turns to "H".

Therefore, the write current directed to the write bit line driver/sinker 26A from the write bit line driver/sinker 26B flows through the write/read bit line WBL-j/RBL-j.

Write with Respect to MTJ Element MTJ2

In the same manner as in the write with respect to the MTJ element MTJ1, first the data of the MTJ element MTJ2 which is the write object is read, and it is judged whether or not the data matches the write data. When both the data do not match, the write current is passed, and the state of the MTJ element MTJ2 is changed to the parallel state from the anti-parallel state or to the anti-parallel state from the parallel state.

In the write with respect to the MTJ element MTJ2, the control signal UP turns to "H", and the control signal DN turns to "L".

When the write word line driving signal WWLDRV and write word line sink signal WWLSNK turn to "H", the write currents directed to the write word line sinker 24 from the write word line drivers 22, 22UP, 22DN flow through the write word lines WWL-i, WWL1-i, WWL2-i.

Moreover, when the write bit line driving signal WBLDRV and write bit line sink signal WBLSNK turn to "H", the output signal of a NAND gate circuit ND2 turns to "L", and the output signal of an AND gate circuit AD2 turns to "H".

Therefore, the write current directed to the write bit line driver/sinker 26B from the write bit line driver/sinker 26A flows through the write/read bit line WBL-j/RBL-j.

It is to be noted that it is determined whether to select the MTJ element MTJ1 of the lower part or the MTJ element MTJ2 of the upper part, for example, using a lowermost bit of a row address signal.

When the value of the lowermost bit of the row address signal is "L", for example, the MTJ element MTJ1 is selected. At this time, the control signal UP turns to "L", and the control signal DN turns to "H". When the value of the lowermost bit of the row address signal is "H", for example, the MTJ element MTJ2 is selected. At this time, the control signal UP turns to "H", and the control signal DN turns to "L".

In the second embodiment (FIGS. 17 to 19), four MTJ elements MTJ1, MTJ2, MTJ3, MTJ4 are stacked. Therefore, for example, lowermost two bits of the row address signal are used in selecting the MTJ element.

When the values of the lowermost two bits of the row address signal are "L", "L", for example, the MTJ element MTJ1 is selected. At this time, the control signal UP turns to "L", and the control signal DN turns to "H". When the values of the lowermost two bits of the row address signal are "H", "L", for example, the MTJ element MTJ2 is selected. At this time, the control signal UP turns to "H", and the control signal DN turns to "L".

When the values of the lowermost two bits of the row address signal are "H", "L", for example, the MTJ element MTJ3 is selected. At this time, the control signal UP turns to "H", and the control signal DN turns to "L". When the values of the lowermost two bits of the row address signal are "H", "H", for example, the MTJ element MTJ4 is selected. At this time, the control signal UP turns to "L", and the control signal DN turns to "H".

When the direction of the write current to be passed through the write word/bit line is controlled in accordance with the position of the selected MTJ element, the data can be written independently into a plurality of MTJ elements stacked on the intersecting portion of two write lines using a so-called toggle write mode.

(3) Write Circuit for Use in Memory of Third Embodiment

Next, an example of the write circuit for use in the memory of the third embodiment will be described.

[1] Write Word Line Driver/Sinker

FIG. 35 shows an example of a write word line driver/sinker.

In the third embodiment, as shown in FIGS. 20 to 22, four MTJ elements MTJ1, MTJ2, MTJ3, MTJ4 are disposed in the intersecting portion of two write lines, and easy axes of magnetizations of these four MTJ elements MTJ1, MTJ2, MTJ3, MTJ4 are arranged at an interval of 45°. Therefore, a function of changing the magnitude and direction of the write current to be passed through the write word line in accordance with the position of the cell which is the write object at the write time is required for the write word line driver/sinker.

P-channel MOS transistors P11, P12 and N-channel MOS transistor N8 are connected in series between a power terminal (power potential Vdd) and ground terminal (ground potential Vss). Moreover, one end of the write word line WWL-i is connected to a connection point of the MOS transistors P12, N8.

IWSRC is input into the gate of the MOS transistor P11.

A NAND gate circuit ND4 (21) receives an upper row address signal, write word line driving signal WDRV, and a control signal RGT indicating the position of the cell constituting the write object, and an output signal is input into the gate of the MOS transistor P12.

An AND gate circuit AD3 (21) receives an upper row address signal, write word line sink signal WSNK, and a control signal LFT indicating the position of the cell constituting the write object, and an output signal is input into the gate of the MOS transistor N8.

P-channel MOS transistors P13, P14 and N-channel MOS transistor N9 are connected in series between the power terminal (power potential Vdd) and the ground terminal (ground potential Vss). Moreover, the other end of the write word line WWL-i is connected to a connection point of MOS transistors P14, N9.

IWSRC is input into the gate of the MOS transistor P13.

A NAND gate circuit ND5 (21) receives an upper row address signal, write word line driving signal WDRV, and control signal LFT indicating the position of the cell constituting the write object, and an output signal is input into the gate of the MOS transistor P14.

An AND gate circuit AD4 (21) receives an upper row address signal, write word line sink signal WSNK, and control signal RGT indicating the position of the cell constituting the write object, and an output signal is input into the gate of the MOS transistor N9.

For example, the control signal RGT turns to "H", when the MTJ elements MTJ1, MTJ2 are selected, and turns to "L", when the MTJ elements MTJ3, MTJ4 are selected. For example, the control signal LFT turns to "H", when the MTJ elements MTJ3, MTJ4 are selected, and turns to "L", when the MTJ elements MTJ1, MTJ2 are selected.

At the write time, the write word line driving signal WDRV and write word line sink signal WSNK turn to "H", and all bits of the upper row address signal turn to "H" in a selected row.

Therefore, when biases IWSRC are supplied to the gates of the MOS transistors P11, P13, the write currents having magnitudes in accordance with the values of the biases IWSRC and having directions in accordance with the control signals RGT, LFT indicating the positions of the cells constituting the write objects can be passed through the write word line WWL-i.

[2] Write Bit Line Driver/Sinker

FIG. 36 shows an example of a write bit line driver/sinker.

In the same manner as in the write word line driver/sinker, a function of changing the magnitude and direction of the write current to be passed through the write word line in accordance with the position of the cell which is the write object at the write time is required for the write bit line driver/sinker.

P-channel MOS transistors P15, P16 and N-channel MOS transistor N10 are connected in series between a power terminal (power potential Vdd) and ground terminal (ground potential Vss). Moreover, one end of the write/read bit line WBL-j/RBL-j is connected to a connection point of the MOS transistors P16, N10.

IBSRC is input into the gate of the MOS transistor P15.

A NAND gate circuit ND6 (25A) receives a column address signal, write bit line driving signal BDRV, and control signal UP indicating the position of the cell constituting the write object, and an output signal is input into the gate of the MOS transistor P16.

An AND gate circuit AD5 (25A) receives a column address signal, write bit line sink signal BSNK, and control signal DN indicating the position of the cell constituting the write object, and an output signal is input into the gate of the MOS transistor N10.

P-channel MOS transistors P17, P18 and N-channel MOS transistor N11 are connected in series between the power terminal (power potential Vdd) and the ground terminal (ground potential Vss). Moreover, the other end of the write/read bit line WBL-j/RBL-j is connected to a connection point of MOS transistors P18, N11.

IBSRC is input into the gate of the MOS transistor P17.

A NAND gate circuit ND7 (25B) receives a column address signal, write bit line driving signal BDRV, and control signal DN indicating the position of the cell constituting the write object, and an output signal is input into the gate of the MOS transistor P18.

An AND gate circuit AD6 (25B) receives a column address signal, write bit line sink signal BSNK, and control signal UP indicating the position of the cell constituting the write object, and an output signal is input into the gate of the MOS transistor N11.

For example, the control signal UP turns to "H", when the MTJ elements MTJ2, MTJ4 are selected, and turns to "L", when the MTJ elements MTJ1, MTJ3 are selected. For example, the control signal DN turns to "H", when the MTJ elements MTJ1, MTJ3 are selected, and turns to "L", when the MTJ elements MTJ2, MTJ4 are selected.

At the write time, the write bit line driving signal BDRV and write bit line sink signal BSNK turn to "H", and all bits of the column address signal turn to "H" in a selected column.

Therefore, when biases IBSRC are supplied to the gates of the MOS transistors P15, P17, the write currents having magnitudes in accordance with the values of the biases IBSRC and having directions in accordance with the control signals UP, DN indicating the positions of the cells constituting the write objects can be passed through the write/read bit line WBL-j/RBL-j.

[3] IWSRC, IBSRC Generation Circuit

Figure 37:
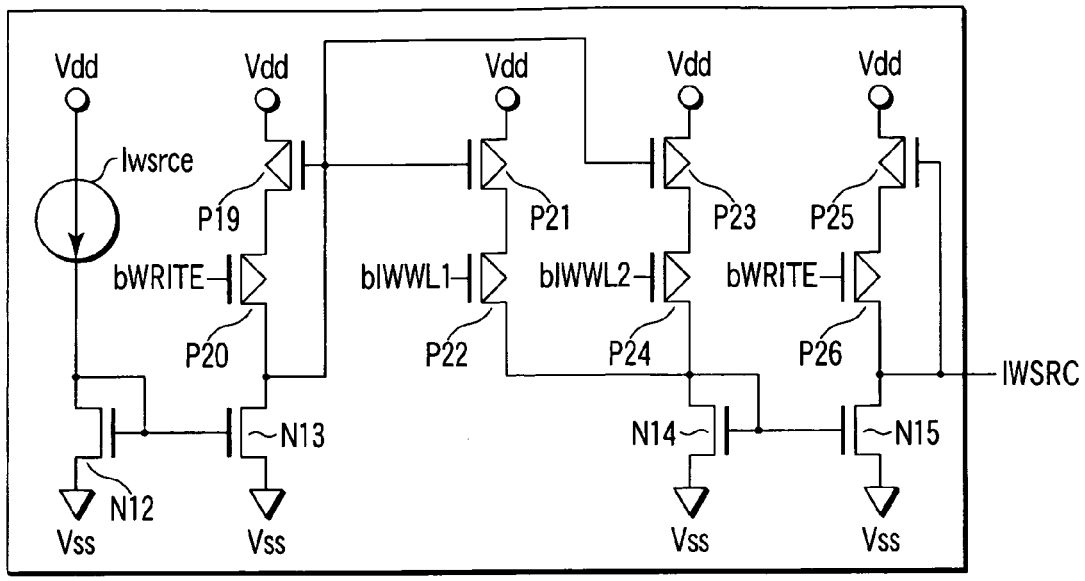
FIG. 37 is a circuit diagram showing an example of an IWSRC generation circuit.

FIG. 37 shows an example of an IWSRC generation circuit which produces IWSRC to be input into the gates of the P-channel MOS transistors P11, P13 of FIG. 35.

IWSRC determines the magnitude of the write current to be passed through the write word line WWL-i.

The IWSRC generation circuit comprises a constant-current source Iwsrce, P-channel MOS transistors P19 to P26, and N-channel MOS transistors N12 to N15.

The MOS transistors N12, N13 constitute a current mirror circuit, and the MOS transistors N14, N15 constitute a current mirror circuit.

Since a write signal WRITE turns to "H", and a reversed signal bWRITE of the write signal WRITE turns to "L" at the write time, currents flow through a current path comprising MOS transistors P19, P20, N13 and a current path comprising MOS transistors P25, P26, N15 to produce IWSRC.

While bIWWL1 is input into the gate of the MOS transistor P22, bIWWL2 is input into the gate of the MOS transistor P24. When timings of bWWL1, bWWL2 are controlled, for example, two types of IWSRC can be produced.

Figure 38:
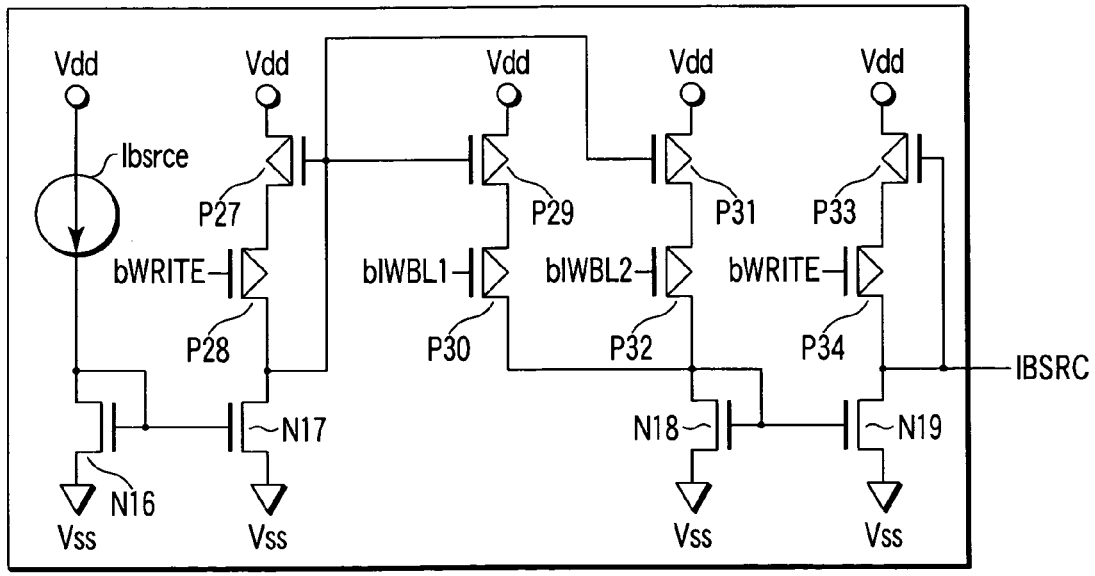
FIG. 38 is a circuit diagram showing an example of an IBSRC generation circuit.

FIG. 38 shows an example of an IBSRC generation circuit which produces IBSRC to be input into the gates of the P-channel MOS transistors P15, P17 of FIG. 36.

IBSRC determines the magnitude of the write current to be passed through the write/read bit line WBL-j/RBL-j.

The IBSRC generation circuit comprises a constant-current source Ibsrce, P-channel MOS transistors P27 to P34, and N-channel MOS transistors N16 to N19.

The MOS transistors N16, N17 constitute a current mirror circuit, and the MOS transistors N18, N19 constitute a current mirror circuit.

Since the write signal WRITE turns to "H", and the reversed signal bWRITE of the write signal WRITE turns to "L" at the write time, the currents flow through the current path comprising the MOS transistors P27, P28, N17 and the current path comprising the MOS transistors P33, P34, N19 to produce IBSRC.

While bIWBL1 is input into the gate of the MOS transistor P30, bIWBL2 is input into the gate of the MOS transistor P32. When the timings of bWBL1, bWBL2 are controlled, for example, two types of IBSRC can be produced.

[4] Iwsrce, Ibsrce Generation Circuit

FIG. 39 shows a circuit example of constant-current sources Iwsrce, Ibsrce for use in the circuits of FIGS. 37 and 38.

The IWSRC, IBSRC generation circuits of FIGS. 37 and 38 are preferably constituted to have a dependence on temperature such that the write current decreases with a temperature rise without depending on any power potential.

In this case, the constant-current sources Iwsrce, Ibsrce are constituted, for example, using the BGR circuit shown in FIG. 39.

In this BGR circuit, a current component I1 decreases with the temperature rise, and a current component I2 increases with the temperature rise. Both the current components I1, I2 are added up to produce Iwsrce, Ibsrce. The current component I1 can be adjusted by Opt<1>, Opt<2>, Opt<3>.

Output signals Iwsrce, Ibsrce of the BGR circuit are amplified by the current mirror circuits shown in FIGS. 37 and 38 to produce IWSRC, IBSRC which have the dependence on temperature.

Here, the BGR circuits of FIG. 39 may be disposed individually for the circuits of FIGS. 37 and 38, or only one circuit may also be disposed in common in these circuits.

[5] Description of Operation

FIGS. 40 and 41 show timing waveforms of control signals for use in the drivers/sinkers of FIGS. 35 and 36.

In the third embodiment (FIGS. 20 to 22), the easy axes of magnetizations of four stacked MTJ elements are disposed at an interval of 45° (=180°/4). Moreover, for example, as shown in FIGS. 23 and 24, the magnetic field is produced in accordance with the position of the MTJ element in the write.

Additionally, the magnetic field can be represented by vectors. That is, the magnetic field produced by the current flowing through the write word line can be synthesized with the magnetic field produced by the current flowing through the write bit line to freely set the magnitude and direction of the magnetic field which acts on the MTJ element.

Therefore, when a ratio of the current flowing through the write word/bit line is controlled, the data can be written independently into four MTJ elements stacked in the intersecting portion of the write word/bit line.

For example, the write into the MTJ element MTJ1 shown in FIG. 23 is considered. The magnetic fields a, b need to be produced in the write with respect to the MTJ element MTJ1.

Here, the magnetic field a forms an angle of 22.5° (=90°/4) with respect to a direction in which the write bit line WBL extends.

Therefore, to produce the magnetic field a, a ratio (A/B) of a current to be passed through the write word line WWL (magnetic field in a direction parallel to the write bit line WBL) A to a current to be passed through the write bit line WBL (magnetic field in a direction parallel to the write word line WWL) B may be set to tan 22.5°.

Moreover, the magnetic field b forms an angle of 67.5° (=90°×3/4) with respect to the direction in which the write bit line WBL extends.

Therefore, to produce the magnetic field b, the ratio (A/B) of the current to be passed through the write word line WWL (magnetic field in the direction parallel to the write bit line WBL) A to the current to be passed through the write bit line WBL (magnetic field in the direction parallel to the write word line WWL) B may be set to tan 67.5°.

It is to be noted that the magnitude and direction of the write current supplied to the write word line WWL and write bit line WBL are determined based on the values of the control signals UP, DN, RGT, LFT indicating the positions of the MTJ elements which are the write objects to produce the magnetic fields, for example, shown in FIGS. 23 to 26.

(4) Read Circuit

[1] Outline

Next, an example of a read circuit usable in the memories of the first to third embodiments will be described.

Data read is indispensable for the memory.

Moreover, with the use of the toggle write mode, it cannot be determined whether to change the state of the MTJ element a. to a parallel state from an anti-parallel state or b. to the anti-parallel state from the parallel state by the direction of the write current to be passed through the write word/bit line.

That is, when the data is written, the MTJ element in the anti-parallel state changes to the parallel state, and the MTJ element in the parallel state changes to the anti-parallel state.

As described above, when the toggle write mode is used, an operation for confirming the state (anti-parallel or parallel state) of the MTJ element constituting the write object is first required prior to the write. To confirm this, a read operation is performed.

When the data of the MTJ element constituting the write object is the same as the write data as a result of the read, the data is not written into the MTJ element. Only when both the data are different from each other, the data is written into the MTJ element.

Here, the equivalent circuit needs to be devised in reading the data from a plurality of MTJ elements stacked on the semiconductor substrate and connected in series to one another. That is, when these MTJ elements have an equal resistance value in the parallel/anti-parallel state, the state of each of the MTJ elements cannot be specified.

To solve the problem, in the present example, for example, a difference is made between the resistance values in the parallel/anti-parallel state with respect to the MTJ elements connected in series, and this makes possible the data read with respect to each of the MTJ elements.

For example, when four MTJ elements MTJ1, MTJ2, MTJ3, MTJ4 are connected in series between the write word line WWL-i and the write/read bit line WBL-j/RBL-j as shown in FIG. 29, a ratio of the resistance value of four MTJ elements in the parallel state is increased every twice.

Concretely, assuming that the resistance value of the MTJ element MTJ1 in the parallel state is R, the resistance value of the MTJ element MTJ2 in the parallel state is set to 2×R, the resistance value of the MTJ element MTJ3 in the parallel state is set to 4×R, and the resistance value of the MTJ element MTJ4 in the parallel state is set to 8×R.

It is to be noted that combinations of four MTJ elements MTJ1, MTJ2, MTJ3, MTJ4 with the resistance values are not limited to the above-described example, and one may be selected from 24 combinations.

[2] Structure of MTJ Element

Next, a structural example for making the difference of the resistance value of the MTJ element will be described.

As a method of disposing the resistance difference in the MTJ elements connected in series, a method is considered in which an area ratio of the MTJ elements is changed. There is another method in which a thickness of a tunnel barrier is changed.

Separately from these methods, in the present example, an MTJ unit having an equal area and identical structure is considered, and n MTJ units are stacked in series to form an MTJ element.

Moreover, the resistance ratio of the MTJ elements connected in series is realized, when the number n of MTJ units constituting the MTJ elements is changed.

Figure 42:
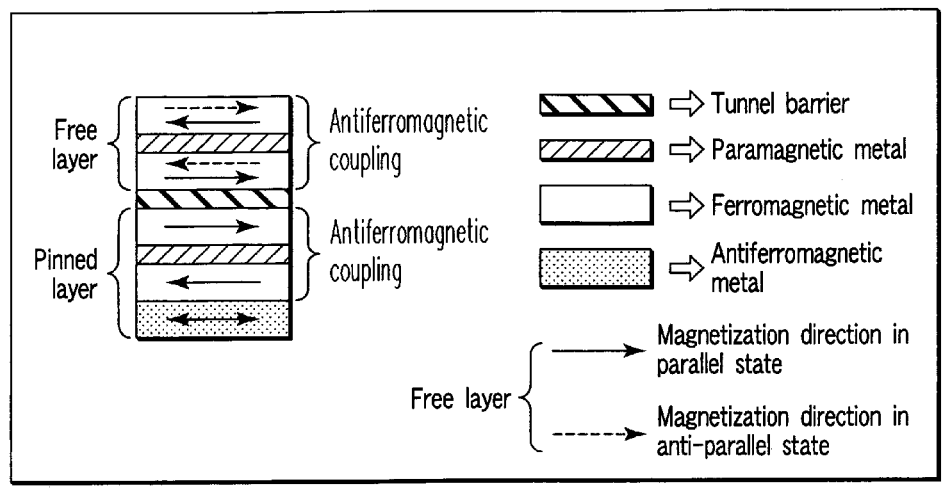
FIG. 42 is a diagram showing a structural example of the MTJ element.

FIG. 42 shows a structural example of the MTJ element MTJ1.

The MTJ element MTJ1 comprises an MTJ unit to constitute a single junction type MTJ element including a tunnel barrier layer.

Figure 43:
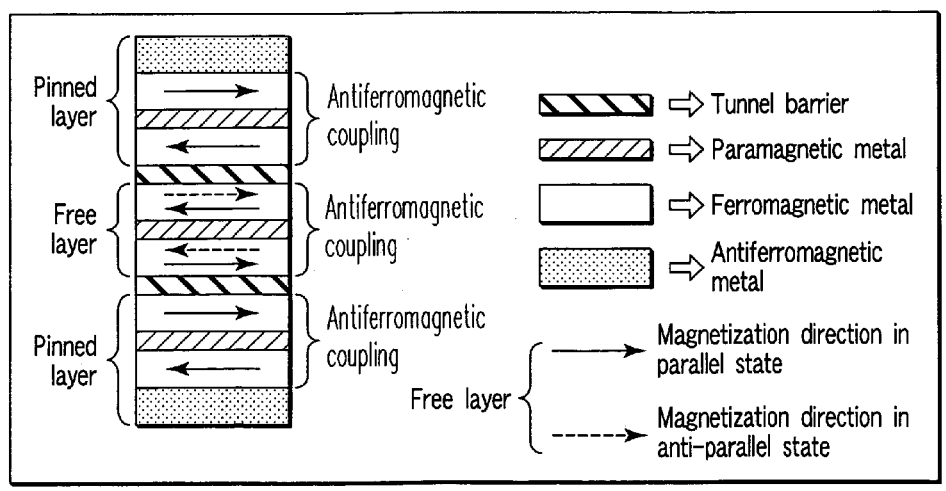
FIG. 43 is a diagram showing a structural example of the MTJ element.

FIG. 43 shows a structural example of the MTJ element MTJ2.

The MTJ element MTJ2 comprises two MTJ units to constitute a double junction type MTJ element including two tunnel barrier layers. In the present example, a storage layer is shared by two MTJ units.

Assuming that the resistance value of the MTJ element MTJ1 in the parallel state is R, the resistance value of the MTJ element MTJ2 in the parallel state is 2×R.

Figure 44:
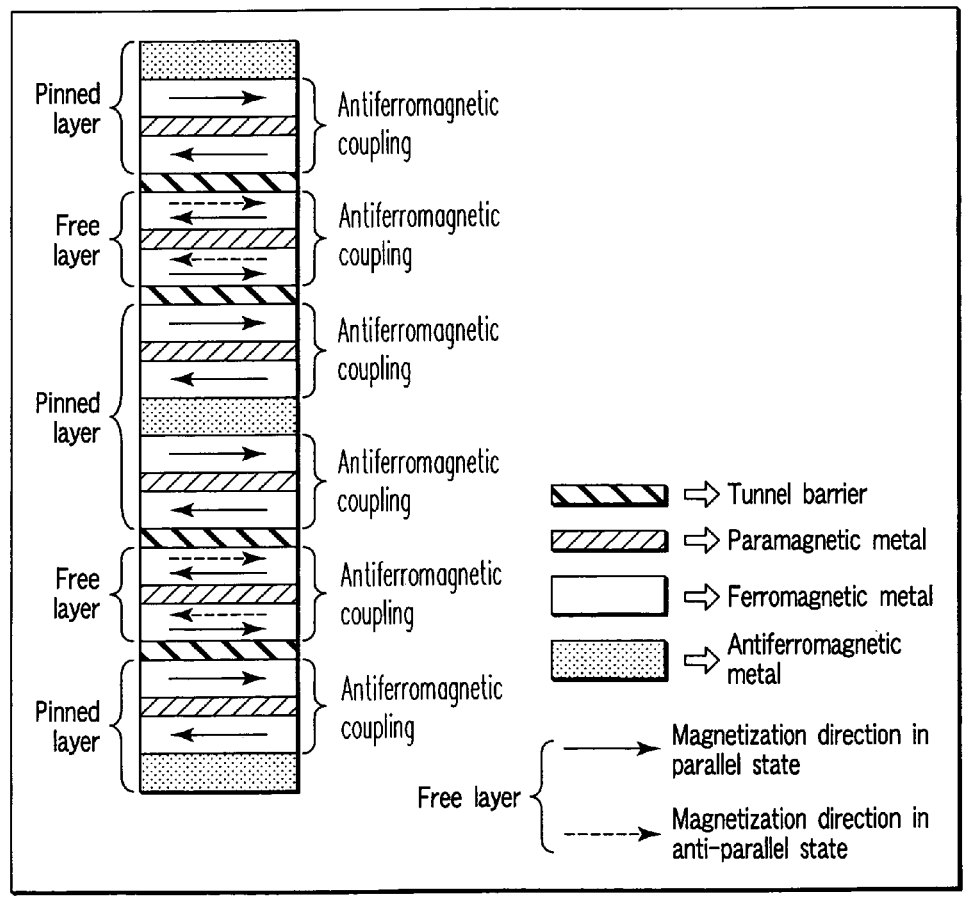
FIG. 44 is a diagram showing a structural example of the MTJ element.

FIG. 44 shows a structural example of the MTJ element MTJ3.

The MTJ element MTJ3 comprises four MTJ units to constitute a quadruple junction type MTJ element including four tunnel barrier layers. In the present example, two double junction type MTJ elements are stacked.

Assuming that the resistance value of the MTJ element MTJ1 in the parallel state is R, the resistance value of the MTJ element MTJ3 in the parallel state is 4×R.

Figure 45:
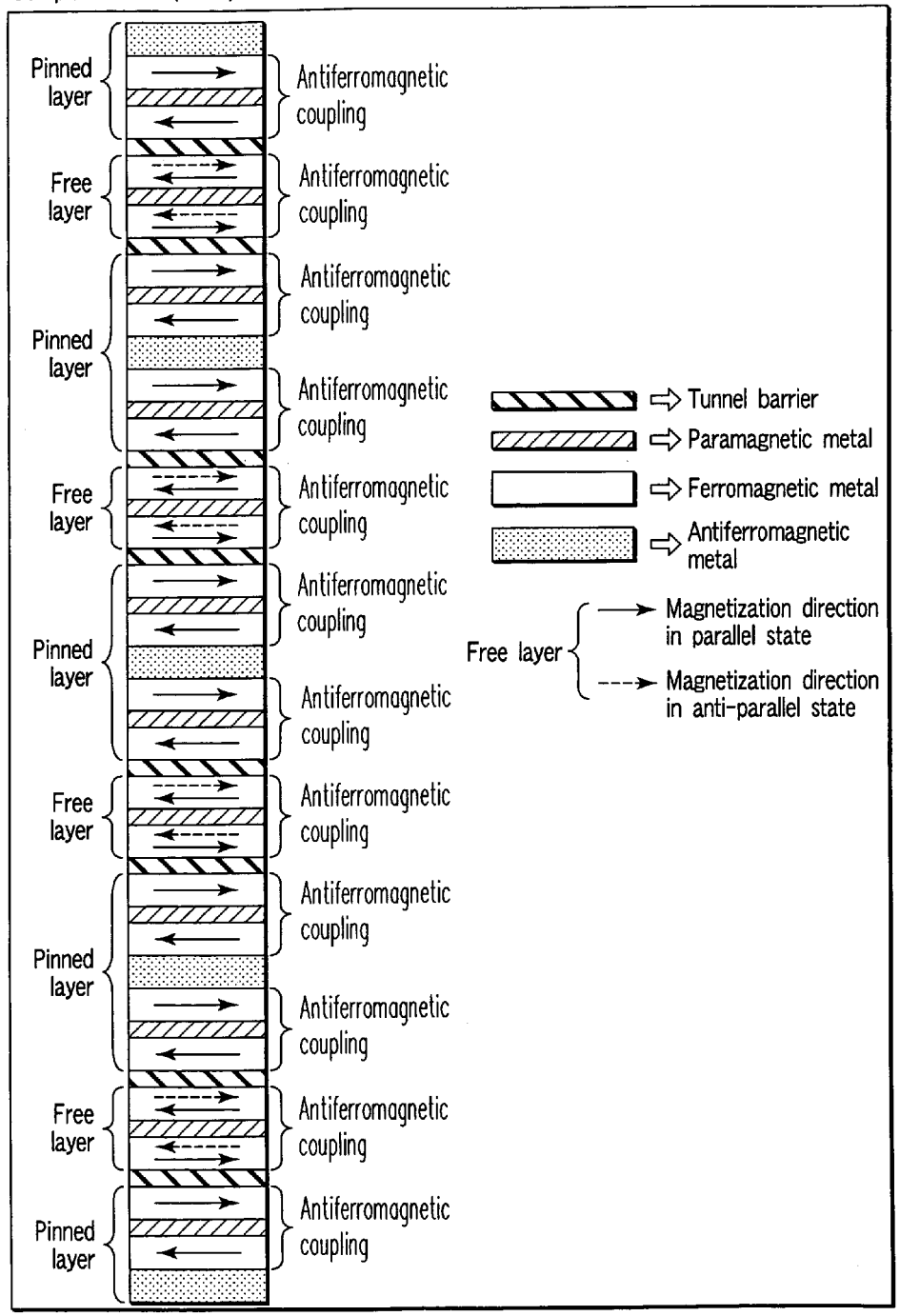
FIG. 45 is a diagram showing a structural example of the MTJ element.

FIG. 45 shows a structural example of the MTJ element MTJ4.

The MTJ element MTJ4 comprises eight MTJ units to constitute an octuple junction type MTJ element including eight tunnel barrier layers. In the present example, two quadruple junction type MTJ elements are stacked.

Assuming that the resistance value of the MTJ element MTJ1 in the parallel state is R, the resistance value of the MTJ element MTJ4 in the parallel state is 8×R.

According to the structure of the MTJ element, since fluctuation of a magneto resistive effect by a demagnetizing field of the storage layer is not generated, reliability of the read can be enhanced.

[3] Read Word Line Driver

Figure 46:
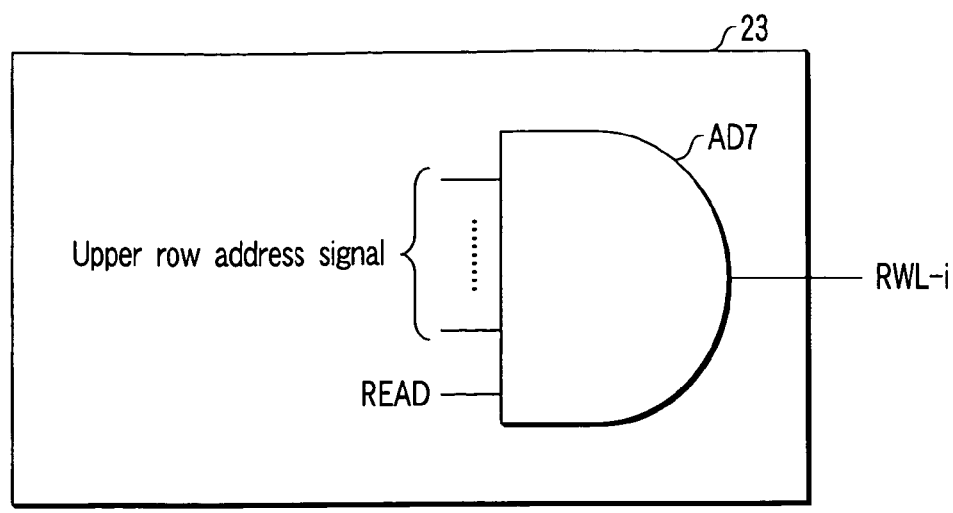
FIG. 46 is a circuit diagram showing an example of a read word line driver.

FIG. 46 shows a circuit example of a read word line driver.

A read word line driver 23 comprises, for example, an AND gate circuit AD7. The AND gate circuit AD7 receives an upper row address signal and a read signal READ, and the output signal is supplied to a read word line RWL-i.

When the read signal READ turns to "H" at a read time, all bits of the upper row address signal turn to "H" in a selected row. Therefore, a potential level of the read word line RWL-i also turns to "H", and a read current flows through the MTJ element connected to the read word line RWL-i.

[4] Column Selection Line Driver

Figure 47:
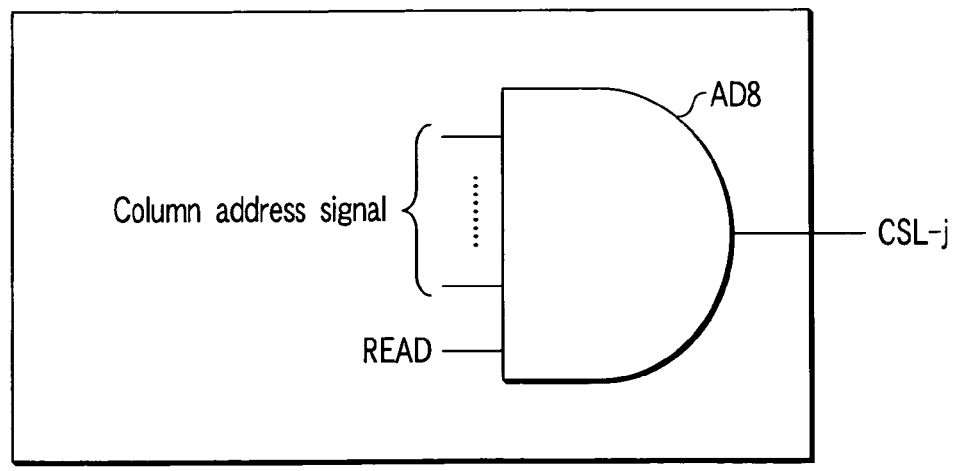
FIG. 47 is a circuit diagram showing an example of a column selection line driver.

FIG. 47 shows a circuit example of a column selection line driver.

The column selection line driver comprises, for example, an AND gate circuit AD8. The AND gate circuit AD8 receives a column address signal and a read signal READ, and the output signal is supplied to a column selection switch via a column selection line CSL-j.

When the read signal READ turns to "H" at a read time, all bits of the column address signal turn to "H" in a selected column. Therefore, a potential level of the column selection line CSL-j turns to "H".

Accordingly, the column selection switch connected to the column selection line CSL-j is brought into an on-state, and a write/read bit line WBL-j/RBL-j in the selected column is electrically connected to the read circuit.

[5] Read Circuit

Circuit Example

Figure 48:
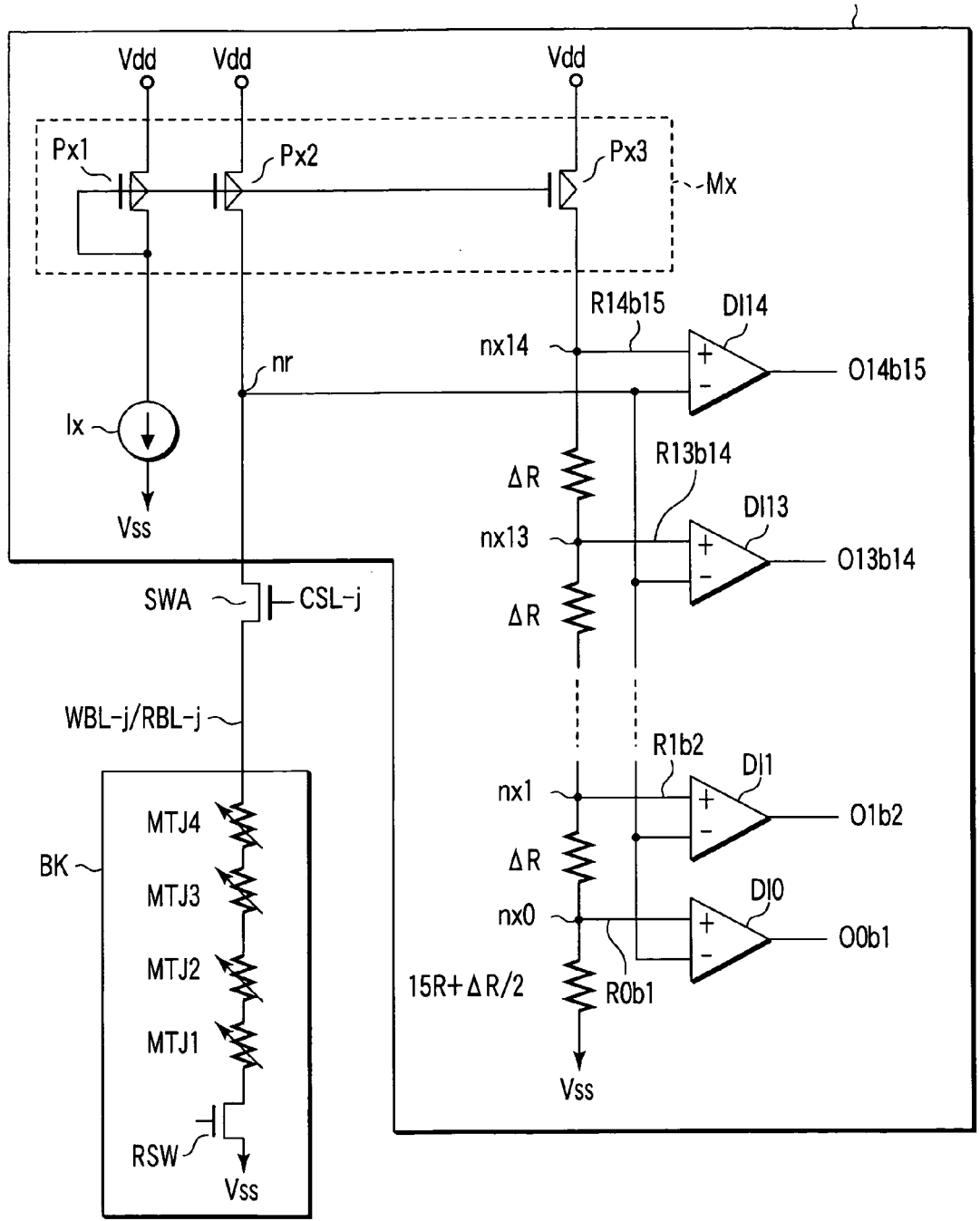
FIG. 48 is a circuit diagram showing an example of a read circuit.

FIG. 48 shows a circuit example of the read circuit.

A read circuit 27 comprises an analog/digital converter (A/D converter) which is a sense amplifier.

For example, as described in the example of the cell array structure of FIG. 29, a block BK comprises four MTJ elements MTJ1, MTJ2, MTJ3, MTJ4 connected in series and a read selection switch RSW.

One end of a write/read bit line WBL-j/RBL-j is connected to the block BK, and the other end is connected to a power terminal (power potential Vdd) via a column selection switch (N-channel MOS transistor) SWA and a P-channel MOS transistor Px2.

Here, a path extending to a ground terminal from the power terminal via the MOS transistors Px2, SWA and the MTJ elements MTJ1, MTJ2, MTJ3, MTJ4 is referred to as a first current path.

One end of 14 resistance elements having a resistance value ΔR is connected to the power terminal via a P-channel MOS transistor Px3, and the other end is connected to the ground terminal via a resistance element having a resistance value 15R+ΔR/2.

Here, a path extending to the ground terminal from the power terminal via the MOS transistors Px3 and (14+1) resistance elements is referred to as a second current path.

The P-channel MOS transistors Px1, Px2, Px3 constitute a current mirror circuit Mx. Therefore, a constant current produced by a constant-current source Ix flows through the first and second current paths.

The current flowing through the first current path constitutes a read current, and the read current flows through four MTJ elements MTJ1, MTJ2, MTJ3, MTJ4 connected in series.

As a result, a read potential Vtotal appears on a node nr in accordance with data values (synthesized resistance value) of the MTJ elements MTJ1, MTJ2, MTJ3, MTJ4 in the block BK. On the other hand, when the current flows through the second current path, predetermined reference potentials appear on connection points nx0, nx1, ... nx13, nx14 of the respective resistance elements.

Differential amplifiers DI0, DI2, ... DI13, DI14 compare the read potential Vtotal of the node nr with the predetermined reference potential, and output comparison results as output signals O0b1, O1b2, ... O13b14, O14b15.

For example, the reference potential of the node nx0 is input into a plus-side input terminal of the differential amplifier DI0, and the read potential Vtotal of the node nr is input into a minus-side input terminal. Similarly, the reference potential of the node nx1 is input into the plus-side input terminal of the differential amplifier DI1, and the read potential Vtotal of the node nr is input into the minus-side input terminal. The reference potential of the node nx14 is input into the plus-side input terminal of the differential amplifier DI14, and the read potential Vtotal of the node nr is input into the minus-side input terminal.

Read Principle

According to a read principle described below, the data of four MTJ elements MTJ1, MTJ2, MTJ3, MTJ4 in the block BK can be read at once.

The resistance values of the four MTJ elements MTJ1, MTJ2, MTJ3, MTJ4 in the block BK are set as shown in Table 1.

TABLE 1

Resistance value of MTJ element in block at read operation time

| Stored data | MTJ element | | | |
| --- | --- | --- | --- | --- |
| | MTJ1 | MTJ2 | MTJ3 | MTJ4 |
| "1" (parallel) | R | 2R | 4R | 8R |
| "0" (anti-parallel) | R + ΔR | 2R + 2ΔR | 4R + 4ΔR | 8R + 8ΔR |

That is, with respect to the MTJ element MTJ1, it is defined that the resistance value at a time when a magnetized state is parallel ("1"-state) is R, and the resistance value at a time when a magnetized state is anti-parallel ("0"-state) is R+ΔR.

Moreover, with respect to the MTJ element MTJ2, it is defined that the resistance value at a time when the magnetized state is parallel ("1"-state) is 2R, and the resistance value at a time when the magnetized state is anti-parallel ("0"-state) is 2R+2ΔR.

Furthermore, with respect to the MTJ element MTJ3, it is defined that the resistance value at a time when the magnetized state is parallel ("1"-state) is 4R, and the resistance value at a time when the magnetized state is anti-parallel ("0"-state) is 4R+4ΔR.

Additionally, with respect to the MTJ element MTJ4, it is defined that the resistance value at a time when the magnetized state is parallel ("1"-state) is 8R, and the resistance value at a time when the magnetized state is anti-parallel ("0"-state) is 8R+8ΔR.

At this time, relations between data of four MTJ elements MTJ1, MTJ2, MTJ3, MTJ4 in the block BK and synthesized resistance values are as shown in Table 2.

TABLE 2

Relation between data of MTJ element in block and synthesized resistance value

| | MTJ1 | MTJ2 | MTJ3 | MTJ4 | Synthesized resistance value Radd |
|---|---|---|---|---|---|
| | 1 | 1 | 1 | 1 | 15R |
| | 0 | 1 | 1 | 1 | 15R + ΔR |
| C1→ | | | | | |
| | 1 | 0 | 1 | 1 | 15R + 2ΔR |
| | 0 | 0 | 1 | 1 | 15R + 3ΔR |
| B1→ | | | | | |
| | 1 | 1 | 0 | 1 | 15R + 4ΔR |
| | 0 | 1 | 0 | 1 | 15R + 5ΔR |
| C2→ | | | | | |
| | 1 | 0 | 0 | 1 | 15R + 6ΔR |
| | 0 | 0 | 0 | 1 | 15R + 7ΔR |
| A→ | | | | | |
| | 1 | 1 | 1 | 0 | 15R + 8ΔR |
| | 0 | 1 | 1 | 0 | 15R + 9ΔR |
| C3→ | | | | | |
| | 1 | 0 | 1 | 0 | 15R + 10ΔR |
| | 0 | 0 | 1 | 0 | 15R + 11ΔR |
| B2→ | | | | | |
| | 1 | 1 | 0 | 0 | 15R + 12ΔR |
| | 0 | 1 | 0 | 0 | 15R + 13ΔR |
| C4→ | | | | | |
| | 1 | 0 | 0 | 0 | 15R + 14ΔR |
| | 0 | 0 | 0 | 0 | 15R + 15ΔR |

That is, there are 16 combinations of data values of four MTJ elements MTJ1, MTJ2, MTJ3, MTJ4 in the block BK, and there are also 16 synthesized resistance values in accordance with 16 combinations of the data values. A minimum value of the synthesized resistance value is 15R, and a maximum value is 15R+15ΔR. A difference of the synthesized resistance value is ΔR.

When the read circuit (current value I) is passed through four MTJ elements MTJ1, MTJ2, MTJ3, MTJ4 in the block BK, a potential of the write/read bit line WBL-j/RBL-j indicates a value in accordance with the synthesized resistance value of four MTJ elements MTJ1, MTJ2, MTJ3, MTJ4 in the block BK.

Assuming that the current value of the read current is I, the minimum value of the potential appearing on the write/read bit line WBL-j/RBL-j is I×(15R+r), and the maximum value is I×(15R+15ΔR+r). The difference of the potential appearing on the write/read bit line WBL-j/RBL-j is I×ΔR.

Here, r denotes an on-resistance of the read selection switch (MOS transistor) SWA. When the on-resistance r is designed to be sufficiently smaller than the synthesized resistance value of the MTJ elements MTJ1, MTJ2, MTJ3, MTJ4, this r may be ignored.

In the read operation principle of the present example, when the read current is passed through four MTJ elements MTJ1, MTJ2, MTJ3, MTJ4 in the block BK at the read time, the read potential Vtotal appears on the write/read bit line WBL-j/RBL-j in accordance with the combination of the data values of these MTJ elements MTJ1, MTJ2, MTJ3, MTJ4.

Therefore, when the read potential Vtotal is detected by a sense amplifier (e.g., analog/digital converter) shown in FIG. 48, the data of four MTJ elements MTJ1, MTJ2, MTJ3, MTJ4 in a read block can be read at once by a read operation.

Tables 3 and 4 show the synthesized resistance values of the MTJ elements MTJ1, MTJ2, MTJ3, MTJ4, concretely a principle for judging the data values of four MTJ elements MTJ1, MTJ2, MTJ3, MTJ4 in the block BK from the read potential Vtotal appearing on the write/read bit line WBL-j/RBL-j.

TABLE 3

Data judgment standard 1 of MTJ element in block

| | "1" (parallel) | "0" (anti-parallel) |
|---|---|---|
| MTJ4 | [1]Radd < 15R + 7ΔR + ΔR/2 | [2]Radd > 15R + 7ΔR + ΔR/2 |
| MTJ3 | In case of [1] | In case of [1] |
| | [3]Radd < 15R + 3ΔR + ΔR/2 | [4]Radd > 15R + 3ΔR + ΔR/2 |
| | In case of [2] | In case of [2] |
| | [5]Radd < 15R + 11ΔR + ΔR/2 | [6]Radd > 15R + 11ΔR + ΔR/2 |
| MTJ2 | In case of [3] | In case of [3] |
| | [7]Radd < 15R + ΔR + ΔR/2 | [8]Radd > 15R + ΔR + ΔR/2 |
| | In case of [4] | In case of [4] |
| | [9]Radd < 15R + 5ΔR + ΔR/2 | [10]Radd > 15R + 5ΔR + ΔR/2 |
| | In case of [5] | In case of [5] |
| | [11]Radd < 15R + 9ΔR + ΔR/2 | [12]Radd > 15R + 9ΔR + ΔR/2 |
| | In case of [6] | In case of [6] |
| | [13]Radd < 15R + 13ΔR + ΔR/2 | [14]Radd > 15R + 13ΔR + ΔR/2 |

TABLE 4

Data judgment standard 2 of MTJ element in block

| | "1" (parallel) | "0" (anti-parallel) |
|---|---|---|
| MTJ1 | In case of [7] | In case of [7] |
| | Radd < 15R + ΔR/2 | Radd > 15R + ΔR/2 |
| | In case of [8] | In case of [8] |
| | Radd < 15R + 2ΔR + ΔR/2 | Radd > 15R + 2ΔR + ΔR/2 |
| | In case of [9] | In case of [9] |
| | Radd < 15R + 4ΔR + ΔR/2 | Radd > 15R + 4ΔR + ΔR/2 |
| | In case of [10] | In case of [10] |
| | Radd < 15R + 16ΔR + ΔR/2 | Radd > 15R + 6ΔR + ΔR/2 |
| | In case of [11] | In case of [11] |
| | Radd < 15R + 8ΔR + ΔR/2 | Radd > 15R + 8ΔR + ΔR/2 |
| | In case of [12] | In case of [12] |
| | Radd < 15R + 10ΔR + ΔR/2 | Radd > 15R + 10ΔR + ΔR/2 |
| | In case of [13] | In case of [13] |
| | Radd < 15R + 12ΔR + ΔR/2 | Radd > 15R + 12ΔR + ΔR/2 |
| | In case of [14] | In case of [14] |
| | Radd < 15R + 14ΔR + ΔR/2 | Radd > 15R + 14ΔR + ΔR/2 |

In the read operation principle of the present example, first, when the magnetized state is the same (e.g., parallel), the data value of the MTJ element having a highest resistance value (MTJ element MTJ4, resistance value=8R in the present example) is judged by a predetermined judgment standard.

For example, in the present example, a threshold value $15R+7\Delta R+\Delta R/2$ is set, it is judged whether a synthesized resistance value Rtotal of four MTJ elements MTJ1, MTJ2, MTJ3, MTJ4 exceeds the threshold value or is less than the threshold value, and accordingly the data value of the MTJ element MTJ4 can be determined.

Next, when the magnetized state is the same (e.g., parallel), the data value of the MTJ element having a second high resistance value (MTJ element MTJ3, resistance value=4R in the present example) is judged by a predetermined judgment standard.

Here, the predetermined judgment standard changes by the data value of the MTJ element MTJ4.

For example, when the data value of the MTJ element MTJ4 is judged as "1", a threshold value $15R+3\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Moreover, when the data value of the MTJ element MTJ4 is judged as "0", a threshold value $15R+11\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

As described above, the data value of the MTJ element MTJ3 can be determined.

Next, when the magnetized state is the same (e.g., parallel), the data value of the MTJ element having a third high resistance value (MTJ element MTJ2, resistance value=2R in the present example) is judged by the predetermined judgment standard.

Here, the predetermined judgment standard changes by the data values of two MTJ elements MTJ4, MTJ3.

For example, when the data value of the MTJ element MTJ4 is judged as "1", and the data value of the MTJ element MTJ3 is judged as "1", a threshold value $15R+\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Moreover, when the data value of the MTJ element MTJ4 is judged as "1", and the data value of the MTJ element MTJ3 is judged as "0", a threshold value $15R+5\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Furthermore, when the data value of the MTJ element MTJ4 is judged as "0", and the data value of the MTJ element MTJ3 is judged as "1", a threshold value $15R+9\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Additionally, when the data value of the MTJ element MTJ4 is judged as "0", and the data value of the MTJ element MTJ3 is judged as "0", a threshold value $15R+13\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

As described above, the data value of the MTJ element MTJ2 can be determined.

Next, when the magnetized state is the same (e.g., parallel), the data value of the MTJ element having a lowest resistance value (MTJ element MTJ1, resistance value=R in the present example) is judged by the predetermined judgment standard.

Here, the predetermined judgment standard changes by the data values of three MTJ elements MTJ4, MTJ3, MTJ2.

For example, when the data value of the MTJ element MTJ4 is judged as "1", the data value of the MTJ element MTJ3 is judged as "1", and the data value of the MTJ element MTJ2 is judged as "1", a threshold value $15R+\Delta R/2$ is set, and it is judged whether the synthesized resistance value Rtotal of four MTJ elements MTJ1, MTJ2, MTJ3, MTJ4 exceeds the threshold value or is less than the threshold value.

Moreover, when the data value of the MTJ element MTJ4 is judged as "1", the data value of the MTJ element MTJ3 is judged as "1", and the data value of the MTJ element MTJ2 is judged as "0", a threshold value $15R+2\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Furthermore, when the data value of the MTJ element MTJ4 is judged as "1", the data value of the MTJ element MTJ3 is judged as "0", and the data value of the MTJ element MTJ2 is judged as "1", a threshold value $15R+4\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Additionally, when the data value of the MTJ element MTJ4 is judged as "1", the data value of the MTJ element MTJ3 is judged as "0", and the data value of the MTJ element MTJ2 is judged as "0", a threshold value $15R+6\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Moreover, when the data value of the MTJ element MTJ4 is judged as "0", the data value of the MTJ element MTJ3 is judged as "1", and the data value of the MTJ element MTJ2 is judged as "1", a threshold value $15R+8\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Furthermore, when the data value of the MTJ element MTJ4 is judged as "0", the data value of the MTJ element MTJ3 is judged as "1", and the data value of the MTJ element MTJ2 is judged as "0", a threshold value $15R+10\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Additionally, when the data value of the MTJ element MTJ4 is judged as "0", the data value of the MTJ element MTJ3 is judged as "0", and the data value of the MTJ element MTJ2 is judged as "1", a threshold value $15R+12\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

Moreover, when the data value of the MTJ element MTJ4 is judged as "0", the data value of the MTJ element MTJ3 is judged as "0", and the data value of the MTJ element MTJ2 is judged as "0", a threshold value $15R+14\Delta R+\Delta R/2$ is set, and it is judged whether the synthesized resistance value Rtotal of four MTJ elements MTJ1, MTJ2, MTJ3, MTJ4 exceeds the threshold value or is less than the threshold value.

As described above, the data value of the MTJ element MTJ1 can be determined.

When the read potential Vtotal read by the write/read bit line WBL-j/RBL-j is detected by the sense amplifier (e.g., analog/digital converter) in the read operation principle of the present example, the data of MTJ elements in the block BK can be read at once by the read operation performed once.

It is to be noted that with respect to the operation for judging the data values of the MTJ elements MTJ1, MTJ2, MTJ3, MTJ4, the data of each MTJ element can be judged in a time series, and additionally can be simultaneously judged using a plurality of reference currents.

Logics shown in Tables 3 and 4 can be easily realized using a logic circuit described later. That is, when the logic circuit is used, the data values of four MTJ elements MTJ1, MTJ2, MTJ3, MTJ4 in the block BK can be judged immediately after detecting the read potential Vtotal.

Operation of Read Circuit

Table 5 shows relations between the data value of the MTJ element MTJ4 in the block BK and an output signal O7b8 of the A/D converter with the use of the read circuit of FIG. 48.

TABLE 5

|  |  | Data value | |
| --- | --- | --- | --- |
|  |  | "1" | "0" |
| Read potential |  | Vtotal < R7b8 | R7b8 < Vtotal8 |
| Output signal of A/D converter | O7b8 | 1 | 0 |

The MTJ element MTJ4 is a element having a highest resistance value 23R and a largest change amount 23ΔR of the resistance value among four MTJ elements MTJ1, MTJ2, MTJ3, MTJ4 in the block BK.

Therefore, when the data value of the MTJ element MTJ4 is "1", the read potential Vtotal (minus-side input signals of differential amplifiers DI0, . . . DI14) dependent on the synthesized resistance value Rtotal of the MTJ elements MTJ1, MTJ2, MTJ3, MTJ4 in the block BK is constantly less than the reference potential R7b8 of the A/D converter.

In this case, at least O7b8 to O14b15 are constantly "1" among the output signals O0b1, O1b2, . . . O13b14, O14b15 of the A/D converter.

Moreover, when the data value of the MTJ element MTJ4 is "0", the read potential Vtotal dependent on the synthesized resistance value Rtotal of the MTJ elements MTJ1, MTJ2, MTJ3, MTJ4 in the block BK is constantly more than the reference potential R7b8 of the A/D converter.

In this case, at least O0b1 to O7b8 are constantly "0" among the output signals O0b1, O1b2, . . . O13b14, O14b15 of the A/D converter.

That is, among the output signals O0b1, O1b2, . . . O13b14, O14b15 of the A/D converter, O7b8 is constantly "1" when the value of the data is "1", and is constantly "0" when the value of the data is "0".

As described above, the data value of the MTJ element MTJ4 can be judged based on O7b8.

Table 6 shows relations between the data value of the MTJ element MTJ3 in the block BK and the output signals O3b4, O7b8, O11b12 of the A/D converter with the use of the read circuit of FIG. 48.

TABLE 6

|  |  | Data value | | | |
| --- | --- | --- | --- | --- | --- |
|  |  | "1" | "0" | "1" | "0" |
| Read potential |  | Vtotal < R3b4 | R3b4 < Vtotal < R7b8 | R7b8 < Vtotal < R11b12 | R11b12 < Vtotal |
| Output signal of A/D converter | O3b4 | 1 | 0 | 0 | 0 |
|  | O7b8 | 1 | 1 | 0 | 0 |
|  | O11b12 | 1 | 1 | 1 | 0 |

The MTJ element MTJ3 is a element having a second high resistance value 22R and a second large change amount 22ΔR of the resistance value among four MTJ elements MTJ1, MTJ2, MTJ3, MTJ4 in the block BK.

Therefore, when the data value of the MTJ element MTJ3 is "1", the read potential Vtotal dependent on the synthesized resistance value Rtotal of the MTJ elements MTJ1, MTJ2, MTJ3, MTJ4 in the block BK is either:

less than the reference potential R3b4; or more than the reference potential R7b8 and less than the reference potential R11b12.

When the read potential Vtotal dependent on the synthesized resistance value Rtotal is less than the reference potential R3b4, at least O3b4, O7b8, O11b12 are constantly "1" among the output signals O0b1, O1b2, . . . O13b14, O14b15 of the A/D converter.

When the read potential Vtotal dependent on the synthesized resistance value Rtotal is more than the reference potential R7b8 and less than the reference potential R11b12, at least O3b4, O7b8 are constantly "0" and O11b12 is constantly "1" among the output signals O0b1, O1b2, . . . O13b14, O14b15 of the A/D converter.

Moreover, when the data value of the MTJ element MTJ3 is "0", the read potential Vtotal dependent on the synthesized resistance value Rtotal of the MTJ elements MTJ1, MTJ2, MTJ3, MTJ4 in the block BK is either:

more than the reference potential R3b4 and less than the reference potential R7b8; or more than the reference potential R11b12.

When the read potential Vtotal dependent on the synthesized resistance value Rtotal is more than the reference potential R3b4 and less than the reference potential R7b8, at least O3b4 is constantly "0", and O7b8, O11b12 are constantly "1" among the output signals O0b1, O1b2, . . . O13b14, O14b15 of the A/D converter.

When the read potential Vtotal dependent on the synthesized resistance value Rtotal is more than the reference potential R11b12, at least O3b4, O7b8, O11b12 are constantly "0" among the output signals O0b1, O1b2, . . . O13b14, O14b15 of the A/D converter.

The relations between the data value of the MTJ element MTJ3 and the output signals O3b4, O7b8, O11b12 of the A/D converter have been clarified in this manner.

Therefore, when the output signals O3b4, O7b8, O11b12 of the A/D converter are processed using the logic circuit described later, the data value of the MTJ element MTJ3 can be judged.

Tables 7 and 8 show relations between the data values of the MTJ element MTJ2 in the block BK and the output signals O1b2, O3b4, O5b6, O7b8, O9b10, O11b12, O13b14 of the A/D converter with the use of the read circuit of FIG. 48.

TABLE 7

| | | MTJ2 | | | | |
|---|---|---|---|---|---|---|
| | | Data value | | | | |
| | | "1" | "0" | "1" | "0" | "1" |
| Read potential | | Vtotal < R1b2 | R1b2 < Vtotal < R3b4 | R3b4 < Vtotal < R5b6 | R5b6 < Vtotal < R7b8 | R7b8 < Vtotal < R9b10 |
| Output signal of A/D converter | O1b2 | 1 | 0 | 0 | 0 | 0 |
| | O3b4 | 1 | 1 | 0 | 0 | 0 |
| | O5b6 | 1 | 1 | 1 | 0 | 0 |
| | O7b8 | 1 | 1 | 1 | 1 | 0 |
| | O9b10 | 1 | 1 | 1 | 1 | 1 |
| | O11b12 | 1 | 1 | 1 | 1 | 1 |
| | O13b14 | 1 | 1 | 1 | 1 | 1 |

TABLE 8

| | | MTJ2 | | |
|---|---|---|---|---|
| | | Data value | | |
| | | "0" | "1" | "0" |
| Read potential | | R9b10 < Vtotal < R11b12 | R11b12 < Vtotal < R13b14 | R13b14 < Vtotal |
| Output signal of A/D converter | O1b2 | 0 | 0 | 0 |
| | O3b4 | 0 | 0 | 0 |
| | O5b6 | 0 | 0 | 0 |
| | O7b8 | 0 | 0 | 0 |
| | O9b10 | 0 | 0 | 0 |
| | O11b12 | 1 | 0 | 0 |
| | O13b14 | 1 | 1 | 0 |

The MTJ element MTJ2 is a element having a third highest resistance value 21R and a third large change amount 21ΔR of the resistance value among four MTJ elements MTJ1, MTJ2, MTJ3, MTJ4 in the block BK.

Therefore, when the data value of the MTJ element MTJ2 is "1", the read potential Vtotal dependent on the synthesized resistance value Rtotal of the MTJ elements MTJ1, MTJ2, MTJ3, MTJ4 in the block BK is either:
less than the reference potential R1b2;
more than the reference potential R3b4 and less than the reference potential R5b6;
more than the reference potential R7b8 and less than the reference potential R9b10; or
more than the reference potential R11b12 and less than the reference potential R12b13.

When the read potential Vtotal dependent on the synthesized resistance value Rtotal is less than the reference potential R1b2, at least O1b2, O3b4, O5b6, O7b8, O9b10, O11b12, O13b14 are constantly "1" among the output signals O0b1, O1b2, . . . O13b14, O14b15 of the A/D converter.

When the read potential Vtotal dependent on the synthesized resistance value Rtotal is more than the reference potential R3b4 and less than the reference potential R5b6, at least O1b2, O3b4 are constantly "0" and O5b6, O7b8, O9b10, O11b12, O13b14 are constantly "1" among the output signals O0b1, O1b2, . . . O13b14, O14b15 of the A/D converter.

When the read potential Vtotal dependent on the synthesized resistance value Rtotal is more than the reference potential R7b8 and less than the reference potential R9b10, at least O1b2, O3b4, O5b6, O7b8 are constantly "0" and O9b10, O11b12, O13b14 are constantly "1" among the output signals O0b1, O1b2, . . . O13b14, O14b15 of the A/D converter.

When the read potential Vtotal dependent on the synthesized resistance value Rtotal is more than the reference potential R11b12 and less than the reference potential R13b14, at least O1b2, O3b4, O5b6, O7b8, O9b10, O11b12 are constantly "0", and O13b14 is constantly "1" among the output signals O0b1, O1b2, O13b14, O14b15 of the A/D converter.

Moreover, when the data value of the MTJ element MTJ2 is "0", the read potential Vtotal dependent on the synthesized resistance value Rtotal of the MTJ elements MTJ1, MTJ2, MTJ3, MTJ4 in the block BK is either:
more than the reference potential R1b2 and less than the reference potential R3b4;
more than the reference potential R5b6 and less than the reference potential R7b8;
more than the reference potential R9b10 and less than the reference potential R11b12; or
more than the reference potential R13b14.

When the read potential Vtotal dependent on the synthesized resistance value Rtotal is more than the reference potential R1b2 and less than R3b4, at least O1b2 is constantly "0", and O3b4, O5b6, O7b8, O9b10, O11b12, O13b14 are constantly "1" among the output signals O0b1, O1b2, . . . O13b14, O14b15 of the A/D converter.

When the read potential Vtotal dependent on the synthesized resistance value Rtotal is more than the reference potential R5b6 and less than the reference potential R7b8, at least O1b2, O3b4, O5b6 are constantly "0", and O7b8, O9b10, O11b12, O13b14 are constantly "1" among the output signals O0b1, O1b2, . . . O13b14, O14b15 of the A/D converter.

When the read potential Vtotal dependent on the synthesized resistance value Rtotal is more than the reference potential R9b10 and less than the reference potential R11b12, at least O1b2, O3b4, O5b6, O7b8, O9b10 are constantly "0", and O11b12, O13b14 are constantly "1" among the output signals O0b1, O1b2, O13b14, O14b15 of the A/D converter.

When the read potential Vtotal dependent on the synthesized resistance value Rtotal is more than the reference potential R13b14, at least O1b2, O3b4, O5b6, O7b8, O9b10, O11b12, O13b14 are constantly "0" among the output signals O0b1, O1b2, . . . O13b14, O14b15 of the A/D converter.

The relations between the data values of the MTJ element MTJ2 and the output signals O1b2, O3b4, O5b6, O7b8, O9b10, O11b12, O13b14 of the A/D converter have been clarified in this manner.

Therefore, when the output signals O1b2, O3b4, O5b6, O7b8, O9b10, O11b12, O13b14 of the A/D converter are processed using the logic circuit described later, the data value of the MTJ element MTJ2 can be judged.

Tables 9 to 12 show relations between the data values of the MTJ element MTJ1 in the block BK and the output signals O0b1, O1b2, O2b3, O3b4, O4b5, O5b6, O6b7, O7b8, O8b9, O9b10, O10b11, O11b12, O12b13, O13b14, O14b15 of the A/D converter with the use of the read circuit of FIG. 48.

TABLE 9

MTJ1

| | | Data value | | | |
|---|---|---|---|---|---|
| | | "1" | "0" | "1" | "0" |
| Read potential | | Vtotal < R0b1 | R0b1 < Vtotal < R1b2 | R1b2 < Vtotal < R2b3 | R2b3 < Vtotal < R3b4 |
| Output signal of A/D converter | O0b1 | 1 | 0 | 0 | 0 |
| | O1b2 | 1 | 1 | 0 | 0 |
| | O2b3 | 1 | 1 | 1 | 0 |
| | O3b4 | 1 | 1 | 1 | 1 |
| | O4b5 | 1 | 1 | 1 | 1 |
| | O5b6 | 1 | 1 | 1 | 1 |
| | O6b7 | 1 | 1 | 1 | 1 |
| | O7b8 | 1 | 1 | 1 | 1 |
| | O8b9 | 1 | 1 | 1 | 1 |
| | O9b10 | 1 | 1 | 1 | 1 |
| | O10b11 | 1 | 1 | 1 | 1 |
| | O11b12 | 1 | 1 | 1 | 1 |
| | O12b13 | 1 | 1 | 1 | 1 |
| | O13b14 | 1 | 1 | 1 | 1 |
| | O14b15 | 1 | 1 | 1 | 1 |

TABLE 10

MTJ1

| | | Data value | | | |
|---|---|---|---|---|---|
| | | "1" | "0" | "1" | "0" |
| Read potential | | R3b4 < Vtotal < R4b5 | R4b5 < Vtotal < R5b6 | R5b6 < Vtotal < R6b7 | R6b7 < Vtotal < R7b8 |
| Output signal of A/D converter | O0b1 | 0 | 0 | 0 | 0 |
| | O1b2 | 0 | 0 | 0 | 0 |
| | O2b3 | 0 | 0 | 0 | 0 |
| | O3b4 | 0 | 0 | 0 | 0 |
| | O4b5 | 1 | 0 | 0 | 0 |
| | O5b6 | 1 | 1 | 0 | 0 |
| | O6b7 | 1 | 1 | 1 | 0 |
| | O7b8 | 1 | 1 | 1 | 1 |
| | O8b9 | 1 | 1 | 1 | 1 |
| | O9b10 | 1 | 1 | 1 | 1 |
| | O10b11 | 1 | 1 | 1 | 1 |
| | O11b12 | 1 | 1 | 1 | 1 |
| | O12b13 | 1 | 1 | 1 | 1 |
| | O13b14 | 1 | 1 | 1 | 1 |
| | O14b15 | 1 | 1 | 1 | 1 |

TABLE 11

MTJ1

| | | Data value | | | |
|---|---|---|---|---|---|
| | | "1" | "0" | "1" | "0" |
| Read potential | | R7b8 < Vtotal < R8b9 | R8b9 < Vtotal < R9b10 | R9b10 < Vtotal < R10b11 | R10b11 < Vtotal < R11b12 |
| Output signal of A/D converter | O0b1 | 0 | 0 | 0 | 0 |
| | O1b2 | 0 | 0 | 0 | 0 |
| | O2b3 | 0 | 0 | 0 | 0 |
| | O3b4 | 0 | 0 | 0 | 0 |
| | O4b5 | 0 | 0 | 0 | 0 |
| | O5b6 | 0 | 0 | 0 | 0 |
| | O6b7 | 0 | 0 | 0 | 0 |
| | O7b8 | 0 | 0 | 0 | 0 |
| | O8b9 | 1 | 0 | 0 | 0 |
| | O9b10 | 1 | 1 | 0 | 0 |
| | O10b11 | 1 | 1 | 1 | 0 |
| | O11b12 | 1 | 1 | 1 | 1 |
| | O12b13 | 1 | 1 | 1 | 1 |
| | O13b14 | 1 | 1 | 1 | 1 |
| | O14b15 | 1 | 1 | 1 | 1 |

TABLE 12

MTJ1

| | | Data value | | | |
|---|---|---|---|---|---|
| | | "1" | "0" | "1" | "0" |
| Read potential | | R11b12 < Vtotal < R12b13 | R12b13 < Vtotal < R13b14b | R13b14 < Vtotal < R14b15 | R14b15 < Vtotal < R14b15 |
| Output signal of A/D converter | O0b1 | 0 | 0 | 0 | 0 |
| | O1b2 | 0 | 0 | 0 | 0 |
| | O2b3 | 0 | 0 | 0 | 0 |
| | O3b4 | 0 | 0 | 0 | 0 |
| | O4b5 | 0 | 0 | 0 | 0 |
| | O5b6 | 0 | 0 | 0 | 0 |
| | O6b7 | 0 | 0 | 0 | 0 |
| | O7b8 | 0 | 0 | 0 | 0 |
| | O8b9 | 0 | 0 | 0 | 0 |
| | O9b10 | 0 | 0 | 0 | 0 |
| | O10b11 | 0 | 0 | 0 | 0 |
| | O11b12 | 0 | 0 | 0 | 0 |
| | O12b13 | 1 | 0 | 0 | 0 |
| | O13b14 | 1 | 1 | 0 | 0 |
| | O14b15 | 1 | 1 | 1 | 0 |

The MTJ element MTJ1 is a element having a minimum resistance value 20R and a minimum change amount 20ΔR of the resistance value among four MTJ elements MTJ1, MTJ2, MTJ3, MTJ4 in the block BK.

Therefore, when the data value of the MTJ element MTJ1 is "1", the read potential Vtotal dependent on the synthesized resistance value Rtotal of the MTJ elements MTJ1, MTJ2, MTJ3, MTJ4 in the block BK is either:

less than the reference potential R0b1;

more than the reference potential R1b2 and less than the reference potential R2b3;

more than the reference potential R3b4 and less than the reference potential R4b5;

more than the reference potential R5b6 and less than the reference potential R6b7;

more than the reference potential R7b8 and less than the reference potential R8b9;

more than the reference potential R9b10 and less than the reference potential R10b11;

more than the reference potential R11b12 and less than the reference potential R12b13; or more than the reference potential R13b14 and less than the reference potential R14b15.

When the read potential Vtotal dependent on the synthesized resistance value Rtotal is less than the reference potential R0b1, all of the output signals O0b1, O1b2, . . . O13b14, O14b15 of the A/D converter is "1".

When the read potential Vtotal dependent on the synthesized resistance value Rtotal is more than the reference potential R1b2 and less than the reference potential R2b3, at least O0b1, O1b2 are constantly "0", and remaining O2b3, O3b4, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R3b4 and less than the reference potential R4b5, at least O0b1, O1b2, O2b3, O3b4 are constantly "0", and remaining O4b5, O5b6 ..., O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R5b6 and less than the reference potential R6b7, at least O0b1, O1b2, O4b5, O5b6 are constantly "0" and the remaining O6b7, O7b8, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R7b8 and less than the reference potential R8b9, at least O0b1, O1b2, O3b4, ... O6b7, O7b8 are constantly "0" and the remaining O8b9, O9b10, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R9b10 and less than the reference potential R10b11, at least O0b1, O1b2, ... O8b9, O9b10 are constantly "0", and the remaining O10b11, O11b12, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R11b12 and less than the reference potential R12b13, at least O0b1, O1b2, ... O10b11, O11b12 are constantly "0", and the remaining O12b13, O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R13b14 and less than the reference potential R14b15, at least O0b1, O1b2, ... O12b13, O13b14 are constantly "0", and the remaining O14b15 is constantly "1" among the output signals O0b1, O1b2, ... O13b14, O14b15 of the A/D converter.

Moreover, when the data value of the MTJ element MTJ1 is "0", the read potential Vtotal dependent on the synthesized resistance value Rtotal of the MTJ elements MTJ1, MTJ2, MTJ3, MTJ4 in the block BK is either:
- more than the reference potential R0b1 and less than the reference potential R1b2;
- more than the reference potential R2b3 and less than the reference potential R3b4;
- more than the reference potential R4b5 and less than the reference potential R5b6;
- more than the reference potential R6b7 and less than the reference potential R7b8;
- more than the reference potential R8b9 and less than the reference potential R9b10;
- more than the reference potential R10b11 and less than the reference potential R11b12;
- more than the reference potential R12b13 and less than the reference potential R13b14; or
- more than the reference potential R14b15.

When the read potential Vtotal dependent on the synthesized resistance value Rtotal is more than the reference potential R0b1 and less than the reference potential R1b2, at least O0b1 is constantly "0" and the remaining O1b2, O2b3, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R2b3 and less than the reference potential R3b4, at least O0b1, O1b2, O2b3 are constantly "0", and the remaining O3b4, O4b5, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R4b5 and less than the reference potential R5b6, at least O0b1, O1b2, ... O3b4, O4b5 are constantly "0", and the remaining O5b6, O6b7, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R6b7 and less than the reference potential R7b8, at least O0b1, O1b2, ... O5b6, O6b7 are constantly "0", and the remaining O7b8, O8b9, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R8b9 and less than the reference potential R9b10, at least O0b1, O1b2, ... O7b8, O8b9 are constantly "0", and the remaining O9b10, O10b11, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R10b11 and less than the reference potential R11b12, at least O0b1, O1b2, ... O9b10, O10b11 are constantly "0", and the remaining O11b12, O12b13, ... O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R12b13 and less than the reference potential R13b14, at least O0b1, O1b2, ... O11b12, O12b13 are constantly "0", and the remaining O13b14, O14b15 are constantly "1" among the output signals O0b1, O1b2, ... O13b14, O14b15 of the A/D converter.

When the read potential Vtotal dependent on the synthesized resistance value Rtotal is more than the reference potential R14b15, the output signals O0b1, O1b2, ... O13b14, O14b15 of the A/D converter are all "0".

The relations between the data values of the MTJ element MTJ2 and the output signals O0b1, O1b2, ... O13b14, O14b15 of the A/D converter have been clarified in this manner. Therefore, when the output signals O0b1, O1b2, ... O13b14, O14b15 of the A/D converter are processed using the logic circuit described later, the data value of the MTJ element MTJ1 can be judged.

Logic Circuit

Next, a logic circuit will be described which actually judges the data values of the MTJ elements MTJ1, MTJ2, MTJ3, MTJ4 in the block BK based on the output signals O0b1, O1b2, ... O13b14, O14b15 of the A/D converter.

Figure 49:
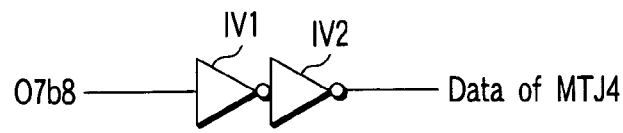
FIG. 49 is a circuit diagram showing an example of a logic circuit for use in data judgment.

FIG. 49 shows an example of the logic circuit which judges the data value of the MTJ element MTJ4 based on the output signal of the A/D converter.

The logic circuit is constituted to satisfy the relations of Table 5 described above. In the present example, the data value of the MTJ element MTJ4 is judged based on the output signal O7b8 among the output signals O0b1, O1b2, . . . O13b14, O14b15 of the A/D converter.

Since the data value of the MTJ element MTJ4 can be judged only from the value of the output signal O7b8, the logic circuit to judge the data value of the MTJ element MTJ4 comprises inverters IV1, IV2 connected in series.

Figure 50:
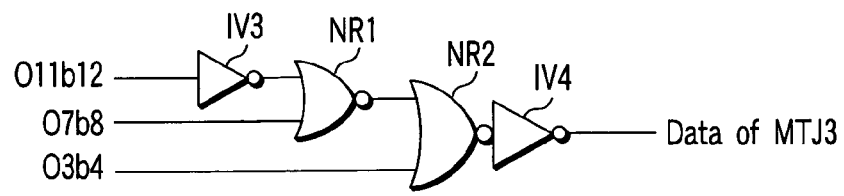
FIG. 50 is a circuit diagram showing an example of the logic circuit for use in data judgment.

FIG. 50 shows an example of the logic circuit which judges the data value of the MTJ element MTJ3 based on the output signal of the A/D converter.

The logic circuit is constituted to satisfy the relations of Table 6 described above. In the present example, the data value of the MTJ element MTJ3 is judged based on the output signals O3b4, O7b8, O11b12 among the output signals O0b1, O1b2, . . . O13b14, O14b15 of the A/D converter.

Since the data value of the MTJ element MTJ3 can be judged from the values of the output signals O3b4, O7b8, O11b12 as described above, the logic circuit to judge the data value of the MTJ element MTJ3 comprises inverters IV3, IV4 and NOR gate circuits NR1, NR2.

For example, when O3b4="1", the data value of the MTJ element MTJ3 is judged as "1". When O3b4="0", O7b8="1", the data value of the MTJ element MTJ3 is judged as "0". When O3b4="0", O7b8="0", O11b12="1", the data value of the MTJ element MTJ3 is judged as "1". When O3b4="0", O7b8="0", O11b12="0", the data value of the MTJ element MTJ3 is judged as "0".

Figure 51:
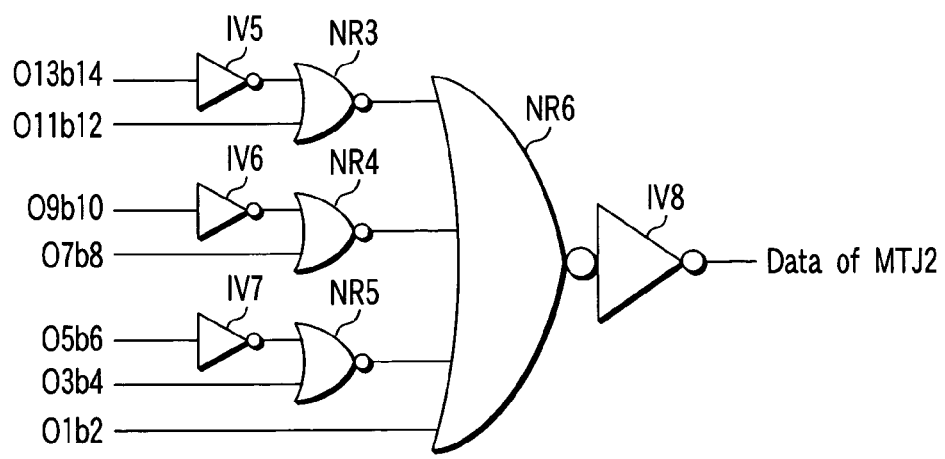
FIG. 51 is a circuit diagram showing an example of the logic circuit for use in data judgment.

FIG. 51 shows an example of the logic circuit which judges the data value of the MTJ element MTJ2 based on the output signal of the A/D converter.

The logic circuit is constituted to satisfy the relations of Tables 7 and 8 described above. In the present example, the data value of the MTJ element MTJ2 is judged based on the output signals O1b2, O3b4, O5b6, O7b8, O9b10, O11b12, O13b14 among the output signals O0b1, O1b2, . . . O13b14, O14b15 of the A/D converter.

The logic circuit which judges the data value of the MTJ element MTJ2 comprises inverters IV5, IV6, IV7, IV8 and NOR gate circuits NR3, NR4, NR5, NR6.

For example, when O1b2="1", the data value of the MTJ element MTJ2 is judged as "1". When O1b2="0", O3b4="1", the data value of the MTJ element MTJ2 is judged as "0". When O1b2="0", O3b4="0", O5b6="1", the data value of the MTJ element MTJ2 is judged as "1".

Figure 52:
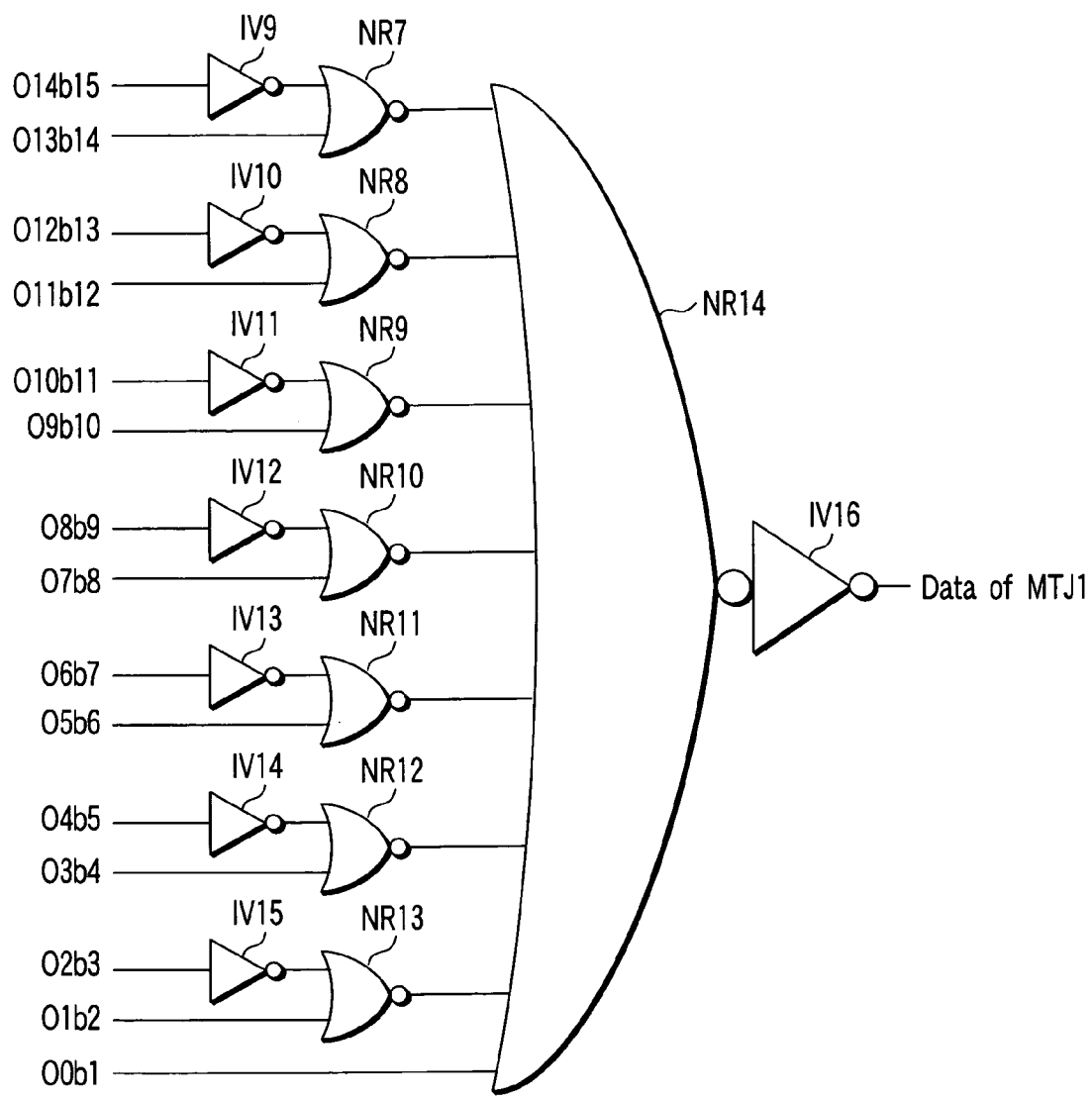
FIG. 52 is a circuit diagram showing an example of the logic circuit for use in data judgment.

FIG. 52 is a circuit diagram showing an example of the logic circuit which judges the data value of the MTJ element MTJ1 based on the output signal of the A/D converter.

The logic circuit is constituted to satisfy the relations of Tables 9 to 12 described above. In the present example, the data value of the MTJ element MTJ1 is judged based on all the output signals O0b1, O1b2, . . . O13b14, O14b15 of the A/D converter.

The logic circuit which judges the data value of the MTJ element MTJ1 comprises inverters IV9, IV10, IV11, IV12, IV13, IV14, IV15, IV16, and NOR gate circuits NR7, NR8, NR9, NR10, NR11, NR12, NR13, NR14.

For example, when O0b1="1", the data value of the MTJ element MTJ1 is judged as "1". When O0b1="0", O1b2="1", the data value of the MTJ element MTJ1 is judged as "0". When O0b1="0", O1b2="0", O2b3="1", the data value of the MTJ element MTJ1 is judged as "1".

It is to be noted that there are three patterns in which the output signals O0b1, O1b2, . . . O13b14, O14b15 of the A/D converter are all "1", and all "0", and "0" and "1" exist.

Moreover, when "0" and "1" exist, a boundary between "0" and "1" constantly exists, the output signals on one side of the boundary are all "0", and the output signals on the other side are all "1".

5. Modification

Next, modifications of the cell array structure according to the first to third embodiments will be described.

(1) Modification 1

Figure 53:
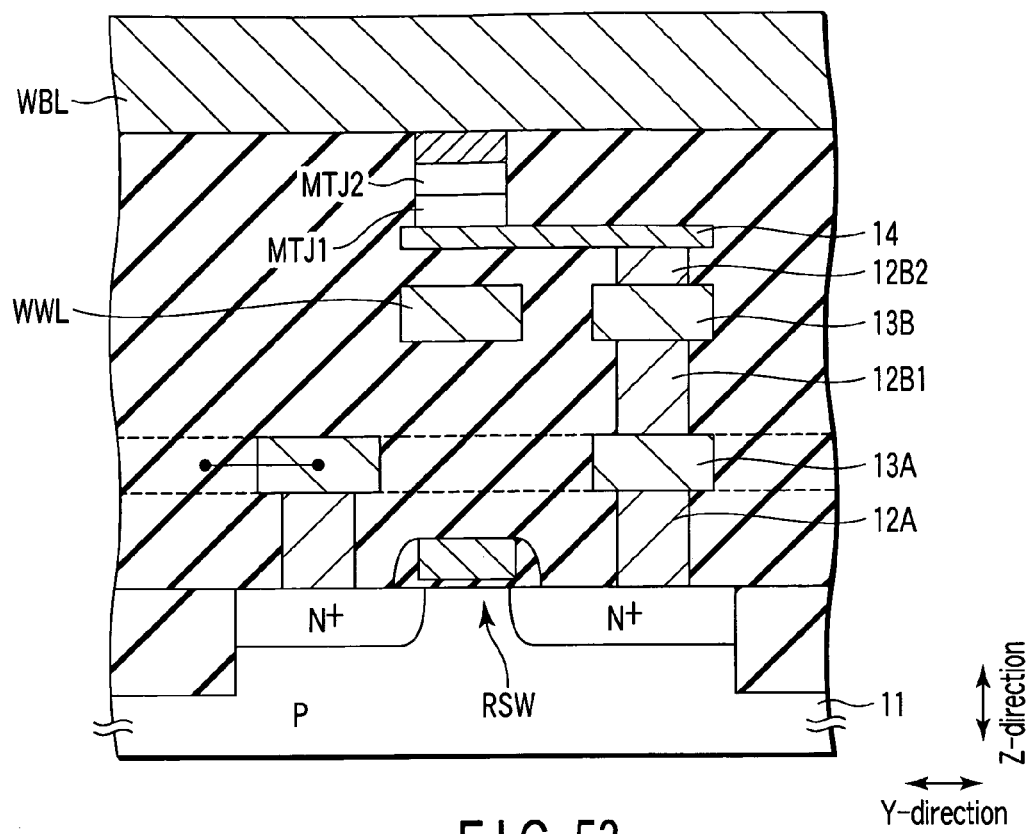
FIG. 53 is a sectional view showing a device structure according to Modification 1.

FIG. 53 shows a device structure according to Modification 1.

Modification 1 has characteristics that the easy axis directions of magnetizations of the plurality of MTJ elements MTJ1, MTJ2 disposed in the intersecting portion of two write lines are not disposed at an interval of an equal angle (e.g., 90°).

It is to be noted that Modification 1 may also be applicable to the second and third embodiments.

Figure 54:
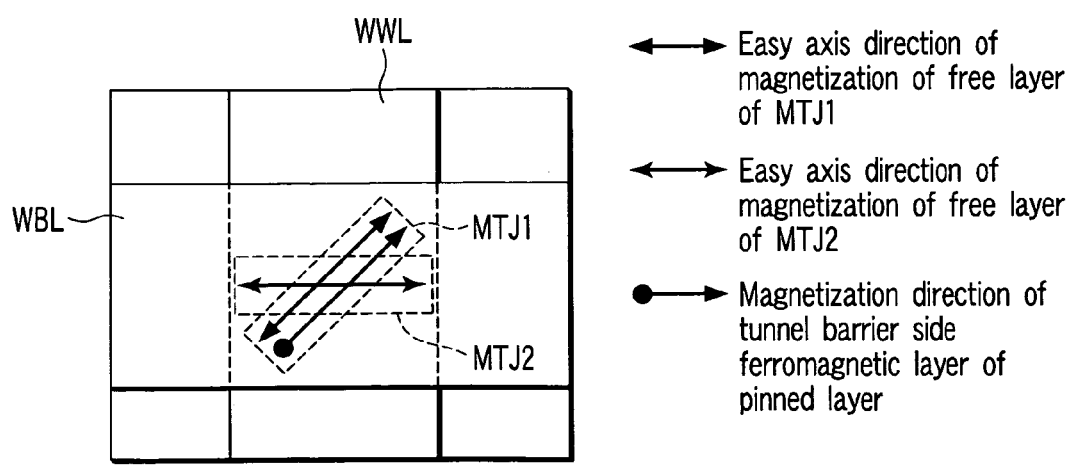
FIG. 54 is a plan view showing an easy axis direction of magnetization of the MTJ element.
Figure 55:
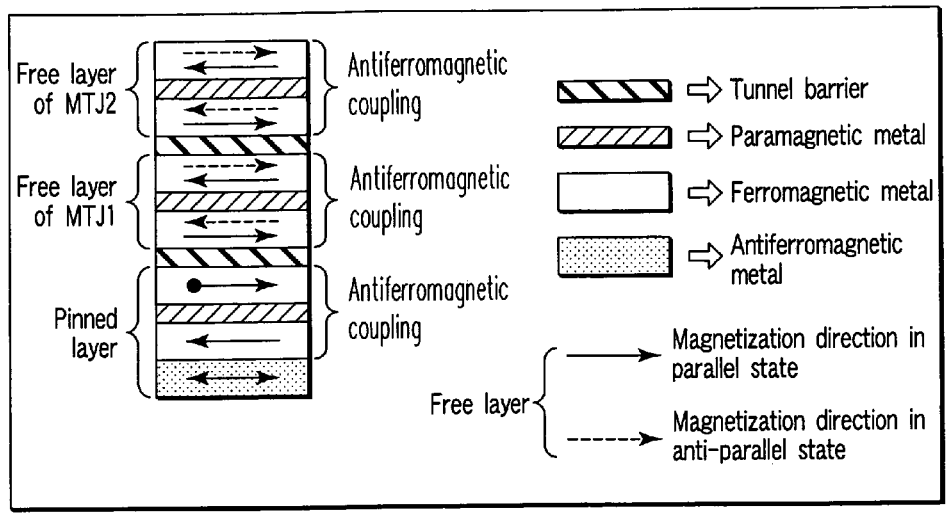
FIG. 55 is a diagram showing a structural example of the MTJ element.

According to the present example, as shown in FIGS. 54 and 55, the easy axis direction of magnetization of the storage layer (free layer) of the MTJ element MTJ1 of the lower part forms an angle of 45° with respect to directions in which the write word line WWL extends and in which the write bit line WBL extends.

Moreover, the easy axis direction of magnetization of the storage layer of the MTJ element MTJ2 of the upper part is a direction in which the write bit line WBL extends.

The fixed layer (pinned layer) is shared by two MTJ elements MTJ1, MTJ2, and the MTJ elements MTJ1, MTJ2 are disposed on one side of the fixed layer. The magnetization direction of the tunnel barrier side ferromagnetic layer of the fixed layer is the same as the easy axis direction of magnetization of the storage layer of the MTJ element MTJ1.

According to Julliere model, assuming that polarization ratios of two ferromagnetic layers between which a tunnel barrier layer is held are P1, P2, and a relative angle is $\theta$, conductance of the MTJ element is proportional to $1+P1 \times P2 \times \cos \theta$.

Therefore, in the device structure of the present example, assuming that the polarization ratios of the fixed layer and storage layer are both P (=P1=P2) and that an angle formed by the fixed layer and the storage layer of the MTJ element MTJ1 is $\theta$ and that a relative angle between the storage layers of the MTJ elements MTJ1, MTJ2 is $\psi$, the conductance is proportional to $(1+P2 \cos \theta) \times (1+P2 \cos \psi)$.

When the magnetized state of the MTJ element is completely reversed, $\theta$ takes 0° and 180°, and $\psi$ takes 45° and 135°.

Since P<1, proportional coefficients are $1-P2 \times (\sqrt{2}+1)/\sqrt{2}+P4/\sqrt{2}$; $1-P2 \times (\sqrt{2}-1)/\sqrt{2}-P4/\sqrt{2}$; $1+P2 \times (\sqrt{2}-1)/\sqrt{2}-P4/\sqrt{2}$; and $1+P2 \times (\sqrt{2}+1)/\sqrt{2}+P4/\sqrt{2}$ in order from a smallest coefficient.

Since there are four types of distinctions in this manner, a thickness of the tunnel barrier layer and an area of the MTJ element may be equal with respect to the plurality of MTJ elements MTJ1, MTJ2.

When the data (magnetized state) of the MTJ element MTJ2 of the upper part is recognized, the data is influenced by the data (magnetized state) of the MTJ element MTJ1 of the lower part. However, there is not any trouble during the read, when the above-described read method is applied.

When the toggle system is used in the write, it is necessary to produce two magnetic fields between which the easy axis direction of magnetization of the storage layer of the MTJ element MTJ1 or MTJ2 is held. Therefore, the magnitude and direction of the current to be passed through the write word/bit line WWL/WBL are controlled, and magnetic fields a, b, c are produced, for example, as shown in FIG. 56.

Figure 56:
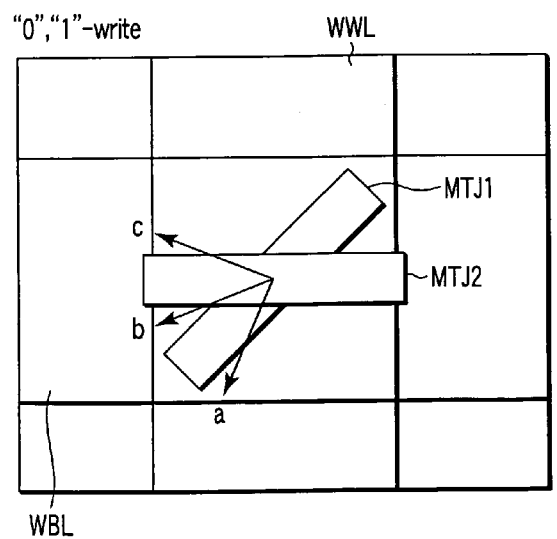
FIG. 56 is a diagram showing an example of the magnetic field generated at the write time.

That is, when the data is written into the MTJ element MTJ1, the magnetic fields a, b are produced, for example, as shown in FIG. 56, and the magnetized state of the MTJ element MTJ1 is changed to the parallel state from the anti-parallel state or to the anti-parallel state from the parallel state by the toggle write principle.

Moreover, when the data is written into the MTJ element MTJ2, the magnetic fields b, c are produced, for example, as shown in FIG. 56, and the magnetized state of the MTJ element MTJ2 is changed to the parallel state from the anti-parallel state or to the anti-parallel state from the parallel state by the toggle write principle.

Here, with respect to the order in which the magnetic fields a, b and the magnetic fields b, c are supplied, any field may be the first.

Figure 57:
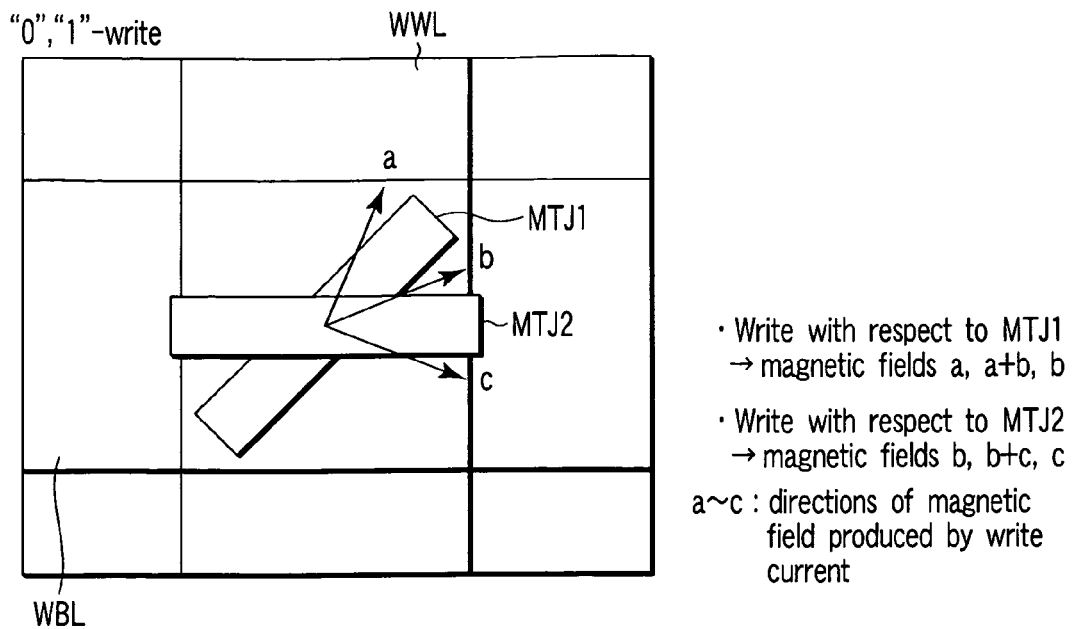
FIG. 57 is a diagram showing an example of the magnetic field generated at the write time.

It is to be noted that the toggle write may also be performed using the magnetic fields a, b, c shown in FIG. 57 instead of those shown in FIG. 56.

(2) Modification 2

Figure 58:
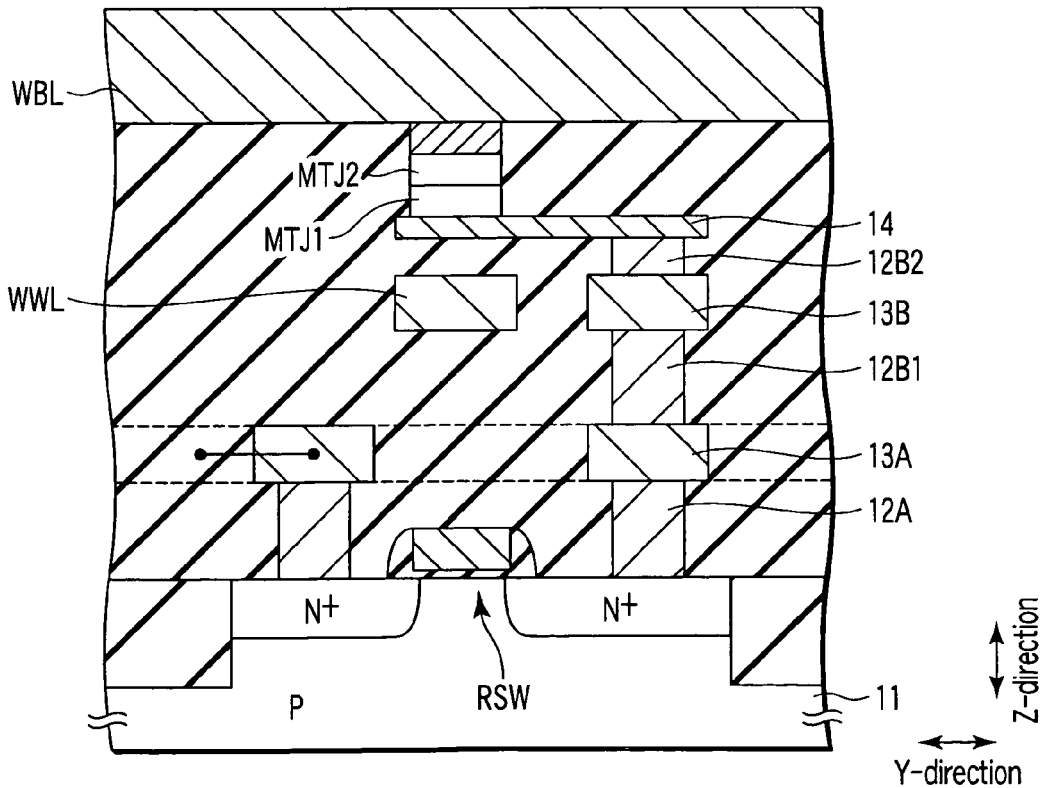
FIG. 58 is a sectional view showing a device structure according to Modification 2.

FIG. 58 shows a device structure according to Modification 2.

Modification 2 has characteristics that the easy axis directions of magnetizations of the plurality of MTJ elements MTJ1, MTJ2 disposed in the intersecting portion of two write lines are different from the magnetization direction of the tunnel barrier side ferromagnetic layer of the fixed layer in the device structure in the first embodiment.

It is to be noted that Modification 2 may also be applicable to the second and third embodiments.

Figure 59:
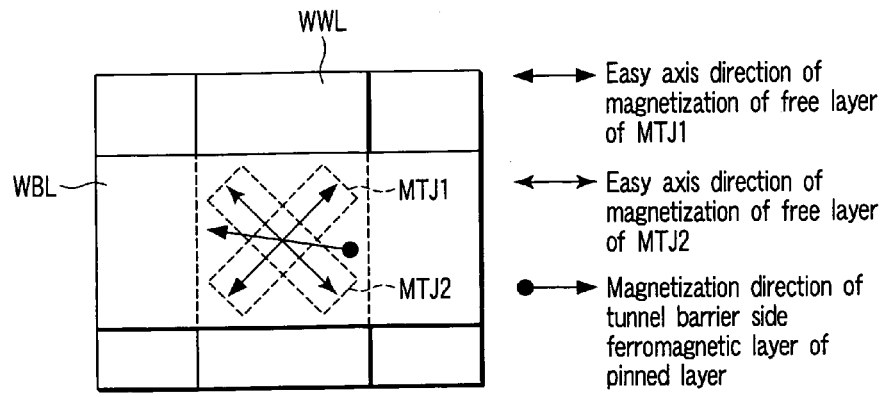
FIG. 59 is a plan view showing the easy axis direction of magnetization of the MTJ element.
Figure 60:
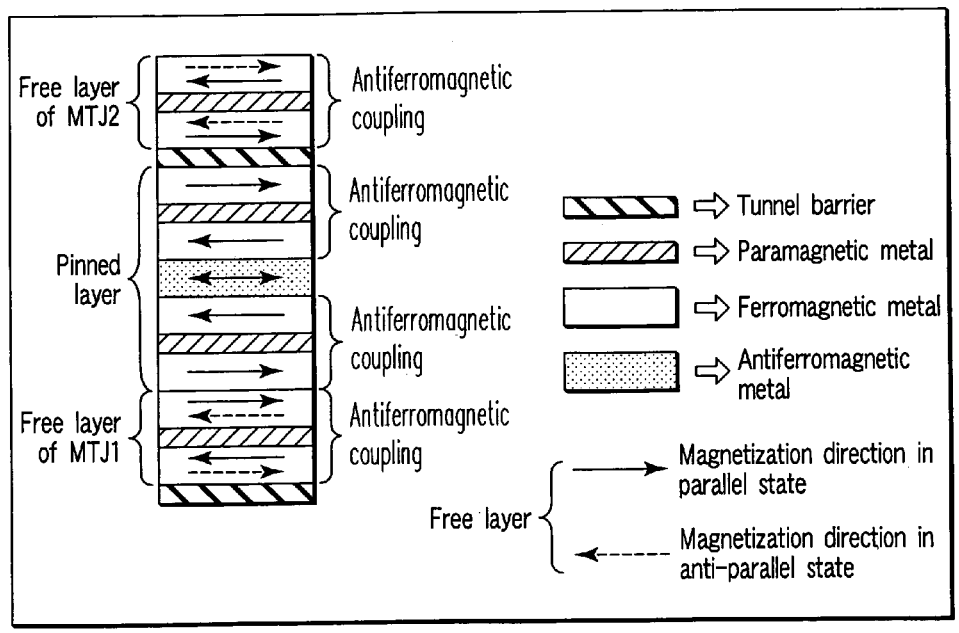
FIG. 60 is a diagram showing a structural example of the MTJ element.

According to the present example, as shown in FIGS. 59 and 60, the easy axis direction of magnetization of the storage layer of the MTJ element MTJ1 of the lower part forms an angle of 45° with respect to the directions in which the write word line WWL extends and in which the write bit line WBL extends.

Moreover, the easy axis direction of magnetization of the storage layer of the MTJ element MTJ2 of the upper part forms an angle of 45° with respect to the directions in which the write word line WWL extends and in which the write bit line WBL extends.

Furthermore, the easy axis directions of magnetizations of two MTJ elements MTJ1, MTJ2 form an angle 90° with each other.

The fixed layer is shared by two MTJ elements MTJ1, MTJ2, and the fixed layer is disposed between these MTJ elements MTJ1, MTJ2. The magnetization direction of the tunnel barrier side ferromagnetic layer of the fixed layer is different from the easy axis direction of magnetization of the storage layer of the MTJ element MTJ1, and is also different from the easy axis direction of magnetization of the storage layer of the MTJ element MTJ2.

For example, the magnetization direction of the tunnel barrier side ferromagnetic layer of the fixed layer forms an angle of 60° with respect to the easy axis direction of magnetization of the storage layer of the MTJ element MTJ1, and forms an angle of 30° with respect to the easy axis direction of magnetization of the storage layer of the MTJ element MTJ2.

According to Julliere model (e.g., Chang. H. Shang, et. al., "Temperature dependence of magnetoresistance and surface magnetization in ferromagnetic tunnel junction", Physical Review B, Vol. 58, No. 6, pp. 2917 to 2920), assuming that polarization ratios of two ferromagnetic layers between which a tunnel barrier layer is held are P1, P2, and a relative angle is θ, the conductance of the MTJ element is proportional to $1+P1 \times P2 \times \cos\theta$.

Therefore, in the device structure of the present example, assuming that the polarization ratios of the fixed layer and storage layer are both P (=P1=P2) and that an angle formed by the fixed layer and the storage layer of the MTJ element MTJ1 is θ and that a relative angle between the storage layers of the MTJ elements MTJ1, MTJ2 is ψ, the conductance is proportional to $(1+P2 \cos\theta) \times (1+P2 \cos\psi)$.

When the magnetized state of the MTJ element is completely reversed, θ takes 60° and 120°, and ψ takes 30° and 150°.

Since P<1, the proportional coefficients are $1-P2\times(\sqrt{3}+1)/2+P4\times\sqrt{3}/4$; $1-P2\times(\sqrt{3}-1)/2-P4\times\sqrt{3}/4$; $1+P2\times(\sqrt{3}-1)/2-P4\times\sqrt{3}/4$; and $1+P2\times(\sqrt{3}+1)/2+P4\times/\sqrt{3}/4$ in order from the smallest coefficient.

Since there are four types of distinctions in this manner, the thickness of the tunnel barrier layer and the area of the MTJ element may be equal with respect to the plurality of MTJ elements MTJ1, MTJ2.

When the data (magnetized state) of the MTJ element MTJ2 of the upper part is recognized, the data is influenced by the data (magnetized state) of the MTJ element MTJ1 of the lower part. However, when the above-described read method is applied, after all the data of two MTJ elements MTJ1, MTJ2 can be simultaneously read, and there is not any trouble during the read.

When the toggle system is used in the write, it is necessary to produce two magnetic fields between which the easy axis direction of magnetization of the storage layer of the MTJ element MTJ1 or MTJ2 is held. Therefore, the magnitude and direction of the current to be passed through the write word/bit line WWL/WBL are controlled, and the magnetic fields a, b, c are produced, for example, as shown in FIG. 61.

Figure 61:
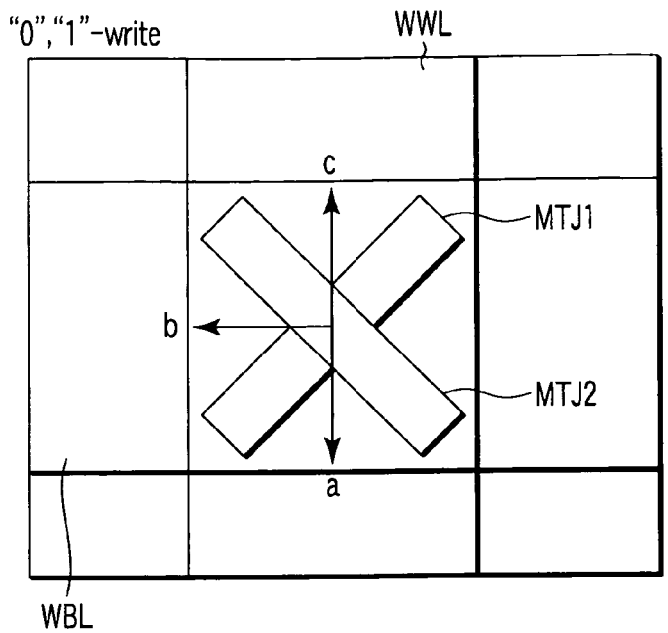
FIG. 61 is a diagram showing an example of the magnetic field generated at the write time.

That is, when the data is written into the MTJ element MTJ1, the magnetic fields a, b are produced, for example, as shown in FIG. 61, and the magnetized state of the MTJ element MTJ1 is changed to the parallel state from the anti-parallel state or to the anti-parallel state from the parallel state by the toggle write principle.

Moreover, when the data is written into the MTJ element MTJ2, the magnetic fields b, c are produced, for example, as shown in FIG. 61, and the magnetized state of the MTJ element MTJ2 is changed to the parallel state from the anti-parallel state or to the anti-parallel state from the parallel state by the toggle write principle.

Here, with respect to the order in which the magnetic fields a, b and the magnetic fields b, c are supplied, any field may be the first.

Figure 62:
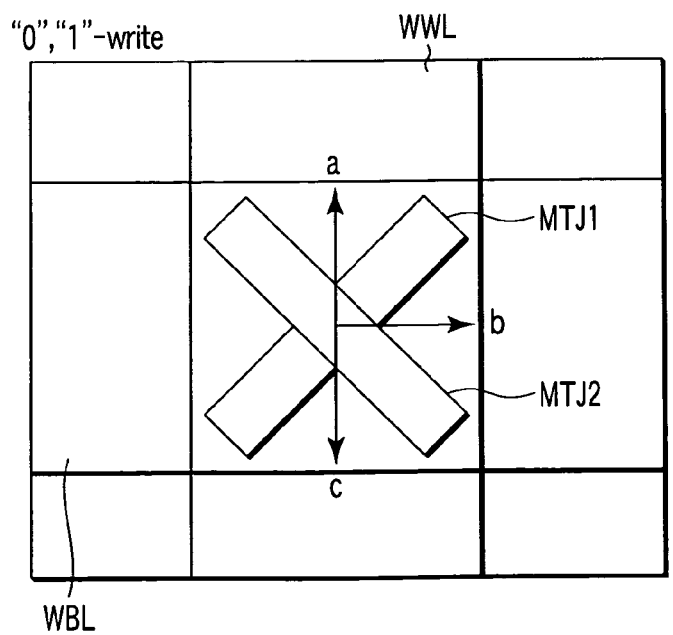
FIG. 62 is a diagram showing an example of the magnetic field generated at the write time.

It is to be noted that the toggle write may also be performed using the magnetic fields a, b, c shown in FIG. 62 instead of those shown in FIG. 61.

(3) Others

Modifications 1 and 2 described above may also be combined.

For example, as the MTJ elements MTJ1, MTJ2, as shown in FIG. 55, a structure in which the MTJ elements MTJ1, MTJ2 are disposed on one side of the fixed layer is used. Furthermore, in a method for the easy axis directions of magnetizations of the MTJ elements MTJ1, MTJ2, directions are set as shown in FIG. 54.

Moreover, as shown in FIG. 59, the easy axis directions of magnetizations of the MTJ elements MTJ1, MTJ2 may also be different from the magnetization direction of the tunnel barrier side ferromagnetic layer of the fixed layer.

Moreover, for example, as the MTJ elements MTJ1, MTJ2, as shown in FIG. 60, a structure in which the fixed layer is held between two MTJ elements MTJ1, MTJ2 is used. Furthermore, in the method for the easy axis directions of magnetizations of the MTJ elements MTJ1, MTJ2, the directions are set as shown in FIG. 59.

Moreover, as shown in FIG. 54, the magnetization direction of the tunnel barrier side ferromagnetic layer of the fixed layer may be matched with either one of the easy axis directions of magnetizations of the MTJ elements MTJ1, MTJ2.

6. Manufacturing Method

An example of a method of forming a plurality of MTJ elements which are disposed in the intersecting portion of two write lines and which are stacked upon one another will be described hereinafter.

In the device structure according to the example of the present invention, the easy axis directions of magnetizations of the plurality of MTJ elements disposed in the intersecting portion of two write lines are different. Here, when magnetic anisotropy of the MTJ element is imparted in accordance with a shape, the shapes or directions of the mutually stacked MTJ elements have to be different, and they have to be separately worked.

In a first manufacturing method, a stopper layer STOP having a function of an etching stopper is disposed between the MTJ element MTJ1 of the lower part and the MTJ element MTJ2 of the upper part to realize the device structure according to the example of the present invention.

Figure 63:
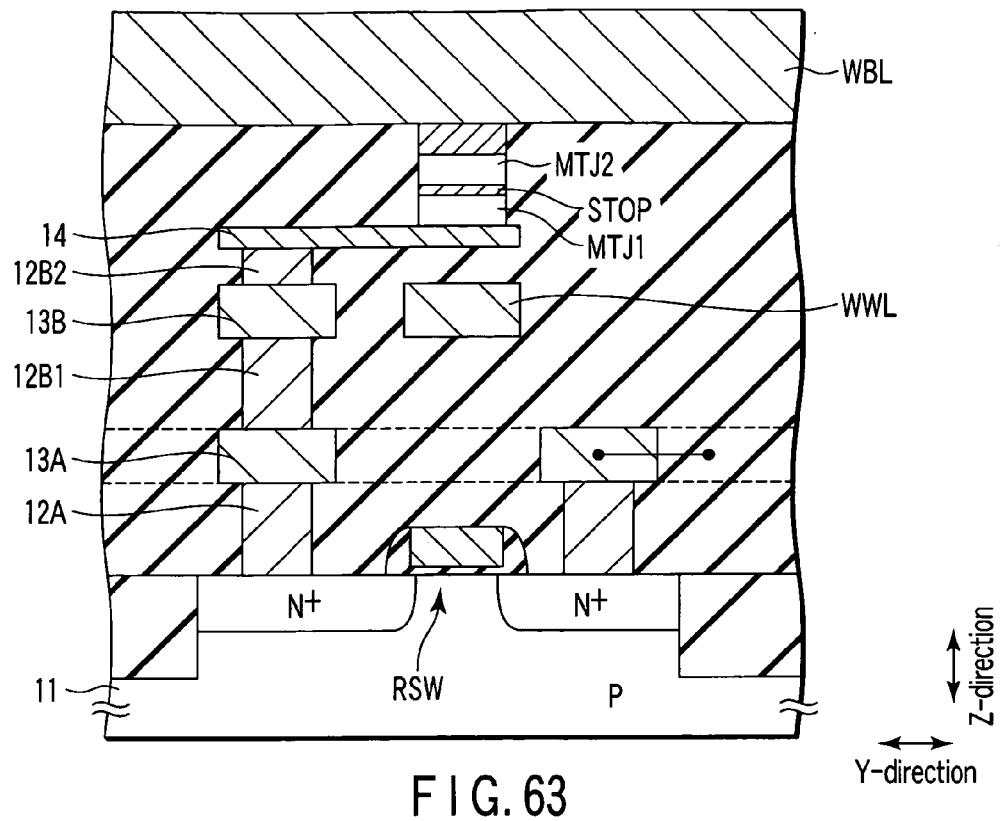
FIG. 63 is a sectional view showing an example of a device structure advantageous for the manufacturing.

First, for example, as shown in FIG. 63, a metal layer constituting a lower electrode 14, a first laminate layer and stopper layer (conductive layer) STOP constituting the MTJ element MTJ1, and a second laminate layer and cap layer constituting the MTJ element MTJ2 are successively formed.

Thereafter, for example, a photo mask is used as a mask, the cap layer is patterned by RIE, further the patterned cap layer (hard mask) is used as the mask, and the MTJ element MTJ2 is worked by RIE. At this time, since the stopper layer STOP functions as the etching stopper, the first laminate layer constituting the MTJ element MTJ1 can be prevented from being etched.

Next, the patterned cap layer is used as the mask, the stopper layer is etched by RIE, and a protective layer is formed to coat the MTJ element MTJ2.

Furthermore, thereafter a hard mask for working the MTJ element MTJ1 is formed, the hard mask is used as the mask, and the MTJ element MTJ1 is worked by the RIE. A protective layer is formed to coat the MTJ element MTJ1.

Finally, a mask for working the lower electrode 14 is formed, and the lower electrode 14 is patterned by the RIE using the mask.

In a second manufacturing method, an electrode 14B having the same shape as that of a lower electrode 14A is disposed between the MTJ element MTJ1 of the lower part and the MTJ element MTJ2 of the upper part to realize the device structure according to the example of the present invention.

Figure 64:
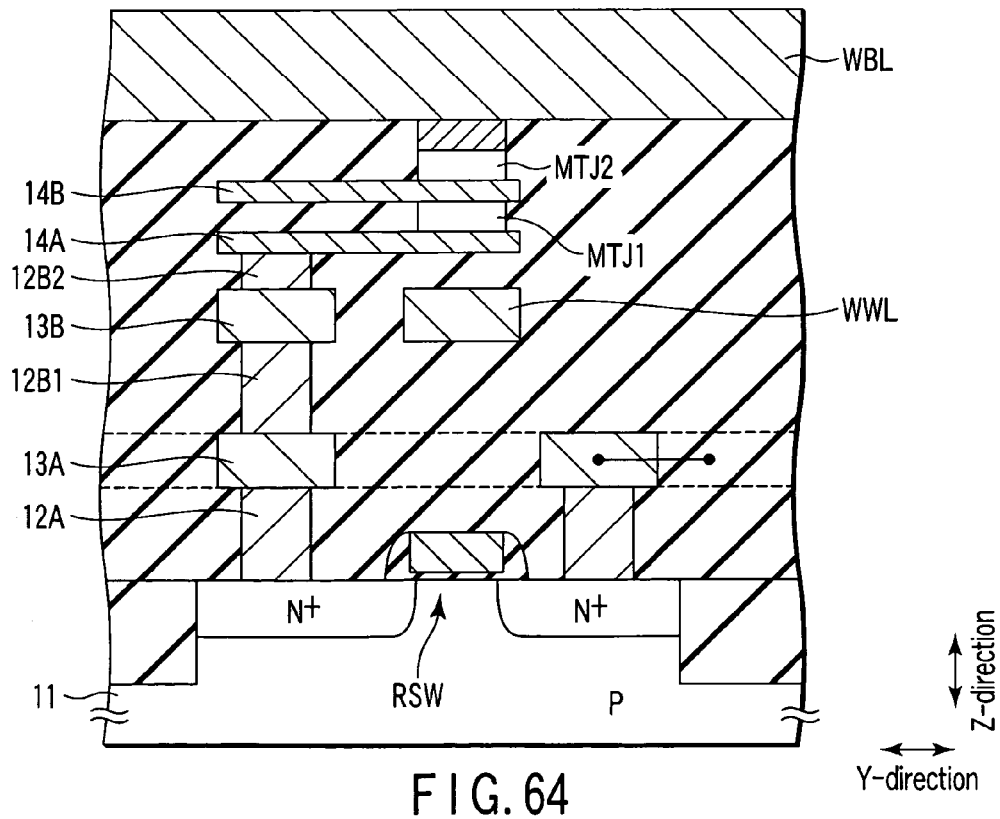
FIG. 64 is a sectional view showing an example of the device structure advantageous for the manufacturing.

First, for example, as shown in FIG. 64, the metal layer constituting the lower electrode 14A and the first laminate layer constituting the MTJ element MTJ1 are formed.

Thereafter, for example, the hard mask is used as the mask, and the MTJ element MTJ1 is worked by the RIE. The mask for working the lower electrode 14A is formed, and the lower electrode 14A is patterned by the RIE using the mask.

Next, the metal layer constituting the electrode 14B and the second laminate layer constituting the MTJ element MTJ2 are formed.

Thereafter, for example, the hard mask is used as the mask, and the MTJ element MTJ2 is worked by the RIE. The mask for working the electrode 14B is formed, and the electrode 14B is patterned by the RIE using the mask.

By the above-described manufacturing methods, a plurality of MTJ elements having different easy axis of magnetization methods can be formed according to the example of the present invention.

It is to be noted that in FIGS. 63 and 64, a magnetic flux keeper layer by a soft magnetic material may also be disposed on the surfaces of the write word line WWL and write bit line WBL.

7. Others

In the first to third embodiments or Modifications 1, 2, for ease of seeing the drawings, a shape of an MTJ element is set to a rectangular shape, and magnetic anisotropy is imparted in accordance with the shape of the MTJ element, but the shape of the MTJ element is not limited to the rectangular shape, and any shape having long and short axes may also be used.

Moreover, the magnetic anisotropy of the MTJ element may also be generated not by the shape of the MTJ element, but by magnetocrystalline anisotropy of a material constituting the MTJ element.

In this case, for example, the shape of the MTJ element is set to a square shape, and the easy axis direction of magnetization of the MTJ element and the magnetization direction of the fixed layer are determined by the magnetocrystalline anisotropy of a ferromagnetic material.

When the magnetic anisotropy is imparted to the MTJ element by the magnetocrystalline anisotropy of the ferromagnetic material, the shape of the MTJ element is not limited to the square shape, and any shape may also be used such as a shape which does not have any long or short axis.

According to the example of the present invention, when a plurality of MTJ elements are stacked on an intersecting portion of two write lines, a memory capacity increases, and an area per cell is set to be equal to that of a cell array of 1-transistor-1MTJ type. In this cell array structure, data can be written independently into a plurality of MTJ elements disposed in the intersecting portion of two write lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A magnetic random access memory comprising:
   first and second write lines which intersect with each other; and
   three or more magneto resistive elements stacked on an intersecting portion of the first and second write lines,
   wherein easy axis directions of magnetizations of storage layers of the magneto resistive elements are arranged at an interval of an equal angle, and the interval of the equal angle corresponds to a value obtained by dividing 180° by the number of magneto resistive elements.

2. The magnetic random access memory according to claim 1, wherein the magneto resistive elements are disposed between the first and second write lines, and one end of the magneto resistive elements is connected to a read selection switch disposed right under the magneto resistive elements.

3. The magnetic random access memory according to claim 1, wherein at least two of the magneto resistive elements share the fixed layer.

4. The magnetic random access memory according to claim 3, wherein a total number of fixed layers is less than that of storage layers with respect to the magneto resistive elements.

5. The magnetic random access memory according to claim 1, wherein a storage layer of each of the magneto resistive elements includes a layer structure in which a paramagnetic layer is held between two ferromagnetic layers and the two ferromagnetic layers have a synthetic anti-ferromagnetic coupling layer structure.

6. The magnetic random access memory according to claim 1, wherein a fixed layer of each of the magneto resistive elements includes a layer structure in which a paramagnetic layer is held between two ferromagnetic layers and the two ferromagnetic layers have a synthetic anti-ferromagnetic coupling layer structure.

7. The magnetic random access memory according to claim 1, wherein the easy axis direction of magnetization of a fixed layer is the same as that of the storage layer with respect to each of the magneto resistive elements.

8. The magnetic random access memory according to claim 1, wherein data is written into the magneto resistive elements using a first magnetic field turning to a first direction and a second magnetic field turning to a second direction between which the easy axis direction of magnetization of the magneto resistive element constituting a write object is held at an equal angle.

9. The magnetic random access memory according to claim 8, wherein the write is realized by a combination of a first period in which only the first magnetic field is produced, a second period in which the first and second magnetic fields are simultaneously produced, and a third period in which only the second magnetic field is produced.

10. The magnetic random access memory according to claim 1, wherein the first and second magnetic fields are produced by synthesis of a magnetic field produced by a first current passed through the first write line with a magnetic field produced by a second current passed through the second write line.

11. A magnetic random access memory comprising:
first and second write lines which intersect with each other; and
a plurality of magneto resistive elements stacked on an intersecting portion of the first and second write lines,
wherein easy axis directions of magnetizations of storage layers of the plurality of magneto resistive elements are different from each other, and resistance values of the magneto resistive elements in the same state are different from one another.

12. The magnetic random access memory according to claim 11, wherein the plurality of magneto resistive elements are disposed between the first and second write lines, and one end of the plurality of magneto resistive elements is connected to a read selection switch disposed right under the plurality of magneto resistive elements.

13. The magnetic random access memory according to claim 11, wherein at least two of the plurality of magneto resistive elements share the fixed layer.

14. The magnetic random access memory according to claim 11, wherein a total number of fixed layers is less than that of storage layers with respect to the plurality of magneto resistive elements.

15. The magnetic random access memory according to claim 11, wherein a storage layer of each of the plurality of magneto resistive elements includes a layer structure in which a paramagnetic layer is held between two ferromagnetic layers and the two ferromagnetic layers have a synthetic anti-ferromagnetic coupling layer structure.

16. The magnetic random access memory according to claim 11, wherein a fixed layer of each of the plurality of magneto resistive elements includes a layer structure in which a paramagnetic layer is held between two ferromagnetic layers and the two ferromagnetic layers have a synthetic anti-ferromagnetic coupling layer structure.

17. The magnetic random access memory according to claim 11, wherein the easy axis direction of magnetization of a fixed layer is the same as that of the storage layer with respect to each of the magneto resistive elements.

18. The magnetic random access memory according to claim 11, wherein data is written into the plurality of magneto resistive elements using a first magnetic field turning to a first direction and a second magnetic field turning to a second direction between which the easy axis direction of magnetization of the magneto resistive element constituting a write object is held at an equal angle.

19. The magnetic random access memory according to claim 18, wherein the write is realized by a combination of a first period in which only the first magnetic field is produced, a second period in which the first and second magnetic fields are simultaneously produced, and a third period in which only the second magnetic field is produced.

20. The magnetic random access memory according to claim 18, wherein the first magnetic field is produced by a first current passed through the first write line, and the second magnetic field is produced by a second current passed through the second write line.

21. The magnetic random access memory according to claim 11, wherein the first and second magnetic fields are produced by synthesis of a magnetic field produced by a first current passed through the first write line with a magnetic field produced by a second current passed through the second write line.

22. The magnetic random access memory according to claim 11, wherein resistance values of the plurality of magneto resistive elements in the same state are set to be different from one another, when the number of magnetic tunnel junctions is varied.

23. A magnetic random access memory comprising:
first and second write lines which intersect with each other; and
magneto resistive elements stacked on an intersecting portion of the first and second write lines, and each magneto resistive element having a fixed layer and a storage layer,
wherein an easy axis direction of a magnetization of the fixed layer is different from that of the storage layer with respect to each of the magneto resistive elements.

24. The magnetic random access memory according to claim 23, wherein data is written into the magneto resistive elements using a first magnetic field turning to a first direction and a second magnetic field turning to a second direction between which the easy axis direction of the magnetization of the magneto resistive element constituting a write object is held at an equal angle.

25. The magnetic random access memory according to claim 24, wherein the write is realized by a combination of a first period in which only the first magnetic field is produced, a second period in which the first and second magnetic fields are simultaneously produced, and a third period in which only the second magnetic field is produced.

* * * * *